United States Patent [19]

Jaeger et al.

[11] Patent Number: 5,805,146

[45] Date of Patent: *Sep. 8, 1998

[54] INTEGRATED DISPLAY SCREEN AND SLIDABLE CONTROL FOR ELECTRICAL CIRCUITS

[75] Inventors: Denny Jaeger; Kenneth M. Twain, both of Oakland, Calif.

[73] Assignee: Intertactile Technologies Corporation, Oakland, Calif.

[*] Notice: The term of this patent shall not extend beyond the expiration date of Pat. No. 5,572,239.

[21] Appl. No.: 763,132

[22] Filed: Dec. 10, 1996

Related U.S. Application Data

[63] Continuation-in-part of Ser. No. 644,888, May 10, 1996, which is a continuation-in-part of Ser. No. 420,438, Apr. 10, 1995, Pat. No. 5,572,239, which is a continuation of Ser. No. 225,782, Apr. 11, 1994, abandoned, which is a continuation-in-part of Ser. No. 147,545, Nov. 5, 1993, abandoned.

[51] Int. Cl.⁶ ................................................ G09G 5/00
[52] U.S. Cl. ................................... 345/172; 345/184
[58] Field of Search .......................... 345/168, 169, 345/170, 171, 172, 173, 184, 905; 341/22, 23, 28, 33, 34; 381/119, 104

[56] References Cited

U.S. PATENT DOCUMENTS

| | | | |
|---|---|---|---|
| 5,060,272 | 10/1991 | Suzuki | 381/119 |
| 5,191,320 | 3/1993 | Mackay | 345/184 |
| 5,572,239 | 11/1996 | Jaeger | 345/172 |

*Primary Examiner*—Regina Liang
*Attorney, Agent, or Firm*—Harris Zimmerman

[57] ABSTRACT

A circuit control device of the type having a knob which an operator travels along a track to vary a circuit condition is disposed on the face of an electronic display screen. This enables a display of calibration marks, symbols and/or other indicia pertaining to operation of the control including at; locations in immediate proximity to the slidable knob which display can change instantly when the function of the control changes or when other conditions call for different graphics. The track and sliding knob and electronic components of the control signal producing circuit are at the front of the display screen thereby enabling easy repair. Components of the control signal producing circuit are contained within the knob and/or track. Knob motion is detected by compact and durable sensors which may include radio frequency sensors, capacitive sensors, photoelectric sensors or Hall effect sensors among others.

50 Claims, 39 Drawing Sheets

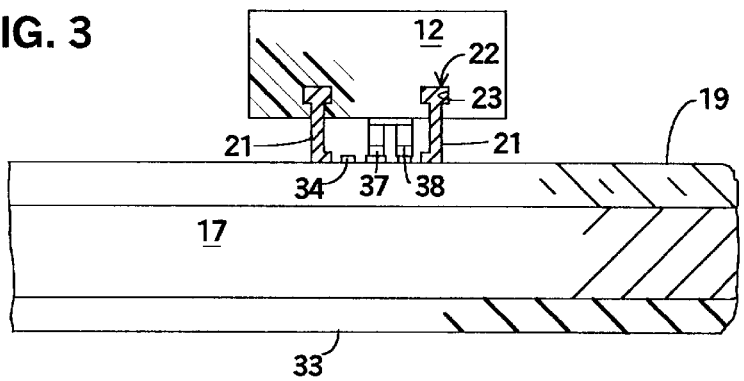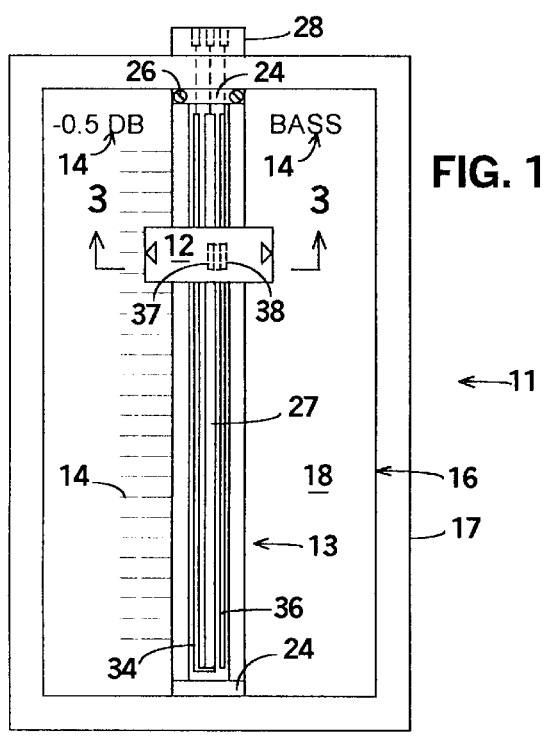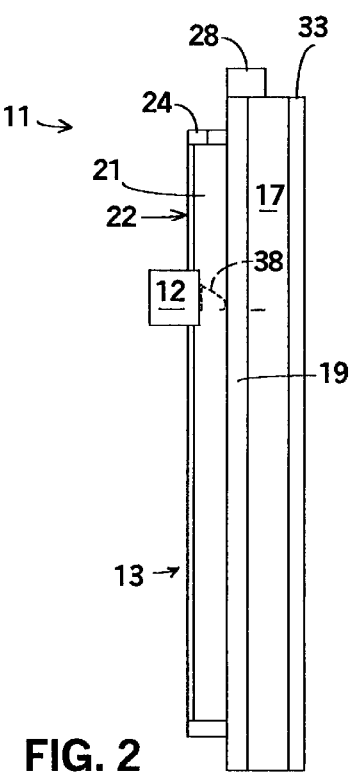

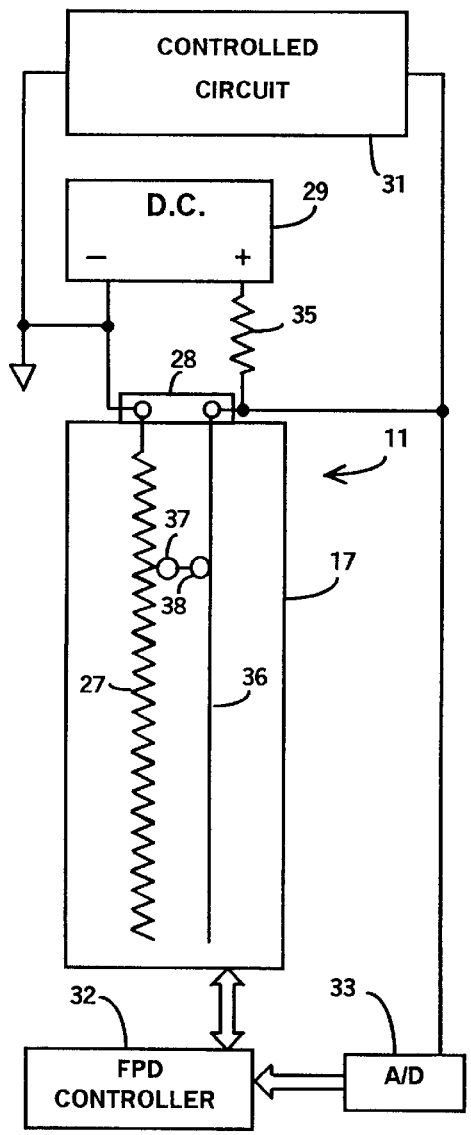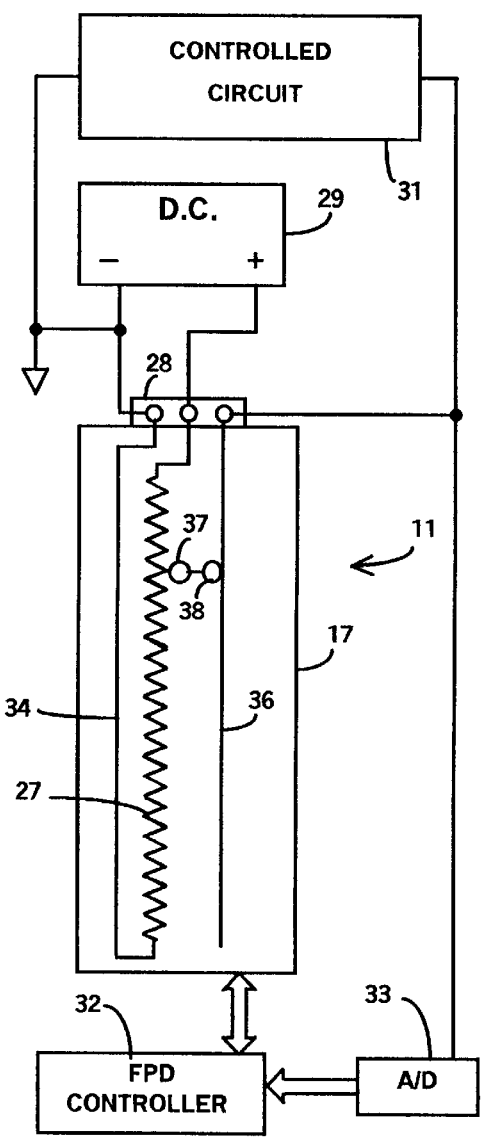

FIG. 20A
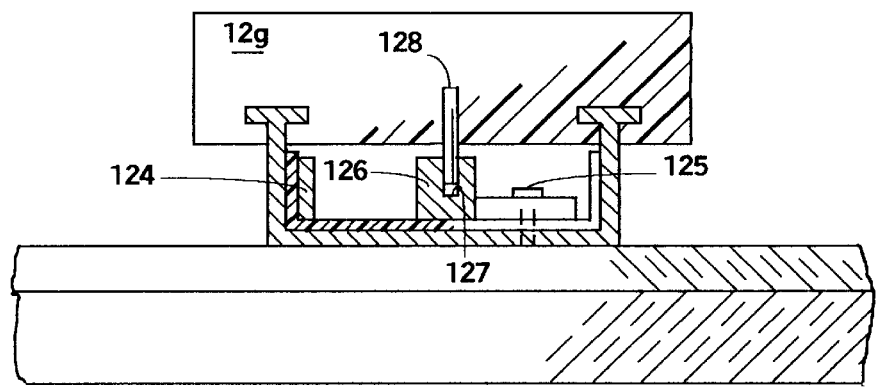
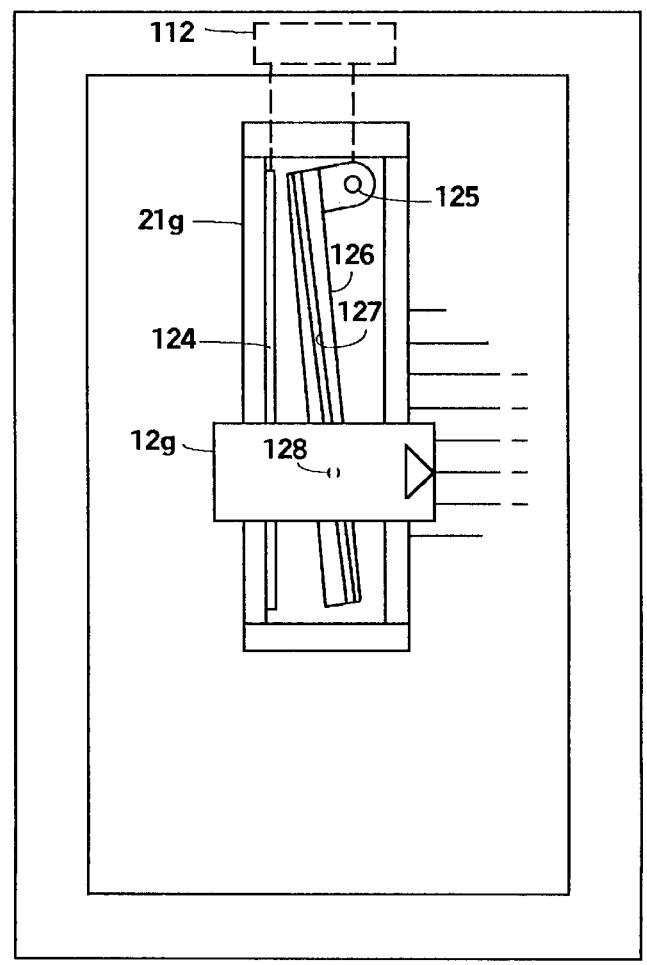
FIG. 20B

DEFINITIONS:

Let SIGA be defined as the signal to the microprocessor from the phototransistor over strip 131.

Let SIGB be defined as the signal to the microprocessor from the phototransistor over strip 129.

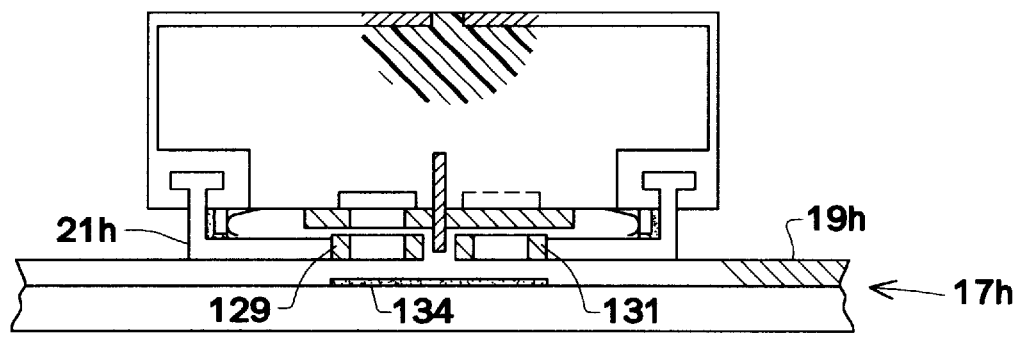
FIG. 25
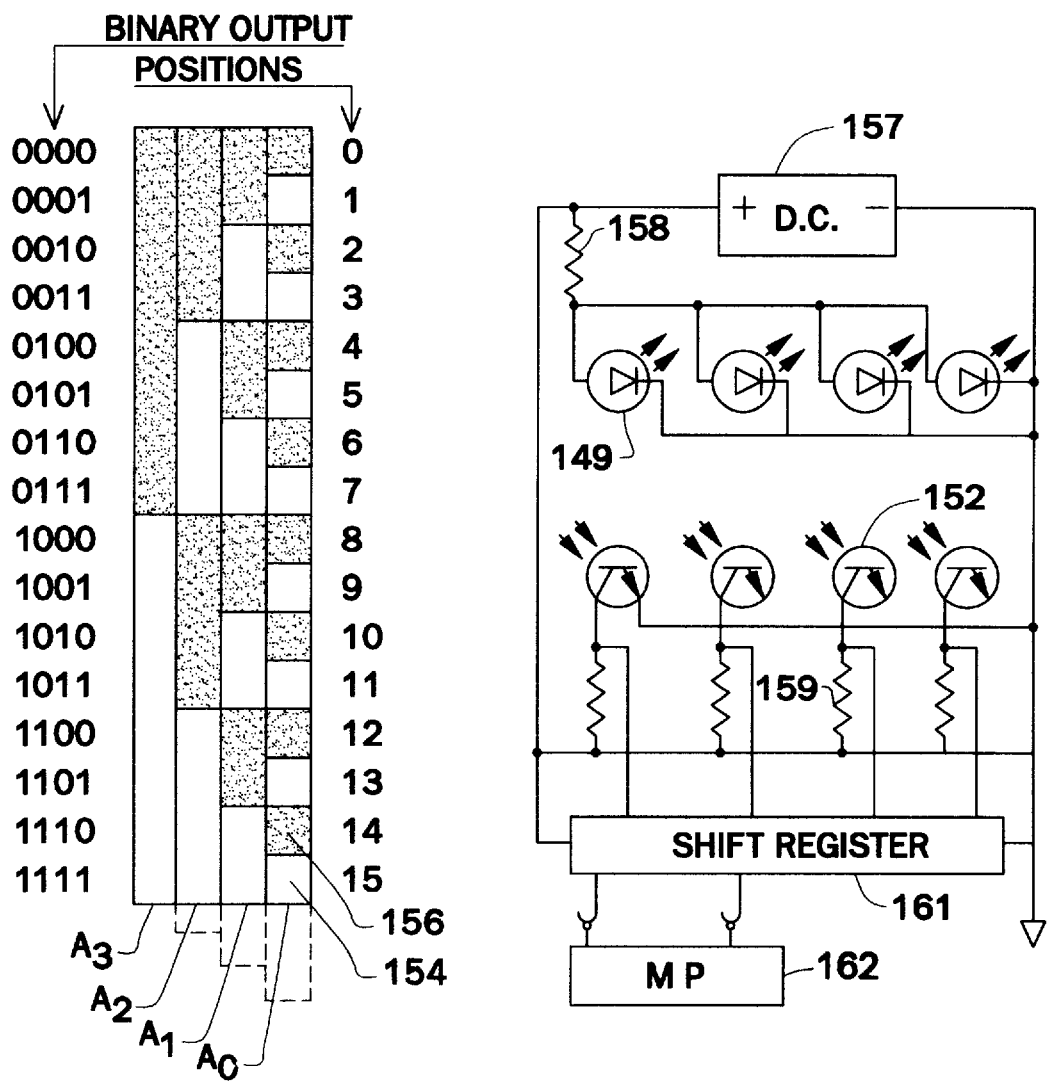
FIG. 28
FIG. 29

FIG. 31C
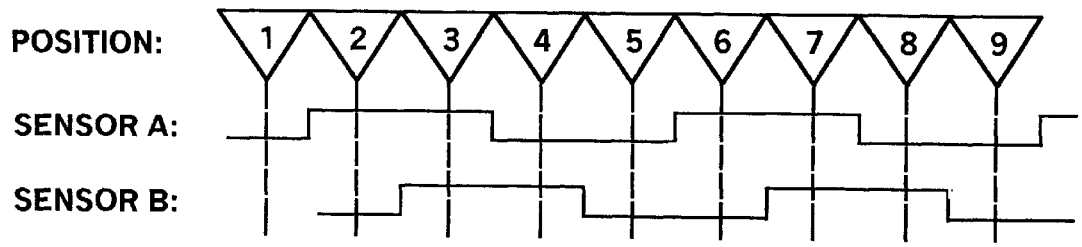
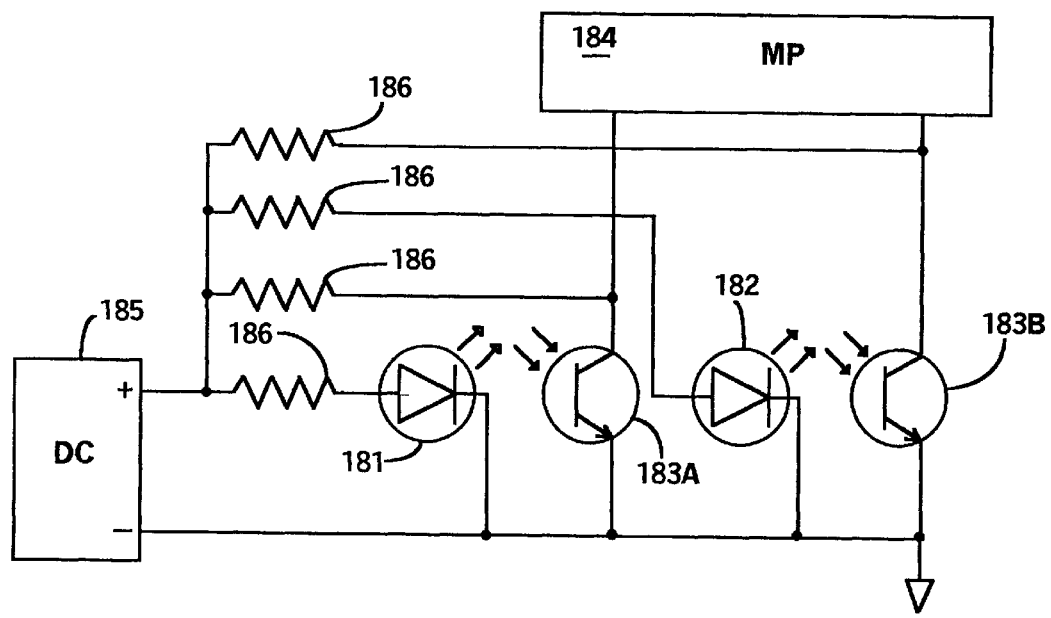
FIG. 31B

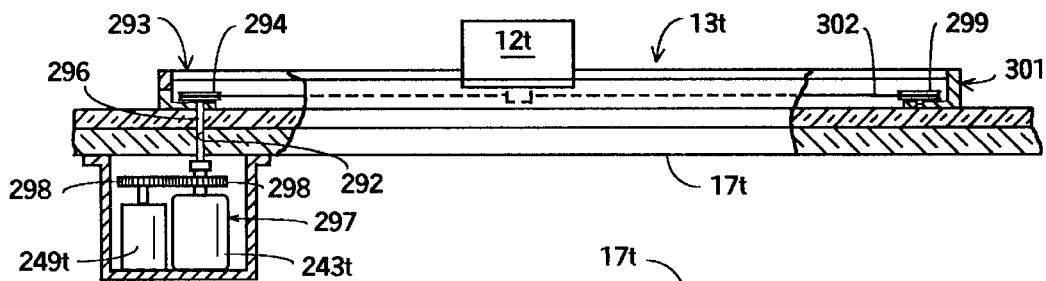
FIG. 49
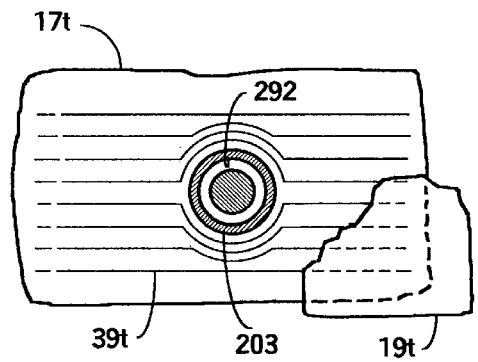
FIG. 50
FIG. 48
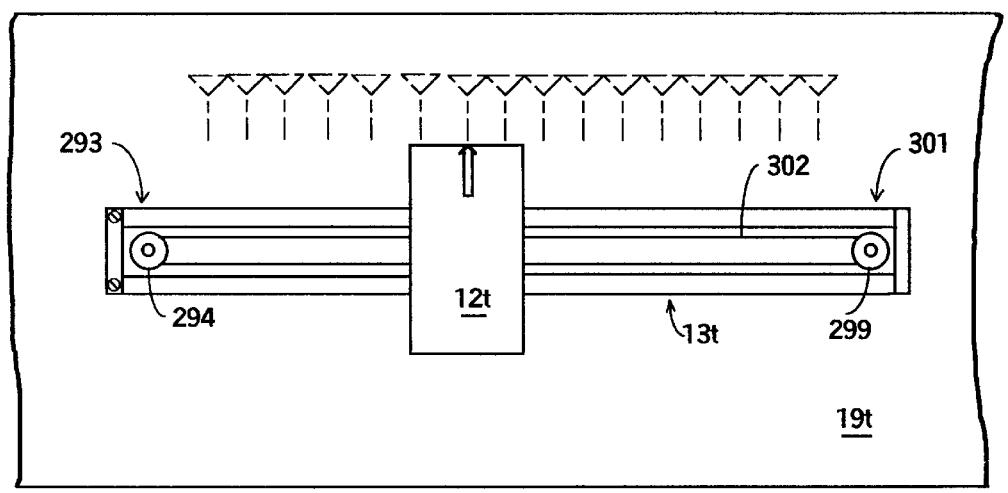

INTEGRATED DISPLAY SCREEN AND SLIDABLE CONTROL FOR ELECTRICAL CIRCUITS

CROSS REFERENCE TO RELATED APPLICATIONS

This application is a continuation-in-part of copending U.S. application Ser. No: 08/644,888 filed on May 10, 1996 and which is a continuation-in-part of application Ser. No. 08/420,438 filed on Apr. 10, 1995, now U.S. Pat. No. 5,572,239. Application Ser. No. 08/420,438 is a continuation of application Ser. No. 08/225,782 filed Apr. 11, 1994 and which is now abandoned. Application Ser. No. 08/225,782 was a continuation-in-part of application Ser. No: 08/147,545 filed Nov. 5, 1993 and which is now abandoned.

TECHNICAL FIELD

This invention relates to devices for enabling operator control of electrical circuits. More particularly the invention relates to electrical circuit controls of the kind having a slidable member which is traveled along a track in order to change an electrical condition in a controlled circuit.

BACKGROUND OF THE INVENTION

Many electrical circuit control devices have a slidable member which is situated at the face of a panel and which is movable along a linear or curvilinear path in order to vary a control signal for the circuit. Controls of this type are used with diverse different types of apparatus, one example being faders for adjusting the amplitude of audio signals in sound processing systems. In most control devices of this kind the slidable member protrudes from a slotted panel and components which produce the circuit control signal are situated behind the panel. Calibration marks and/or other are present on the panel along the path of the member to identify the different settings of the control or to provide other information pertaining to operation of the control. Traditionally such graphics have been permanently imprinted on the control panel.

Prior control devices of the above described kind are single function controls which serve a single purpose. It has been the conventional practice to provide additional control devices in instances where the controlled apparatus requires input of two or more control signals. This complicates control panels and increases the size and cost of such panels. It would be advantageous if a control device of this kind could be used to control more than one function of the controlled apparatus. Permanently imprinted calibration marks and other graphics are not conducive to use of a single control for multiple purposes. Often the graphics that are appropriate for one mode of operation of the control are not appropriate for another mode of operation.

Permanently imprinted graphics can also cause problems with single function control devices. For example, such graphics can only provide information in one or at best a very limited number of languages or unit systems at a location which is close to the slidable component of the control.

Flat panel displays have heretofore been used to present changeable information pertaining to operation of electrical control devices including control devices of the kind having a slidable component which is manipulated by the operator. In the prior constructions the slidable member and the flat panel display image are at different locations on the control panel and this can cause problems during operation. Heretofore, the display could not provide calibration marks or other graphics immediately adjacent to the slidable member as the image display area of the display screen is bounded by a marginal region which contains structural framing, seals and other components. Sizable spacing of the image display area from the slidable member can also cause operator confusion concerning which of several controls the imaged information relates to.

The conventional disposition of the control signal producing components behind the control panel complicates the task of repairing or replacing such components as that requires access to the back of the control panel. Typically one must open up the housing of electrical apparatus and perform operations in a constricted space.

The present invention is directed to overcoming one or more of the problems discussed above.

SUMMARY OF THE INVENTION

In one aspect the present invention provides a control device for an electrical circuit which control device has a slidable member that is traveled along a track to any of a plurality of different positions in order to change an electrical condition in the controlled circuit. The slidable member and track are disposed in front of an electronic display screen which has an image display area at which instantly changeable images are displayed. At least a portion of the slidable member is situated directly in front of the image display area of the display screen.

In another aspect of the invention, an image display controller is coupled to the electronic display screen and causes the screen to display indicia at locations along the path of travel of the slidable member.

In another aspect of the invention, a control signal producing circuit produces a circuit control signal that varies in response to movement of the slidable member. Electronic components of the control signal producing circuit are situated in front of the display screen and are situated within at least one of the slidable member and the track.

In still another aspect of the invention, a control device for an electrical circuit includes an electronic display screen having an image area at which instantly changeable images are displayable. A track extends along the face of the display screen within the image area. A slidable member engages the track and is slidable therealong to any of a plurality of successive positions. A position sensor produces a control signal for the electrical circuit which changes in response to movement of the slidable member between its positions. A display controller is electrically coupled to the position sensor and to the display screen and is conditioned to cause display of changeable images at the screen which convey information pertinent to operation of the control device.

Electric circuit control devices embodying the invention have a track and a slidable member which are situated at the face of an electronic image display screen with at least a portion of the slidable member being directly in front of the image display area of the screen. This enables display of instantly changeable calibration marks and/or other graphics at locations in close proximity to the slidable member including, where appropriate, at locations immediately adjacent to the path of travel of the member. The operator can associate such graphics with the particular control to which they relate in an easier and more reliable manner and precise setting of the control is facilitated. The graphics can change instantly when the function of a control device changes or if other conditions call for a change of calibration marks or other indicia. Motion of the slidable component of the control device is detected by electronic components which in some forms of the invention are contained within the track structure and/or within the slidable component at the front of the display screen where they are easily accessible for repair or replacement.

The invention, together with further aspects and advantages thereof, may be further understood by reference to the following description of the preferred embodiments and by reference to the accompanying drawings.

BRIEF DESCRIPTION OF THE DRAWINGS

FIG. 1 is a frontal view of an electrical circuit control device of the type having a slidable member which an operator travels along a track in order to change an electrical condition in a controlled circuit.

FIG. 2 is a side view of the circuit control device of FIG. 1.

FIG. 3 is a section view of a portion of the control device of FIG. 1 taken along line 3—3 thereof.

FIG. 4 is a schematic circuit diagram showing electronic components of the circuit control device of FIGS. 1 to 3.

FIG. 20A is a frontal view of another circuit control device which uses capacitive effects to sense the position of a slidable member of the device.

FIG. 20B is a cross section view taken along line 20B—20B of FIG. 20A.

FIG. 25 is a cross section view corresponding generally to FIG. 22 while depicting a modification of the control device of FIGS. 21 to 24.

FIG. 28 is a chart showing a binary code which is used to identify the position of the sliding member of the control device of FIGS. 26 and 27.

FIG. 29 is a schematic circuit diagram showing electronic components of the control device of FIGS. 26 to 28.

FIG. 31B is a schematic circuit diagram showing electrical components of the apparatus of FIG. 31A.

FIG. 31C is a diagram depicting output signal changes which occur at a pair of photoelectric detectors as a slidable member of the control device of FIGS. 30 to 31B is traveled through successive settings.

FIG. 48 is a frontal view of another motor driven electrical circuit control device embodying the invention.

FIG. 49 is a broken out side view of the control device of FIG. 48.

FIG. 50 is a diagrammatic depiction of the configuration of internal busbars in a flat panel display component of the control device of FIGS. 48 and 49.

DETAILED DESCRIPTION OF THE PREFERRED EMBODIMENTS

Figure 5:
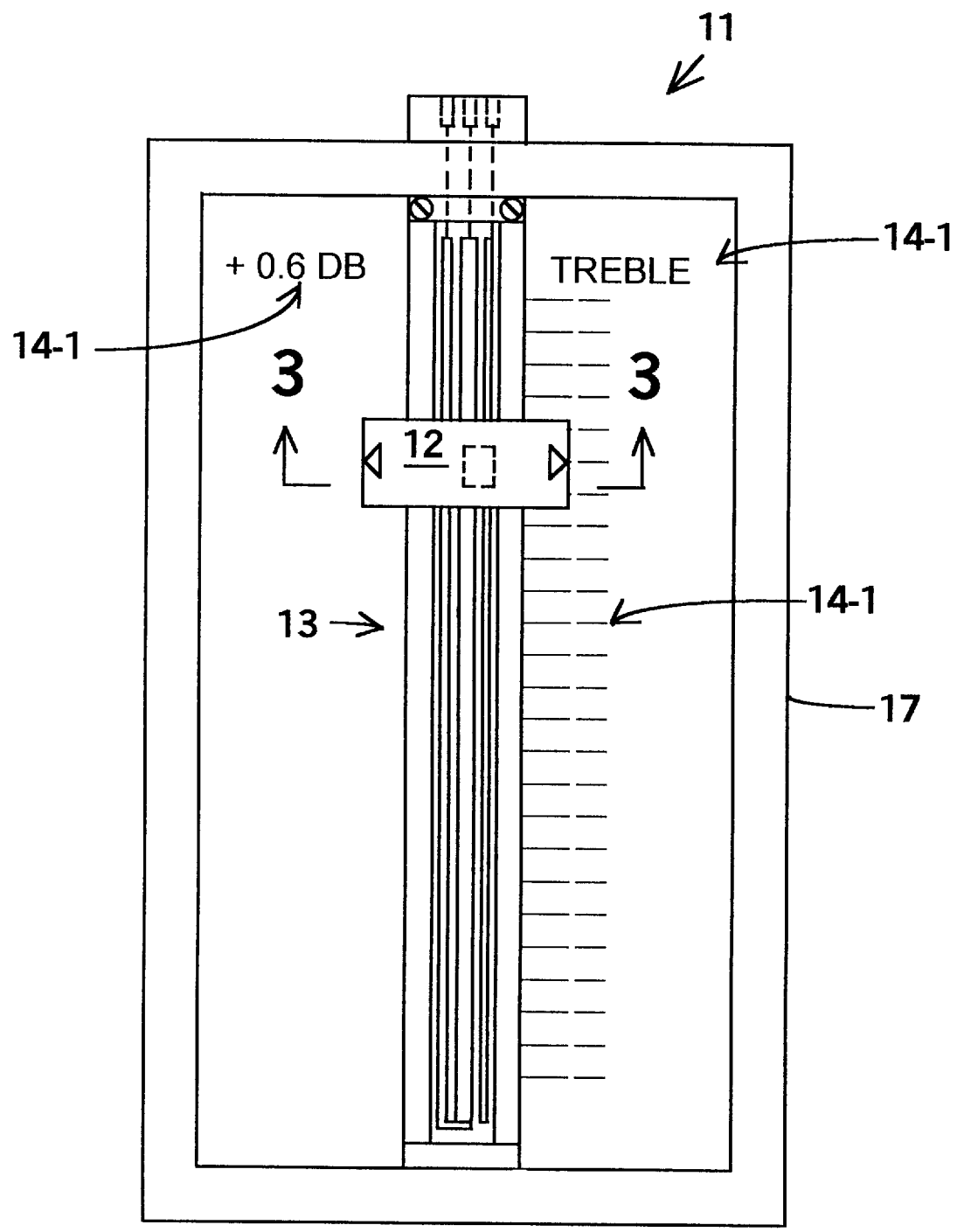
FIG. 5 is a frontal view of the circuit control device of FIG. 1 showing an example of changed graphics which are display by the device during a mode of operation that differs from the mode of operation depicted in FIG. 1.

Referring initially to FIGS. 1, 2 and 3 in conjunction, electrical circuit control devices 11 embodying the invention have a slidable component such as member 12 which an operator travels along a track 13 in order to vary a control signal that is delivered to electrical apparatus of any of the known types that respond to such signals. In most uses of control devices 11 of this kind it is advantageous to provide graphics 14 that convey information pertaining to the operation of the control. The graphics 14 may variously be calibration marks along the path of travel of the member 12, symbols or alphanumeric data identifying successive settings of the member, an indication of the current value of the control signal or may present any of a variety of other kinds of information. The graphics 14 in embodiments of the present invention are, at least in part, images generated at the screen 16 of an electronic image display 17. The graphics 14 may be turned on and off and may change instantly and automatically if desired if the control device 11 is a multi-function control or if other conditions call for a change of graphics during in operation.

The path of travel of at least a portion of the member 12 is situated directly in front of the image display area 18 of the screen 16 to enable display of graphics in close proximity to the member 12 including, if appropriate, at locations immediately adjacent to the member. This avoids operator error in associating graphics with the particular control device 11 to which they relate and enables precision setting of the control in instances where calibration marks or the like are displayed. In the present example of the invention the track 13 extends along the central region of the image display area 18 and all portions of the member 12 are directly in front of the image display area in order to present graphics at both sides of the path of travel of the member.

In this example of the invention, the electronic image display 17 is a flat panel display of the kind which has a transparent cover plate 19 at its face. Track 13 is formed by a pair of linear rails 21 which extend along the cover plate 19 and which are affixed to the cover plate by adhesive or be other means. In an alternate construction the rails may be affixed to a second transparent cover plate which overlays the original cover plate of the flat panel display. The edge 22 of each rail 21 that is spaced outward from cover plate 19 is enlarged relative to the adjacent portion of the rail. The slidable member 12 spans the rails 21 and has grooves 23 through which the enlarged edges 22 of the rails 21 extend, the bases of the grooves being narrower than the enlarged edges of the rails in order to hold the member 12 on the rails. Travel of the member 12 is limited by cross members 24 at each end of the rails 21 which span the rails and which are secured thereto. At least one of the cross members 24 is secured to the rails 21 by disengageable means, such as by screws 26, to enable entry of the member onto the rails and to enable removal and replacement of the member 12 if necessary.

The control device 11 of this particular example is a linear potentiometer which transmits a control signal to a controlled circuit which signal is a variable voltage having a magnitude that is selected by operator movement of the member 12 along track 13. A linear strip or trace 27 of electrically resistive material is bonded to the front surface of cover plate 19 between rails 21 and extends along the track 13 in parallel relationship with the rails. Referring jointly to FIGS. 1, 2, 3 and 4, a multi-line connector 28 at an edge of the flat panel display 17 enables connection of the control device 11 to an external DC voltage supply 29 and to the controlled circuit 31. The flat panel display controller 32 of this example of the invention, which may be of the known circuit configuration, is contained in a circuit board 33 which is affixed to the back of the flat panel display 17.

A first linear trace 34 of electrical conductor extends along the front surface of cover plate 19, between rails 21, to connect one pin socket of connector 28 with the remote end of the resistive strip 27. The other end of the resistive strip 27 is connected to a second pin socket of connector 28. This enables coupling of the DC voltage supply 29 to the resistive strip 27. A second linear trace 36 of electrically conductive material extends along the front surface of cover plate 19 in parallel relationship with the resistive strip 27 and is electrically connected to an output signal pin socket of connector 28. Output voltage, selected by sliding member 12 along the track 13, is transferred to the second trace 36 by first and second wiper contacts 37 and 38. The wiper contacts 37 and 38 are secured to the underside of member 12 in position to contact and travel along the resistive strip 27 and the second trace 36 and are in electrical connection with each other.

The operator selected output signal which is transmitted to the controlled circuit 31 is also transmitted to the flat panel display controller 32 after being digitized in an analog to digital converter 33. Referring to FIG. 1 in particular, this enables an alphanumeric display of the current output voltage of the control device 11 at screen 16 as well as a display of calibration marks along the path of travel of member 12 that identify a series of successive settings of the control device 11. Using techniques known to the art, the flat panel display controller 32 can be conditioned to display any other desired images that may be appropriate to operation of different types of controlled circuit 31. Such images may be caused to flash on and off to attract operator attention, to convey information by changing color or to move across the screen 16. Purely decorative images can be presented along with information that is pertinent to operation of the control device 11.

Referring to FIG. 5, the displayed graphics 14-1 may change instantly if the controlled circuit 31 has different modes of operation or if it is used to control more than one external circuit. The change of graphics may be initiated by operator actuation of a mode selector switch 34 or the display controller 32 may be conditioned to change the graphics automatically in response to a control signal of a particular magnitude such as a control signal having the maximum magnitude.

Referring to FIG. 4A, in a modified form of the control device 11-1 one terminal of the DC voltage supply 29 is connected to one end of the resistive strip 27, the other terminal being connected to the second trace 36 of conductive material through a resistor 36. Connector 28 may have only two pin sockets. A circuit junction 37 between the other terminal of the voltage supply 29 and the second trace 36 is connected to the controlled circuit 31 and to analog to digital converter 33 to provide the operator selected control signal voltage to those components. The embodiment of FIG. 4A may otherwise be similar to the embodiment of FIGS. 1 to 4.

Figure 6:
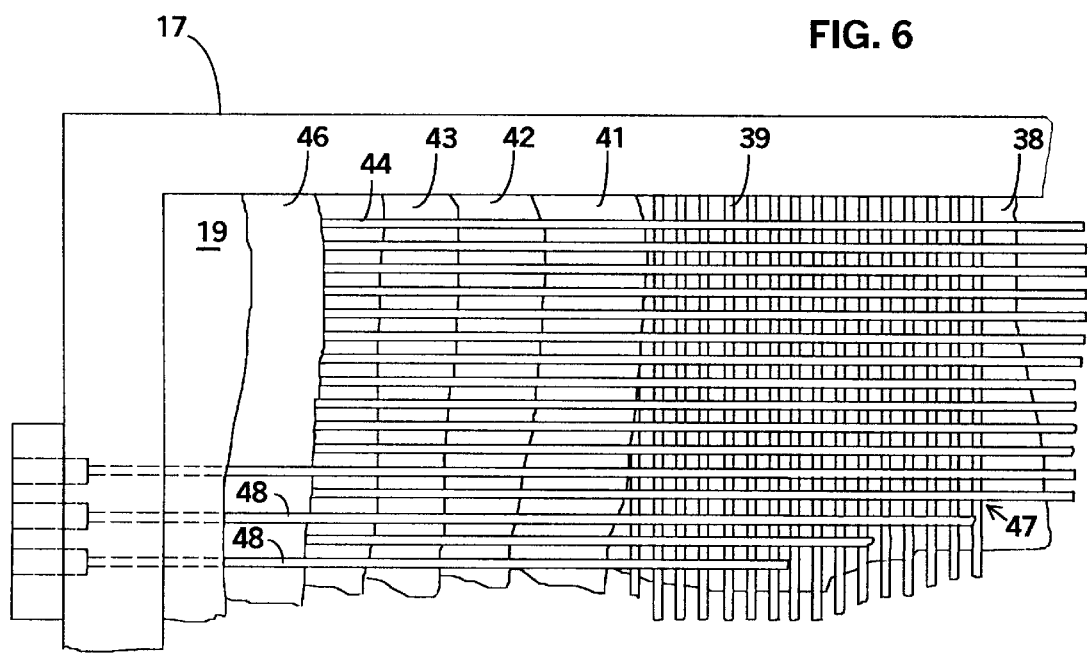
FIG. 6 is a broken out frontal view of a portion of the circuit control device of FIGS. 1 to 5 showing the multi-layered construction of a flat panel display which is a component of the control device.

Referring jointly to FIGS. 3 and 6, the flat panel display 17 may be of any of the known types and may be of known design except as herein described. For purposes of example FIGS. 3 and 6 depict a flat panel display 17 of the TFEL (thin film electro-luminescent) type. Displays of this kind are multi-layered and have a substrate layer 38 which may variously be formed of glass ceramic or plastic. The substrate 38 is overlaid, in sequence, by a layer of row busbars 39, a first layer of insulation 41, a phosphor layer 42, a second layer of insulation 43, a layer of column busbars 44, a sealing and passivation layer 46 and the transparent cover plate 19. Row busbars 39 are parallel conductive traces bonded to substrate 38 and extend in an x-coordinate direction. Column busbars 44 are parallel conductive traces deposited on the second layer of insulation 43 and extend in a y-coordinate direction. The points at which the orthogonal row and column busbars 39 and 44 cross each other define an array of image pixels 47 at which the phosphor layer 42 emits light when a voltage difference is applied across the row busbar 39 and column busbar 44 that cross each other at a particular pixel location. Thus any desired image can be produced by applying a voltage difference across the particular row busbars 39 and column busbars 44 that define image pixels 47 at which light needs to be emitted to form the image.

In some embodiments the track 13 structure may not extend to an edge of the display screen 16 and it may be necessary to provide electrical conductors 48, as shown in FIG. 6, that extend within the image area 18 is order to make the previously described electrical connections between components of the control device. Adverse effects on the quality of displayed images by the overlaying conductors 48 can be avoided by forming the conductors of transparent conductive material, such as indium tin oxide for example, which is bonded to a surface of the cover plate 19. Non-transparent conductors 48 can be used without significant adverse effects if, as shown in FIG. 6, the conductors are thin in relation to the spacing of the centers of the image pixels 47 from each other, the conductors extend in parallel relationship with either the row busbars 39 or the column busbars 44 and the conductors are situated between two adjacent rows of pixels and/or between two adjacent columns of pixels. The conductors 48 may extend along the back surface of the cover plate 19 to avoid parallax effects during viewing of images and to protect the conductors from abrasion.

Figure 7:
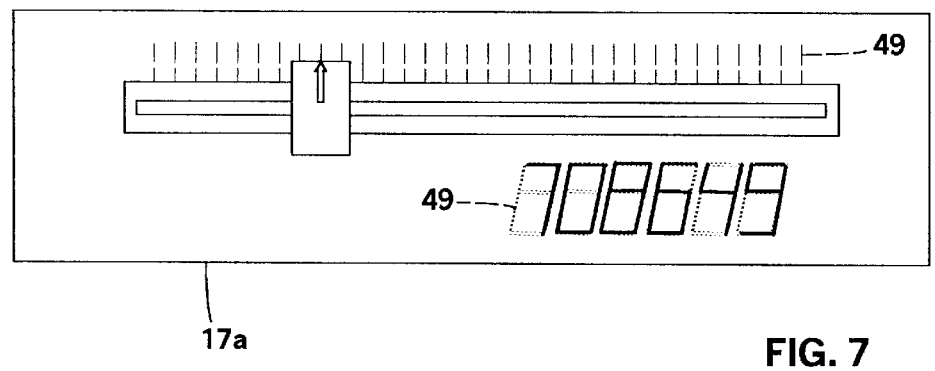
FIG. 7 is a frontal view of a modification of the control device which includes a different type of electronic image display.

FIG. 7 depicts use of a flat panel display 17a of the known segmented electrode type in an electrical circuit control device 11a that may otherwise be similar to the device previously described with reference to FIGS. 1 to 4. Referring to FIG. 7, displays 17a of this kind produce images in response to electrical energization of electrodes 49 within the display which images correspond to the configurations of the electrodes. The electrodes 49 can be configured and positioned to provide calibration marks along the path of travel of the control device member 12a that are changeable by energizing different ones of the electrodes at different times. As understood within the art such a display can be used to image any numeral from 0 to 9 at a given location by selective energizing of electrodes 49 which are electrically isolated from each other and which are arranged in the form of a slanting squared numeral 8.

Some newly developed electronic image displays of the panel type are formed of flexible materials and can have a curved viewing surface. Such displays can be used in embodiments of the present invention by forming the previously described track component to have a conforming curvature.

Figure 8:
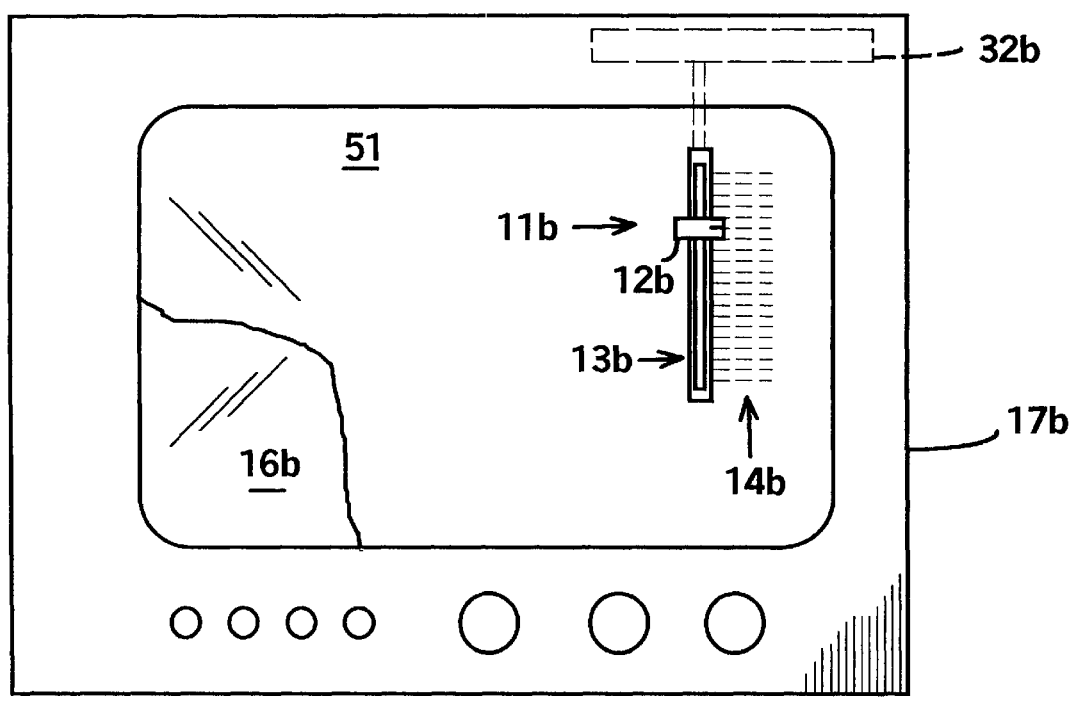
FIG. 8 is a frontal view of another modification of the control device which includes still another different type of electronic image display.

Referring to FIG. 8, the electronic image display 17b of embodiments of the present invention can also be of the cathode ray tube type that is commonly used as computer monitors, in television receivers and for other purposes. The track structure 13b of one or more control devices 11b embodying the present invention is affixed to the face of the screen 16b of the cathode ray tube 17b or to a transparent overlay cover plate 51 which is superimposed on the screen. The display controller 32b which causes changeable graphics 14b to be displayed at the screen 16b in proximity to the member 12b may be of the known form used to change the images at computer monitor screens in response to control signals.

Figure 10:
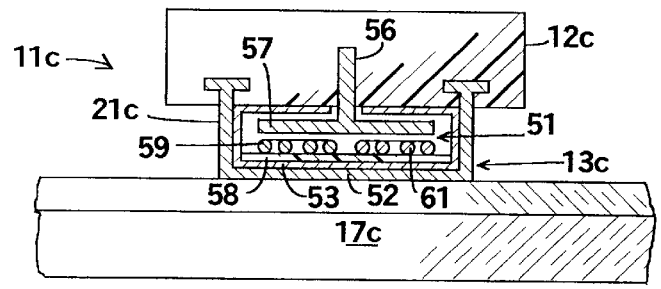
FIG. 10 is a cross section view taken along line 10—10 of FIG. 9.
Figure 9:
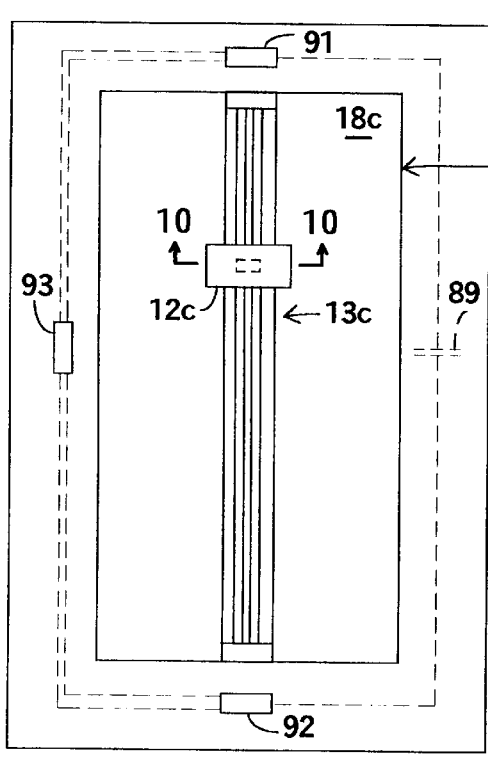
FIG. 9 is a frontal view of another electrical circuit control device which uses radio frequency energy to sense and track movement of a sliding member.
Figure 11:
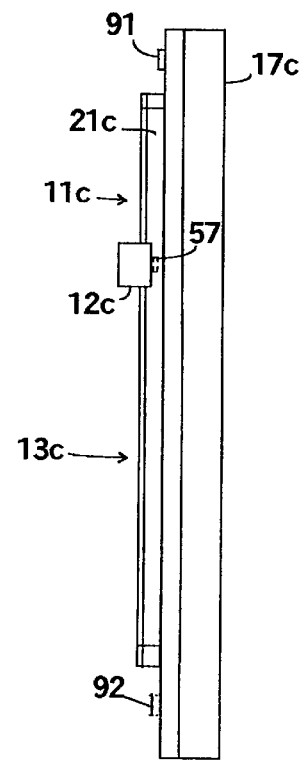
FIG. 11 is a side view of the circuit control device of FIGS. 9 and 10.

Circuit control devices in which a wiper contact slides along an elongated resistor may require repair or replacement after extensive use as abrasion may adversely affect the precision of the device with respect to identifying the precise position of the member along its path of travel. FIGS. 9, 10 and 11 depict a highly durable circuit control device 11c that is not subject to this limitation as the resistive trace and wiper contact of the previously described embodiments are replaced with sensing means 51 that uses radio frequency electronics to sense the position of a slidable member 12c along a track 13c.

The track 13c and slidable member 12c of the control device 11c may be similar to the corresponding components of the embodiment of FIGS. 1 to 3 except as may be herein described. The track 13c is again adhered to or otherwise affixed to the face of a flat panel display screen 18c within the image display area 18c. The track 13c of this example of the invention has a floor portion 52 that extends between the bases of the two parallel rails 21c. The region between the rails 21 is largely enclosed by an elongated hollow metal shield 53 which is disposed against the floor portion 52 and which extends between the rails. The hollow shield 53 has a longitudinal slot 54 in the surface of the shield that is closest to member 12c to enable a thin member 56 which protrudes from the base of the member to extend into the interior of the shield. Member 56 has a plate portion 57 which extends transversely within the shield 53 in parallel relationship with the floor portion 52 of the track 13c and which is formed of electrical conductor.

An elongated thin strip 58 of electrical insulation extends along the base of the shield 53 within the interior of the shield and a pair of elongated electrical coils 59 and 61 are bonded to the insulation strip 58 and extend along the track 13c within the shield. The coils 59 and 61 are preferably flat and have a configuration which can best be seen in FIG. 12. In particular, coil 59 is an elongated multi-turn spiral of electrical conductor which is broadest at one end 62 and which becomes progressively narrower in the direction of the other end 63. Coil 61 is of the same configuration with the narrow end 64 of the coil being adjacent to the broad end 62 of coil 59 and the broad end 66 of coil 61 being adjacent to the narrow end 63 of coil 59. Portions of the coils 59 and 61 which appear to intersect in FIG. 12 are insulated from each other.

Coil 59 is the inductive component of the resonant circuit of a first electrical oscillator 67 and coil 61 is the inductive component of the resonant circuit of a second electrical oscillator 68, each of the oscillators having a capacitive component 65 coupled to the inductive component 59 or 61. Oscillators 67 and 68 may be of any of the known types, such as Colpitts oscillators for example, wherein the resonant frequency is dependent on the ratio of the inductance and capacitance in the resonant circuit.

Figure 12:
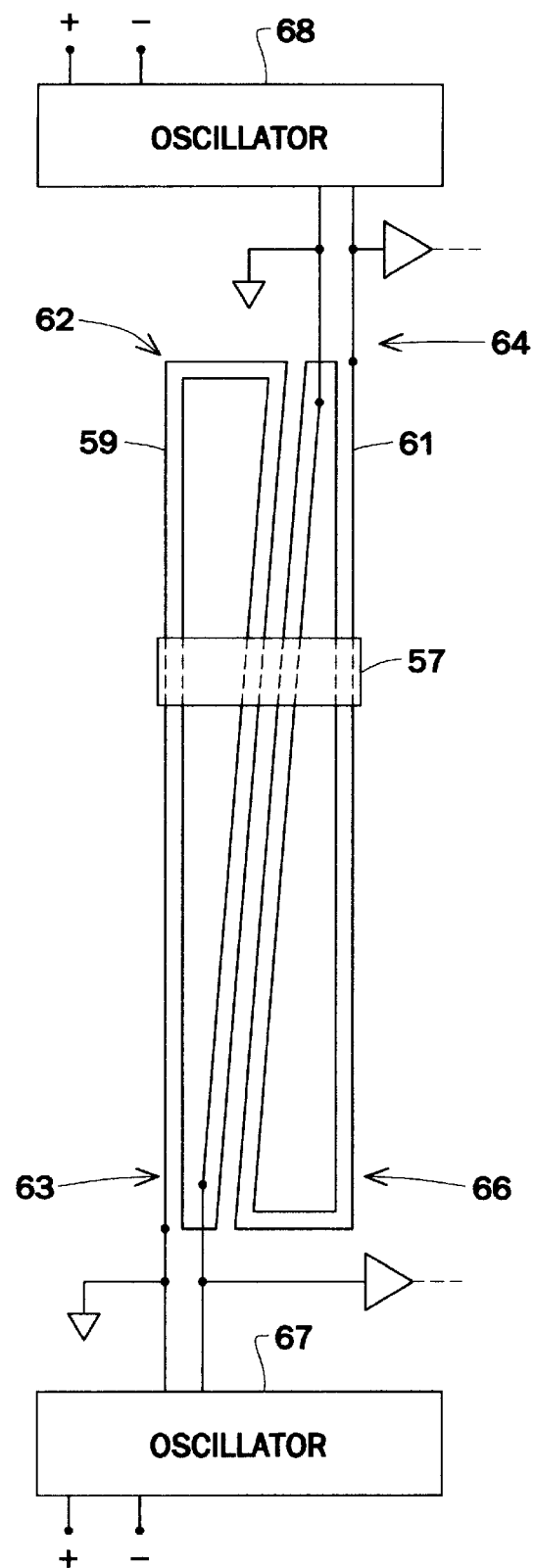
FIG. 12 is a schematic circuit diagram showing electronic components of the circuit control device of FIGS. 9 to 11.

Referring jointly to FIGS. 10 and 12, the previously described conductive plate 57 that is carried by the slidable member 12c spans the two coils 59 and 61 in spaced apart relationship therewith. The conductive plate 57 alters the resonant frequencies of the two oscillators 67 and 68 as it is in close proximity to the inductive coils 59 and 61 of the oscillators. This effect of the plate 57 is strongest when the plate is at the broad end of a coil 59 or 61 and weakest when the plate is at the narrow end of the coil and progressively changes as the plate is traveled along the coil. The effect of the plate 57 on each oscillator 67 and 68 is different at all points along the path of travel of the plate except at the midpoint of the path as the essentially triangular coils are inverted relative to each other. Thus the ratio of the frequency of oscillator 67 to the frequency of oscillator 68 is different at each successive point along the path of travel of the plate 57.

Figure 12A:
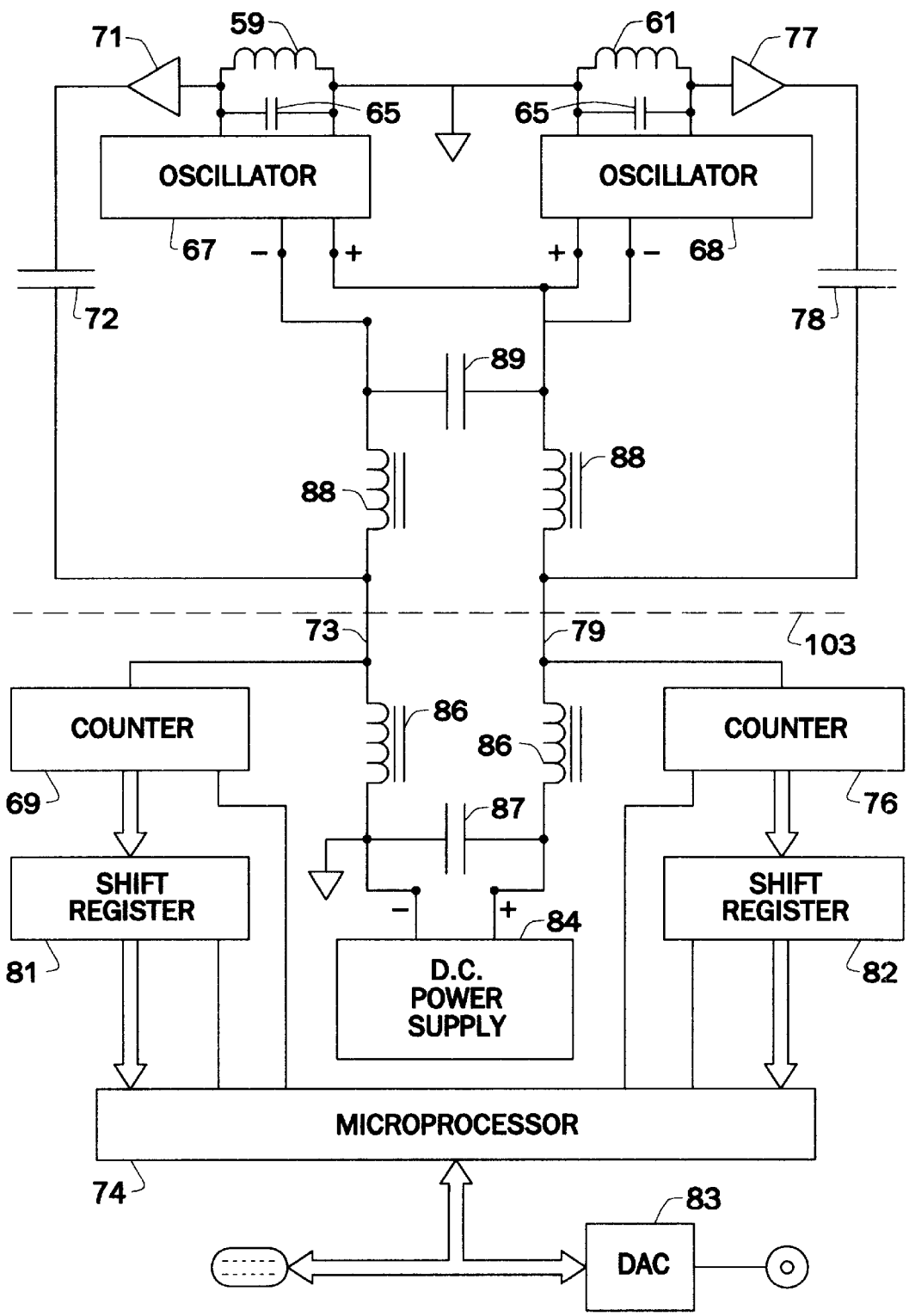
FIG. 12A is a schematic circuit diagram showing further electronic components of the circuit control device of FIGS. 9 to 11.

This enables tracking of the movement of the member 12c and synthesizing of a control signal that varies in a desired manner in response to movement of the member. Referring to FIG. 12a, the resonant circuit of the first oscillator 67 is coupled to the input of a counter 69 through a buffer amplifier 71, a capacitor 72 and a first conductor 73 which extends between the location of the oscillator and the location of a microprocessor 74 or other digital data processor. The resonant circuit of the second oscillator 68 is coupled to another counter 76 through another buffer amplifier 77, another capacitor 78 and a second conductor 79 that extends to the location of the microprocessor 74.

Figure 12B:
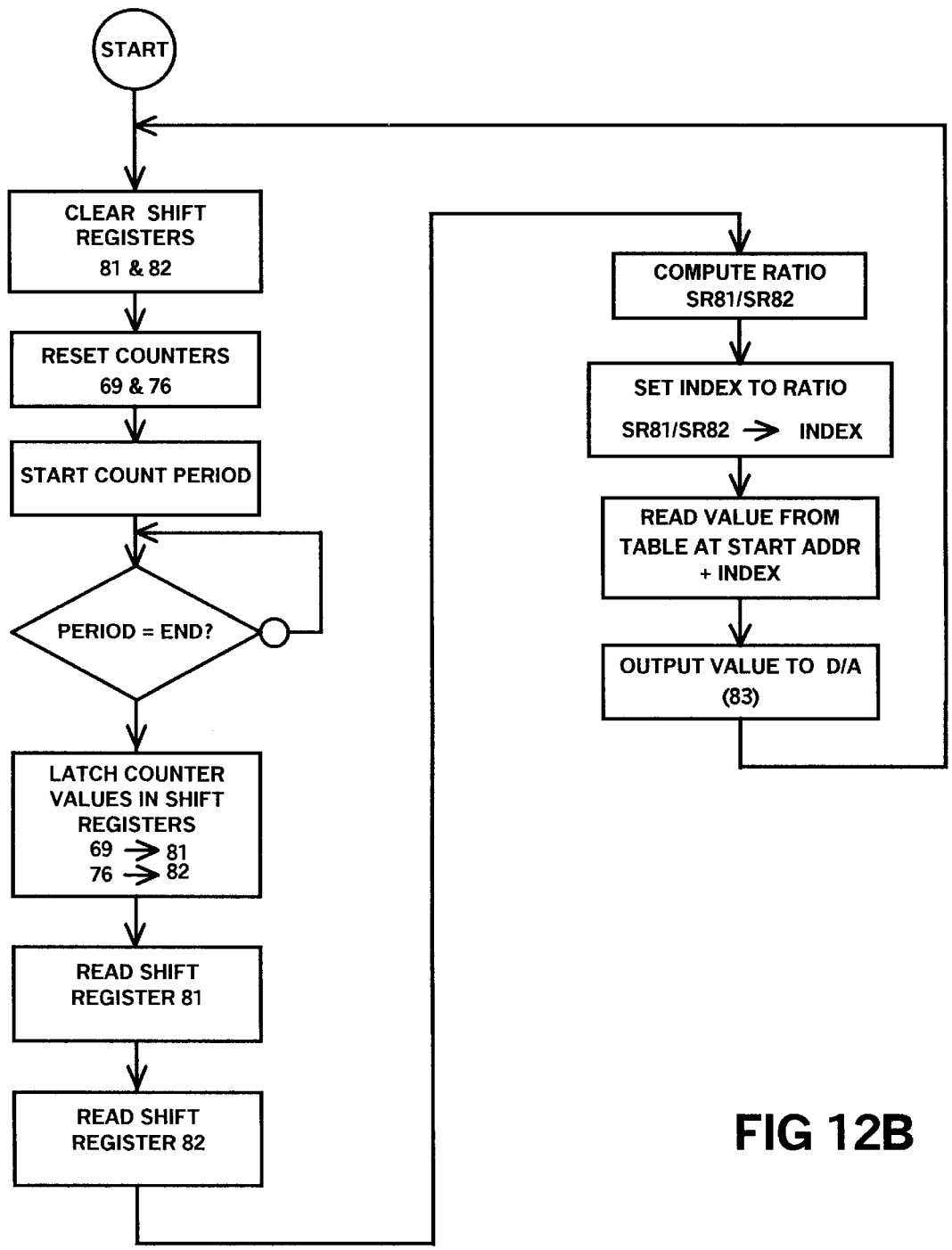
FIG. 12B is a flowchart depicting the programming of a digital data processor component of the circuit of FIG. 12A.

Each counter 69 and 76 counts the number of radio frequency cycles that are generated by the associated oscillator 67 or 68 during successive time periods of fixed duration. The accumulated counts are transferred to shift registers 81 and 82 at the end of each such time period and the counters are reset to a count of zero by the microprocessor 74. Referring jointly to FIGS. 12A and 12B, microprocessor 74 repeatedly reads the shift registers 81 and 82, computes the current ratio of the frequencies of the two oscillators 67 and 68 and consults a look-up table which is configured within the microprocessor to determine the control signal magnitude which should be outputted at the current setting of the slidable member of the control device. The current control signal value is outputted in digital form if the controlled electrical circuit responds to digital control signals or is delivered through a digital to analog converter 83 if the controlled circuit responds to a variable voltage type of control signal.

Capacitors 72 and 78 are present in the above described circuit to enable transmission of the high frequency oscillator output signals and also DC operating current for the oscillators 67 and 68 on the single pair of conductors 73 and 79 that extend between the location of the oscillators and the location of the microprocessor 74. The conductors 73 and 79 each connect with a separate one of the terminals of a DC power supply 84 through a separate one of a pair of inductance coils 86. A capacitor 87 is connected across the terminals of the DC power supply 84. This forms a filter which allows DC current to be transmitted to conductors 73 and 79 and which isolates the power supply from the high frequency signals. The other ends of conductors 73 and 79 connect with the DC power inputs of both oscillators 67 and 68 through separate ones of another pair of inductance coils 88 and another capacitor 89 is connected between the positive and negative terminals of the oscillators. This keeps the high frequency signals out of the oscillator power terminals. Capacitors 72 and 78 isolate the high frequency circuitry of the buffer amplifiers 71 and 77 from the DC current.

Referring jointly to FIGS. 9 and 12A, oscillator 67, buffer amplifier 71, capacitor 72 and a first of the inductance coils 76 may be embodied in a small integrated circuit board 91 situated at the marginal region of the flat panel display 17c adjacent to one end of the track 13c. The other oscillator 68, and buffer amplifier 77, capacitor 78 and the other inductance coil 76 are embodied in another similar circuit board 92 situated at the opposite end of track 13c. Capacitor 89 may be within the marginal region of the flat panel display 17c at a location between the two circuit boards 91 and 92. Other components of the circuit of FIG. 12A are embodied in a signal processing circuit board 93 which is also at the marginal region of the flat panel display 17c in this example of the invention. Alternately the signal processing circuit board 93 can be at the back of the flat panel display 17c or be situated at a remote location.

Figure 13:
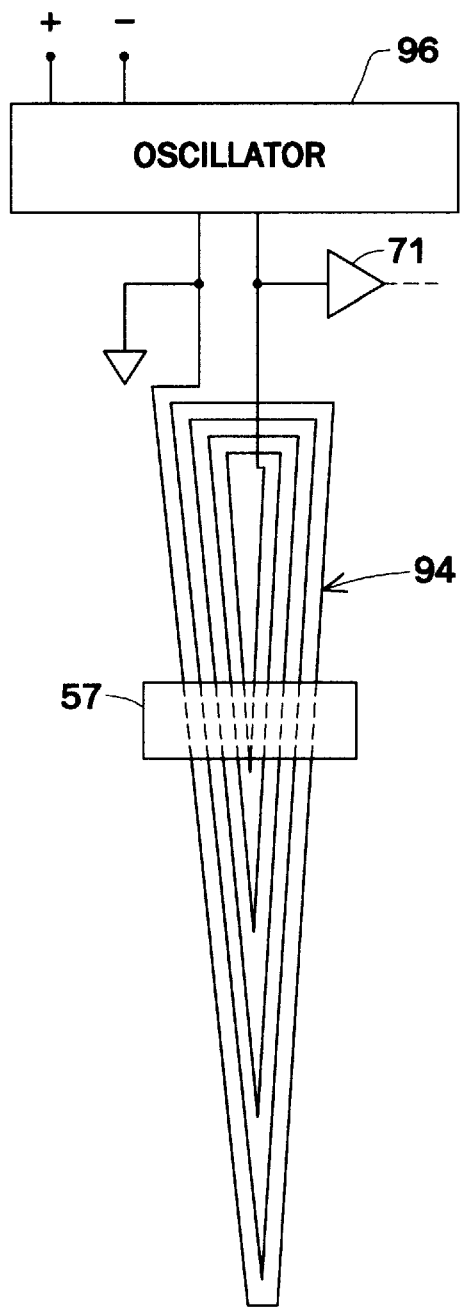
FIG. 13 is a schematic circuit diagram showing an alternate arrangement of electronic components which may be used in an electrical circuit control device that is otherwise similar to the control device of FIGS. 9 to 11.

In a modification of the last described example of the invention the two elongated coils 59 and 61 are replaced with a single elongated triangular coil 94 which is the inductive component of the resonant circuit of a single oscillator 96 as shown in FIG. 13. Other components of the control device can be similar to those described above with reference to FIGS. 9 to 12A except that only a portion of the electrical circuit of FIG. 12A need be present. In particular, the second oscillator 68, second buffer amplifier 77, coil 61, second counter 66, shift register 82, and capacitor 78 are eliminated from the circuit. Referring jointly to FIGS. 12A and 13, the resonant frequency of the single oscillator 96 progressively changes as the conductive plate 57 is slid along the elongated triangular coil 94 and has a different value at each successive position of the plate. Microprocessor 74 repetitively reads the current frequency value from shift register 81 and outputs a predetermined different control signal value in response to each different frequency value.

Figure 14:
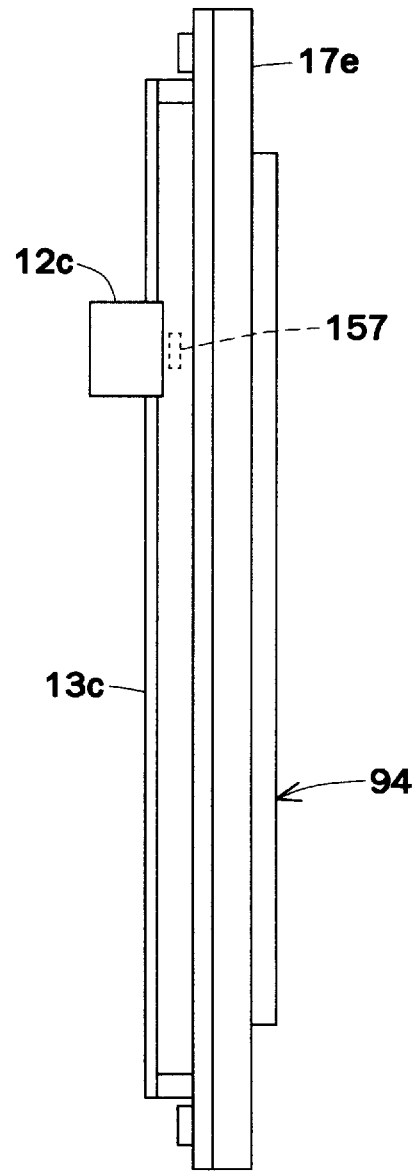
FIG. 14 is a side view of a circuit control device which uses the arrangement of electronic components that is depicted in FIG. 13.

In another modification of the control device the elongated coils 59 and 61 of the control device of FIGS. 9 to 12A or the single elongated coil 94 of the control device of FIG. 13 can extend along the back of the flat panel display 17e as shown in FIG. 14 (which depicts coil 94 for purposes of example) if the display is sufficiently thin to enable electrical interaction between the coils and the plate 57 which travels with the sliding member.

In still another modification of the control device of FIGS. 9 to 12A certain components of the electrical circuit are embedded within the sliding member itself and the rails along which the member travels serve both as DC power conductors and high frequency signal conductors which electrically connect components in the member with the signal processing means. Repair of this embodiment in the event of failure of any of the embedded electronic components is an extremely simple matter as it may be accomplished by simply removing the sliding member and replacing it with a new one. This does not require any opening of a housing or any manipulations at the back of a control panel.

Figure 15:
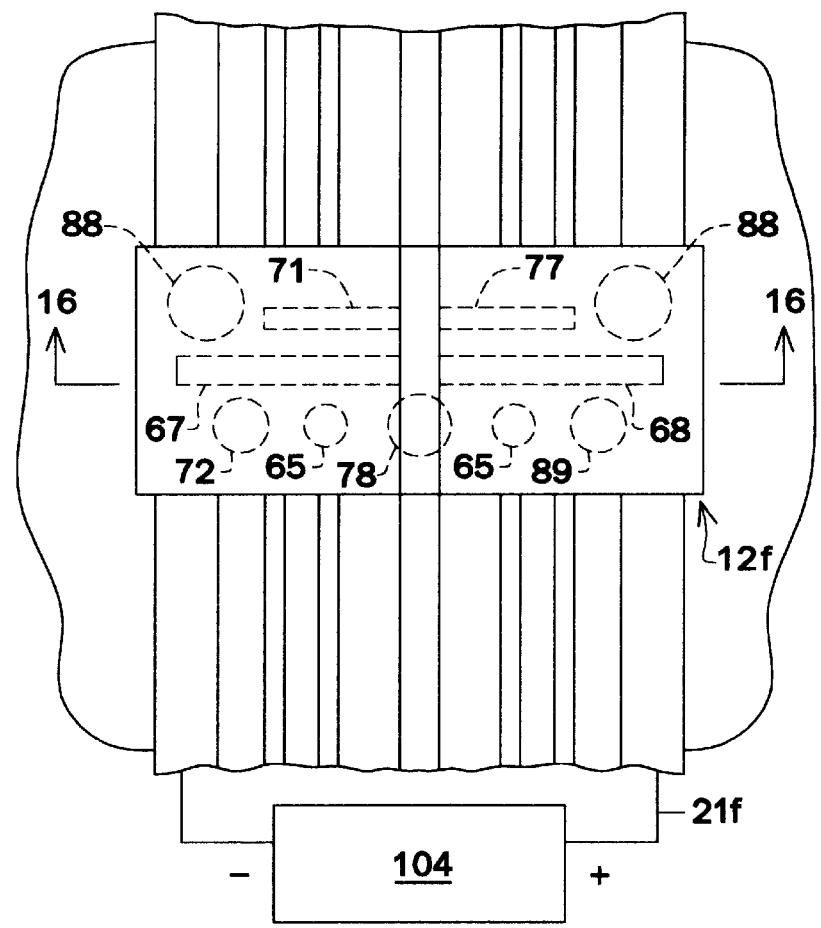
FIG. 15 is a frontal view of a portion of another circuit control device which also uses radio frequency energy to sense and track motion of a slidable member.
Figure 16:
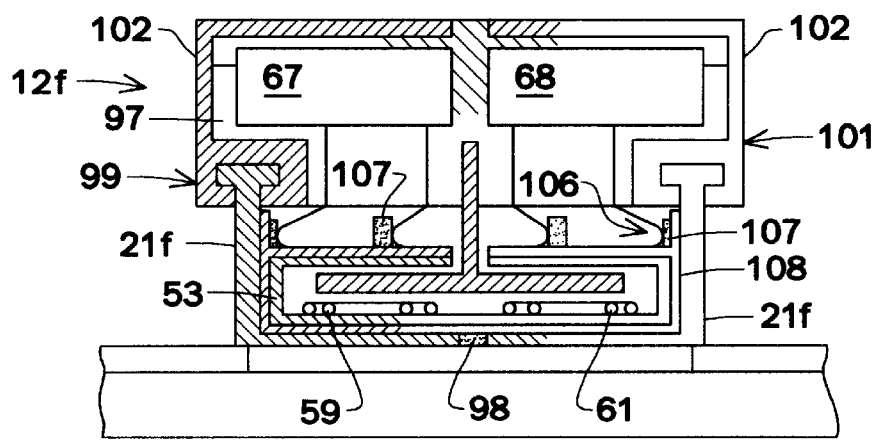
FIG. 16 is a cross section view taken along line 16—16 of FIG. 15.

In particular, with reference to FIGS. 15 and 16, the previously described oscillators 67 and 68, buffer amplifiers 71 and 77, inductance coils 88 and capacitors 72, 78 and 89 are all embedded in a plastic core 97 of the sliding member 12f. Electrical connections between the embedded components are not shown as they are similar to those previously described with reference to FIG. 12A.

With reference to FIGS. 15 and 16, to enable use of the rails 21f as DC power and high frequency signal conductors the two rails are formed of electrical conductor and are electrically isolated from each other by a strip of insulative material 98 which extends between the rails at the base of the rails. The portions 99 and 101 of member 12f which engage rails 21f are also formed of electrical conductor and are electrically isolated from each other by the plastic core 97 of the member 12f. Member 12f has a split, electrically conductive outer shell 102 each half of which is integral with a separate one of the member portions 99 and 101. The two halves of shell 102 are spaced apart and electrically isolated from each other by the plastic core 97 of the member 12f.

Portions of the electrical circuit that appear below dashed line 103 in FIG. 12A jointly form a power supply and signal processor and are represented in FIG. 15 as a single block 104. Referring to FIGS. 12A, 15 and 16 in conjunction, rails 21f constitute the combined DC power and high frequency signal conductors 73 and 79 of the previously described circuit. Components which are embedded within the sliding member 12f are interconnected in the manner shown above dashed line 103 in FIG. 12A and as previously described. The positive and negative power terminals of each oscillator 67 and 68 are connected to separates ones of the two halves of the conductive shell 102 of the member 12f through a separate one of the inductance coils 88. Each of the buffer amplifiers 71 and 77 within the member 12f are connected to a separate one of the two halves of shell 102 through capacitors 72 and 78 respectively.

Interconnection of the stationary elongated coils 59 and 61 with other components of the oscillators 67 and 68 that are within the slidable member 12f is provided for by two pairs of wiper contacts 106. Contacts 106 extend from the base of the member 12f and contact and travel along two pairs of parallel conductors 107 that extend along an insulative envelope 108 that encloses shield 53. Conductors 107 are connected to the coils 59 and 61 at the ends of the coils.

Except as herein described, the embodiment of FIGS. 15 and 16 may be similar to the previously described embodiment of FIGS. 9 to 12A.

Figure 18:
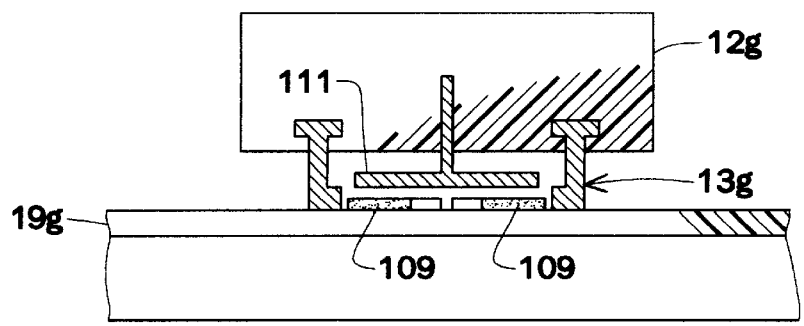
FIG. 18 is a cross section view taken along line 18—18 of FIG.17.
Figures 17, 19:
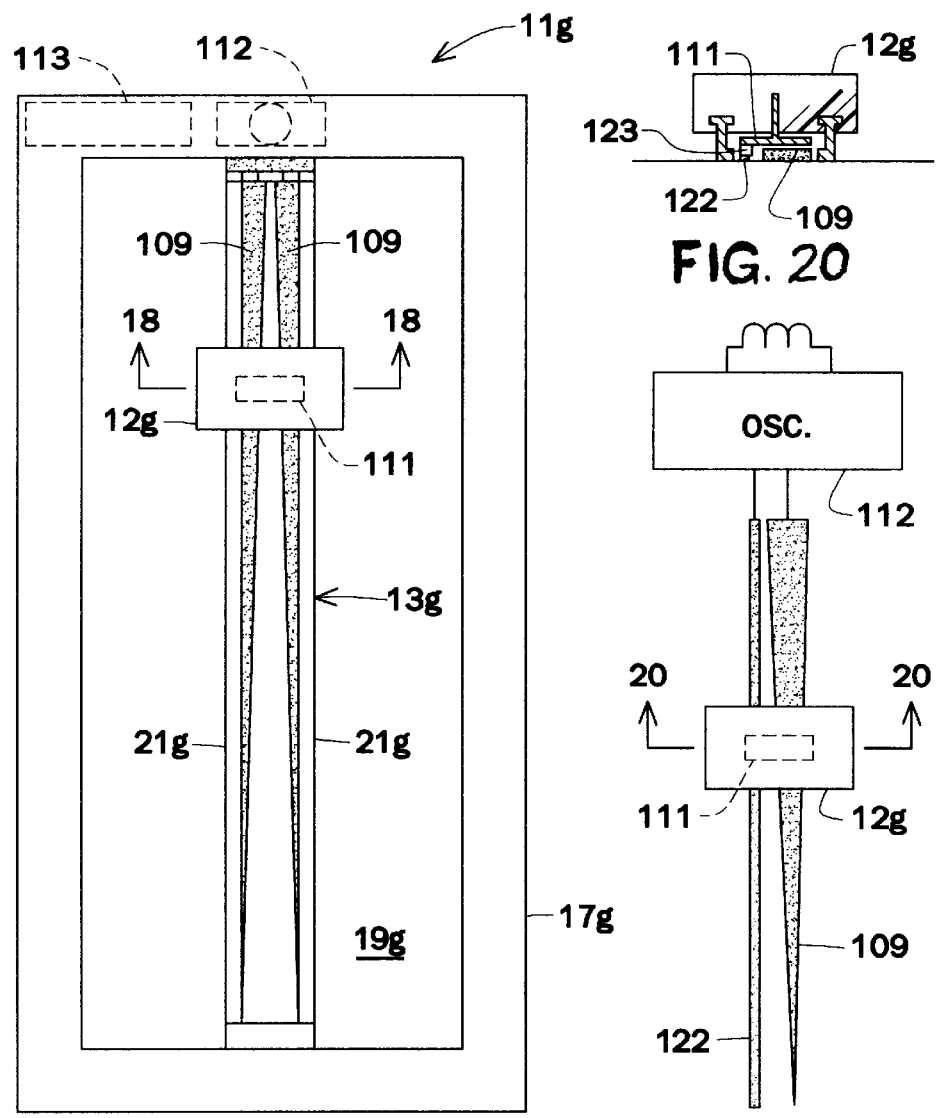
FIG. 17 is a frontal view of an electrical circuit control device which uses capacitive effects to sense and track movement of a slidable member.
FIG. 19 depicts a variation of the configuration of capacitive components for a circuit control that may otherwise be similar to the control of FIGS. 17 and 18.

FIGS. 17 and 18 depict another circuit control device 11g of the sliding member type which uses capacitive effects to sense and track movement of the sliding member 12g. For this purpose, a pair of spaced apart elongated triangular capacitor plates 109 extend along the member track 13g between the rails 21g which support the member 12g. The capacitor plates 109 are coplanar and in this example are vacuum deposited or otherwise bonded to the surface of the transparent cover plate 19g of the flat panel display 17g. The broader ends of the two capacitor plates 109 are at the same end of track 13g. Member 12g carries a third capacitor plate 111 that spans plates 109 in spaced apart relationship therewith.

Capacitor plates 109 and 111 jointly function as the capacitive component of the resonant circuit of an oscillator 112. In this example other components of the oscillator 112 are situated in the marginal region of the flat panel display 17g adjacent to one end of the track 13g and capacitor plates 109 are connected to the other components at that end of the track. The other components of the oscillator can be at other locations including being embedded in the slidable member 12g in the manner which has been previously described with respect to the embodiment of FIGS. 15 and 16.

As the widths of the capacitor plates 109 progressively change along the length of the track 13g, the resonant frequency of oscillator 112 also changes as the member 12g and third capacitor plate 111 are slid along track 13g. This enables a signal processor circuit 113 to track movement of the member 12g and to output a control signal for a controlled circuit that has a magnitude determined by the position of the member along track 13g.

Figure 18A:
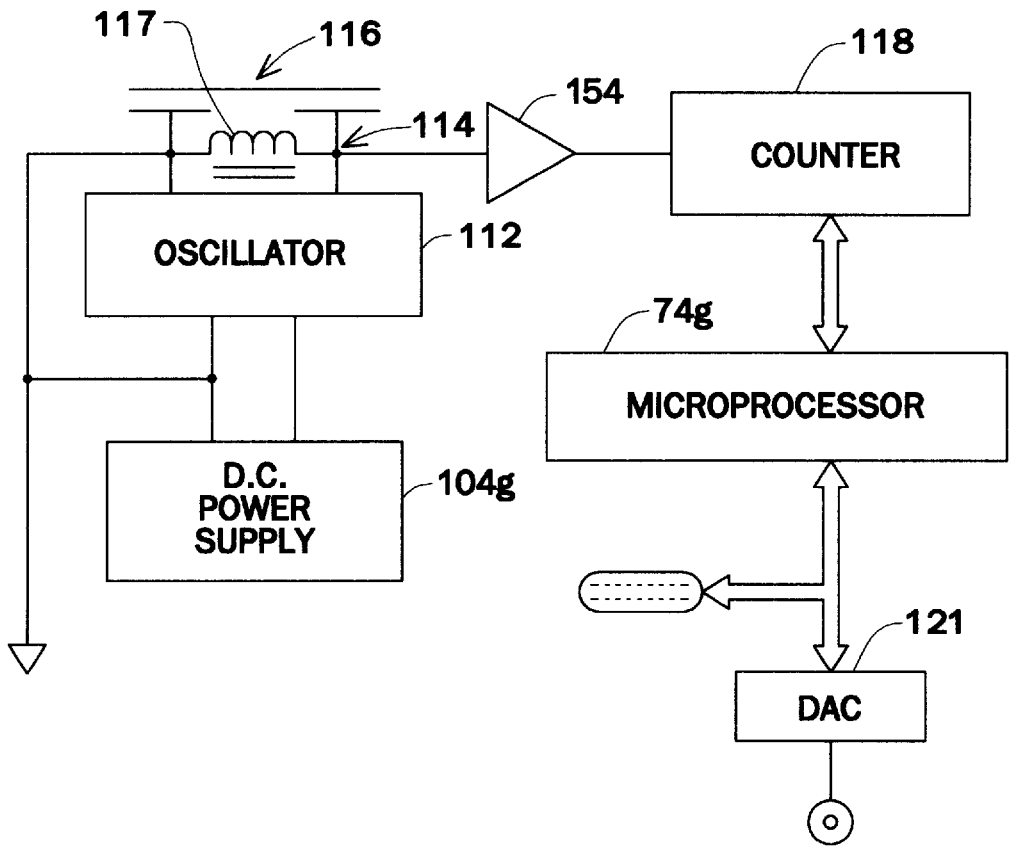
FIG. 18A is a schematic circuit diagram depicting the electrical circuit of the embodiment of FIGS. 17 and 18.
Figure 18B:
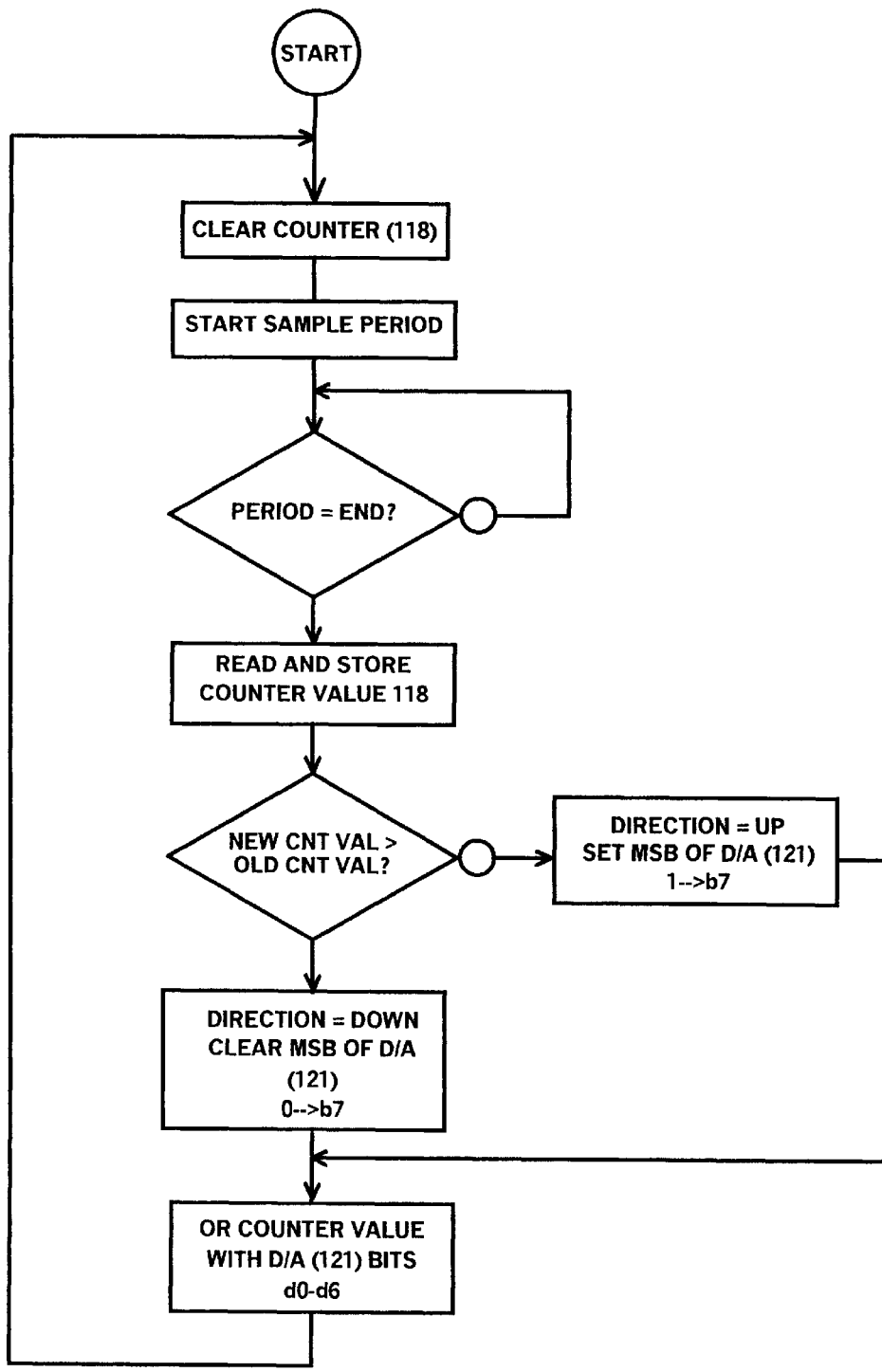
FIG. 18B is a program flowchart depicting operations performed by a digital data processor which is a component of the circuit of FIG. 18A.
Figure 22:
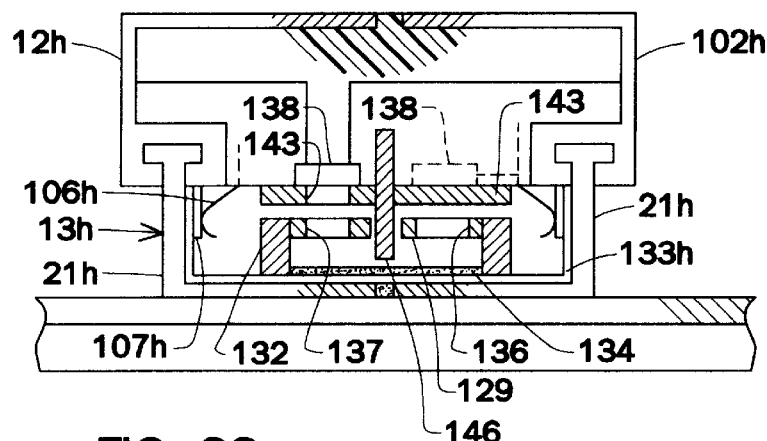
FIG. 22 is a cross section view taken along line 22—22 of FIG. 21.

For this purpose, with reference to FIG. 18A, a circuit junction 114 between the capacitive component 116 and inductive component 117 of the resonant circuit of the oscillator 112 is coupled to a frequency cycle counter 118 through a buffer amplifier 119. Referring jointly to FIGS. 18A and 18B, a microprocessor 74g cyclically reads the accumulated count in counter 118 and cyclically resets the counter in order to detect the current resonant frequency of the oscillator 112. The microprocessor outputs a digital control signal which has a value that changes in response to changes of the frequency caused by changes in the position of the slidable member and third capacitor plate 111 along the track. The control signal may be delivered through a digital to analog converter 121 if the controlled electrical circuit is of a type that responds to control signals in the form of a variable voltage.

The oscillator 112 of this example is of the harmonic type which has a resonant circuit formed by capacitance 116 and inductance 117. The oscillator 112 and other oscillators which are herein described can alternately be of the relaxation type in which case inductance 117 is replaced with a resistance.

Other components of the control device 11g of FIGS. 17 and 18 may be similar to the corresponding components of the embodiment of FIGS. 9 to 11.

Figure 20:
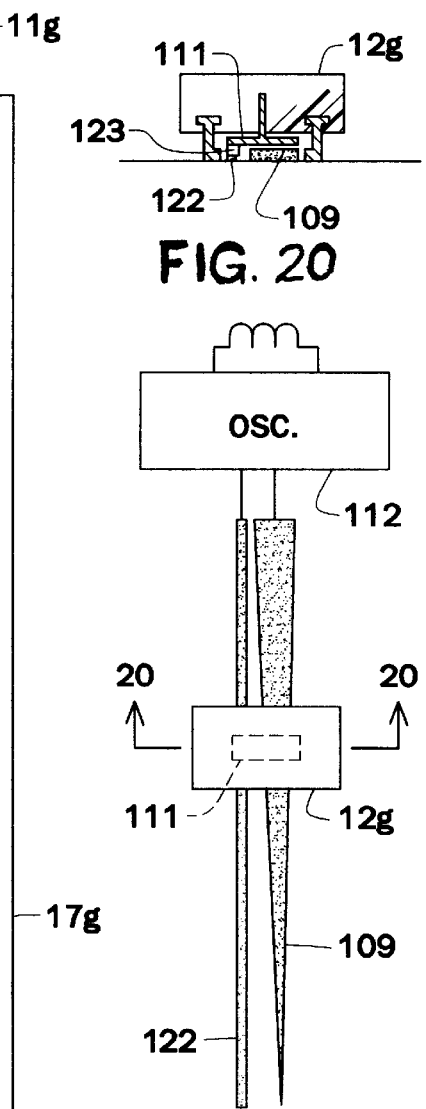
FIG. 20 is a cross section view taken along line 20—20 of FIG. 19.

FIGS. 19 and 20 depict a modification of the last described embodiment in which one of the two elongated triangular capacitor plates is replaced with a linear conductor 122 which extends alongside of the remaining capacitor plate 109 in spaced apart relationship therewith. The capacitor plate 111 that is carried by the sliding member 12g carries a wiper contact 123 that contacts and travels along conductor 122 to electrically connect the traveling capacitor plate 111 with the oscillator 112. The control device of FIGS. 19 and 20 may otherwise be similar to the control device of FIGS. 17 and 18.

FIGS. 20A and 20B illustrate still another modification of the embodiment of FIGS. 9 to 11 in which the two elongated triangular capacitor plates are replaced with a fixed linear capacitor plate 124 and a pivotable linear capacitor plate 126 which extends alongside the fixed plate and which pivots about a pin 127 situated at one end of the pivotable plate. The surface of the pivotable plate 126 which faces the slidable member 12g has a linear groove 127 which has a slightly diagonal orientation relative to the surface of the plate that faces the fixed capacitor plate 124. Another pin 128 protrudes from the undersurface of member 12g and extends into the groove 127. Thus sliding movement of the member 12g along tracks 21g pivots plate 126 towards the fixed plate 124 or away from the fixed plate depending on the direction of member movement. This progressively varies the resonant frequency of the oscillator 112 to enable variation of a control signal in the manner which has been previously described with reference to FIGS. 18A and 18B. Other components of the control device of FIGS. 20A and 20kB may be similar to the corresponding components of the embodiment of FIGS. 9 to 11.

Referring to FIGS. 21 to 24, movement of a sliding member 12h along a track 13h may also be sensed and tracked by photoelectric means. In the control device 11h of FIGS. 21 to 24 the track 13h extends along the face of a flat panel display 17h within the image display area as in the previously described embodiments and again includes spaced apart parallel rails 21h on which the sliding member 12h is engaged in the previously described manner. Two parallel linear strips of opaque material 129 and 131 extend along the track 13h between rails 21h and are secured to linear supports 132 that also extend along the track. Supports 132 are bonded to a lining 133 of insulation which extends across the base of the track 13h and which extends up the inner sides of rails 21h. A mirror 134 extends along the track 13h between the bases of supports 132 and is bonded to lining 133. The supports 132 hold the opaque strips 129 and 131 outward from the mirror 134.

Figure 24:
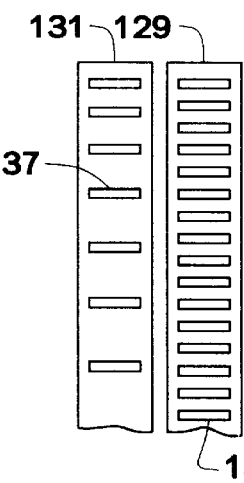
FIG. 24 depicts portions of a pair of mirrored strips which are components of the control device of FIGS. 21 to 23.

As best seen in FIG. 24 one of the opaque strips 129 has uniformly spaced apart slots 136 or light transmissive zones along its length. The other opaque strip 131 has slots 137 or light transmissive zones that become progressively closer together along the length of the strip. The slidable member 12h carries a pair of light emitting diodes 138 each being positioned direct light towards a separate one of the strips 129 and 131. The member 12h also carries a pair of phototransistors 139 one of which is positioned to intercept light which has passed through a slot 136 of strip 129 and which has been reflected back through another slot 136 by mirror 134. The other phototransistor 139 is positioned to intercept light which has passed through a slot 137 of the other opaque strip 131 and which has been reflected back through another slot 137 by the mirror 134. Thus each phototransistor 139 is alternately turned on and off as member 12h is traveled along track 13h. One phototransistor 139 produces output pulses having a frequency that is a function of the spacing of slots 136 and the other produces output pulses having a frequency that is a function of the spacing of slots 137. The ratio of the two frequencies is different at successive locations of the member 12h along track 13h owing to the progressively changing spacing of slots 137. Thus a unique frequency ratio identifies each successive position of the member 12h along the track 13h. The two frequencies are also a function of the speed of travel of the member 12h but the ratio of the frequencies is not.

Figure 21:
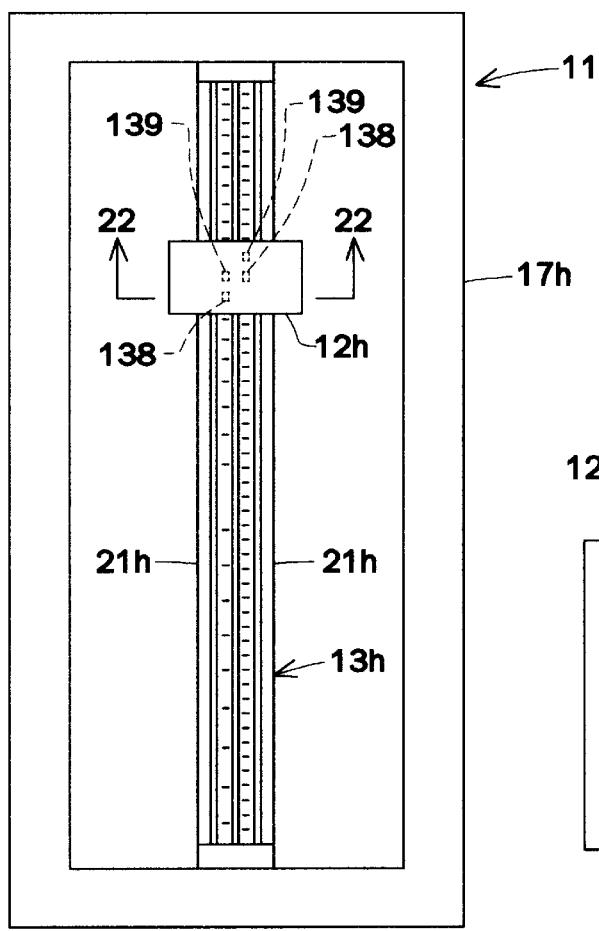
FIG. 21 is a frontal view of another electrical circuit control device which uses photoelectric effects to sense and track motion of the member.
Figure 23:
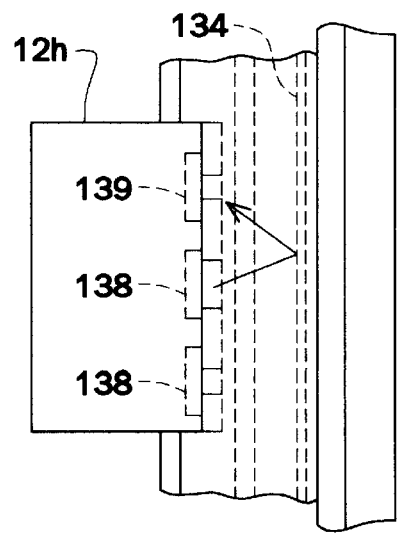
FIG. 23 is a side view of the sliding member region of the circuit control device of FIGS. 21 and 22.
Figure 24A:
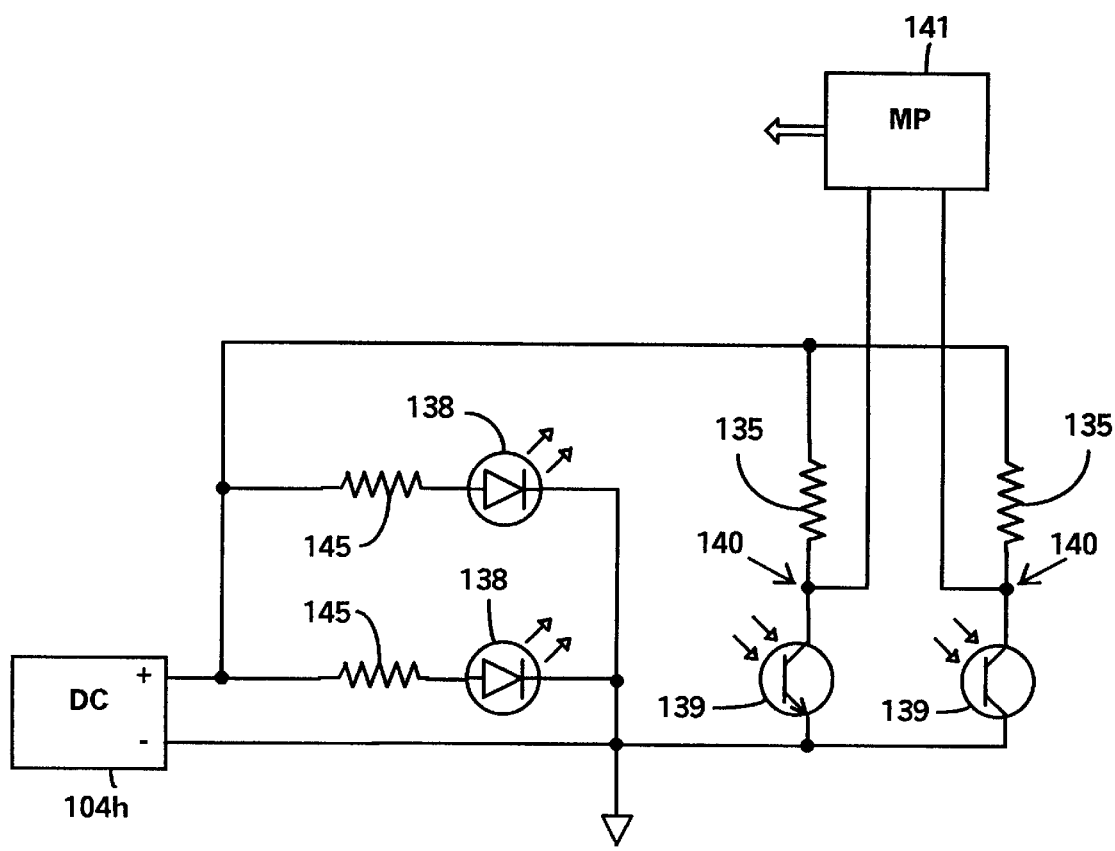
FIG. 24A is a schematic circuit diagram depicting the electrical circuit of the control device of FIGS. 21 to 24.
Figure 24B:
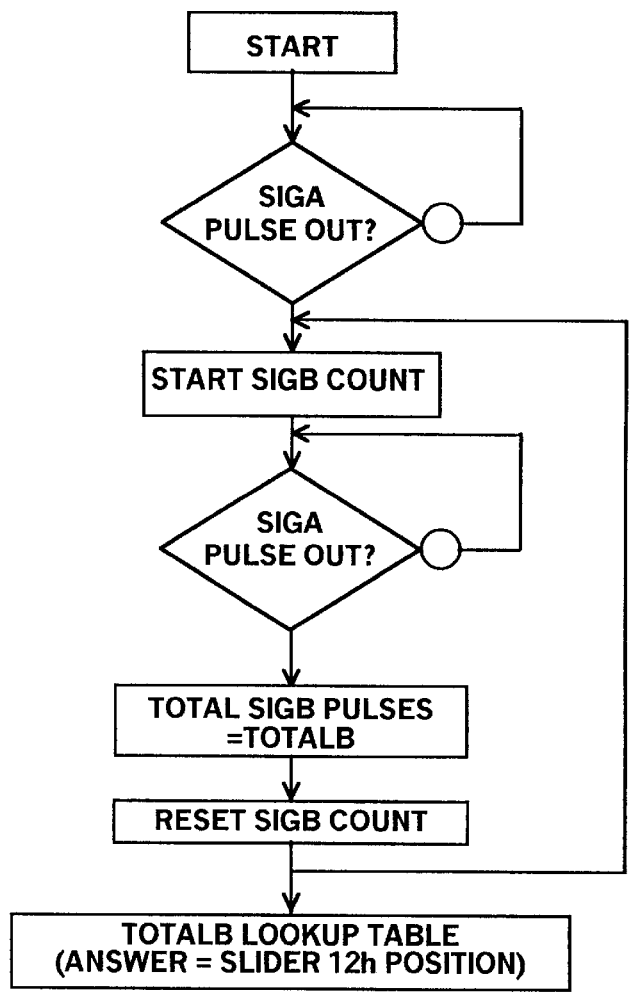
FIG. 24B is a program flowchart of operations performed by a digital data processor which is a component of the circuit of FIG. 24A.

Referring to FIG. 24A, the light emitting diodes 138 are connected across the terminals of the DC power supply 104h in series with a separate current limiting resistor 145 in this example of the invention although the two diodes may share a single current limiting resistor in a variation of the invention. The negative terminal of the power supply 104h being the system ground in this example of the invention. Each phototransistor 139 is connected across the terminals of the DC power supply 104h in series with a separate voltage dropping resistor 135. The circuit junctions 140 between the phototransistors 139 and resistors 135 are connected to separate ports of the microprocessor 141. This causes the voltage at each such microprocessor port to change from a high status to a low status each time that a pulse of light is received by the phototransistor 139 that is connected to the port. Referring jointly to FIGS. 21, 24A and 24B, the microprocessor 141 detects the position of the slidable member 12h along its track 13h by computing the ratio of the frequencies of the output pulses from the two phototransistors 139 that are produced by movement of the member. The microprocessor 141 refers to an internally configured look up table to determine the control signal that is to be outputted in response to the current ratio and transmits a control signal having that value to the controlled circuit.

Electrical connections to the light emitting diodes 138 and phototransistors 139 are provided for in part by making use of the rails which support the member 12h as has been previously described in connection with the control device of FIGS. 15 and 16. Thus, with reference to FIGS. 21 to 24A, rails 21h are formed of electrical conductor and are electrically isolated from each other. The member 12h has a conductive shell 102h with two halves that are electrically isolated from each other and each of which is in electrical contact with a separate one of the rails 21h. One rail 21h is connected to the positive terminal of the DC power supply and the other rail is connected to the negative terminal of the power supply. The light emitting diodes 138 are connected across the two halves of the conductive shell 102h of member 12h and the emitters of phototransistors 139 are connected to the negative voltage half of the shell. The collectors of phototransistors 139 connect with microprocessor 141 through wiper contacts 106h which extend from the base of member 12h. The wiper contacts ride along linear conductors 107h which are bonded to the insulative lining 133h at opposite sides of the track 13h and which are connected to the microprocessor 141 at one end of the track.

An opaque mask 143 is bonded to the base of member 12h and has a thin slot 144 situated directly behind each light emitting diode 138. Consequently only one of the slots 136 of strip 129 and only one of the slots 137 of strip 131 receive light at any given time. An opaque blade 146 protrudes from the base of member 12h and extends between the slotted strips 129 and 131 to keep light which is intended for one phototransistor 139 from affecting the output signals of the other phototransistor.

FIG. 25 depicts a modification of the control device of the preceding four figures wherein the slotted strips 129 and 131 are bonded directly to the front surface of the transparent cover plate 19h of the flat panel display 17h. The mirror 134 is inlaid in the back surface of the cover plate 19h. This enables the control device to be more compact as the rails 21h need not protrude from the cover plate 19h to the same extent as in the control device of FIGS. 21 to 24.

Figure 26:
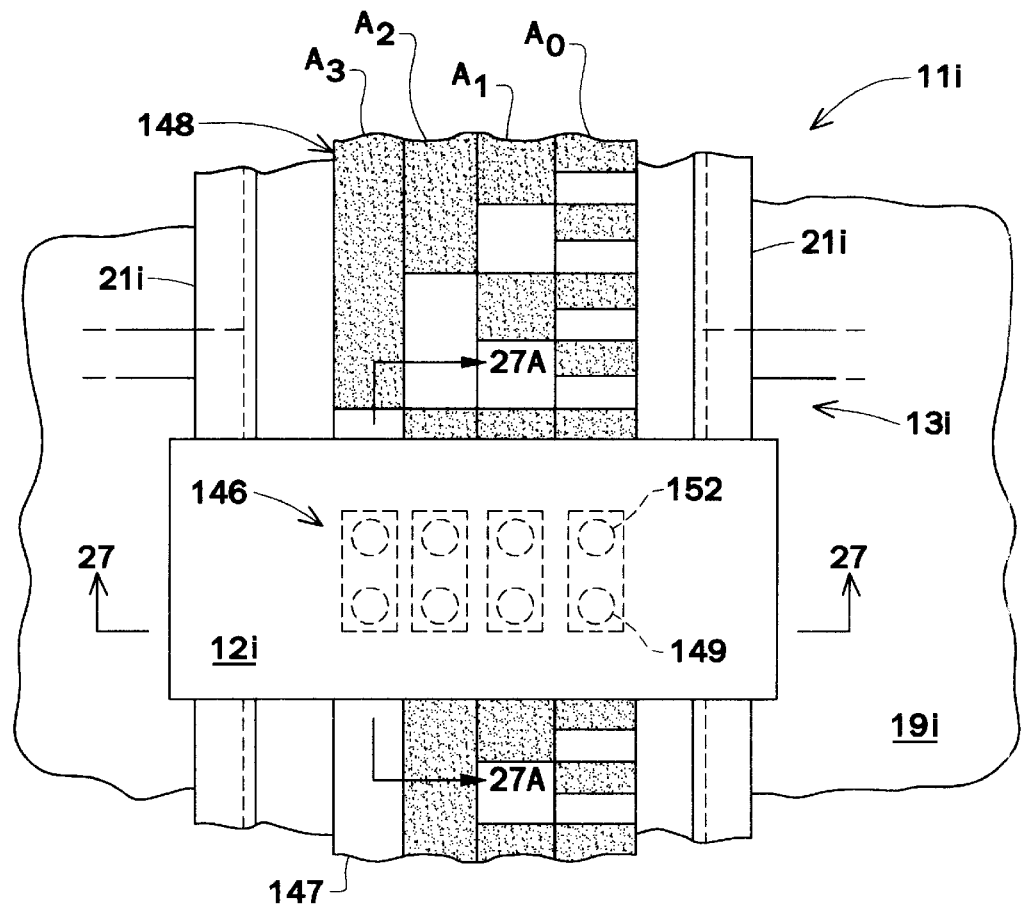
FIG. 26 is a frontal view of the sliding member region of another circuit control device that uses photoelectric effects to sense and track movement of the member.
Figure 27:
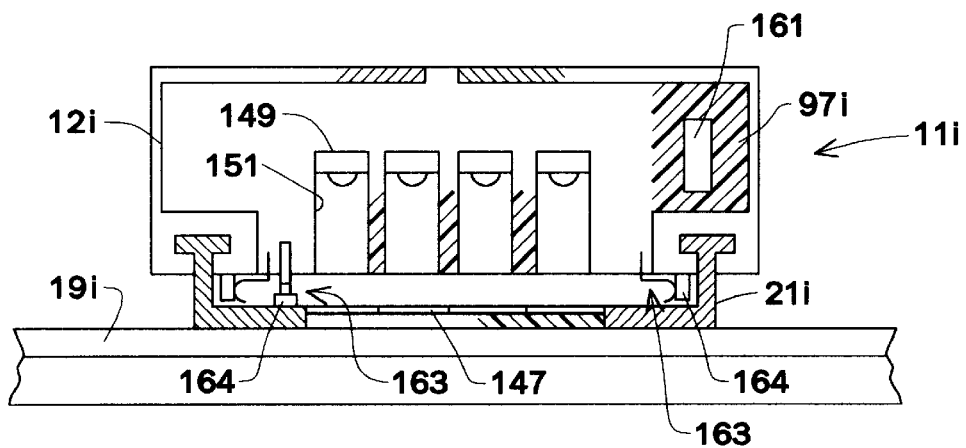
FIG. 27 is a cross section view taken along line 27—27 of FIG. 26.
Figure 27A:
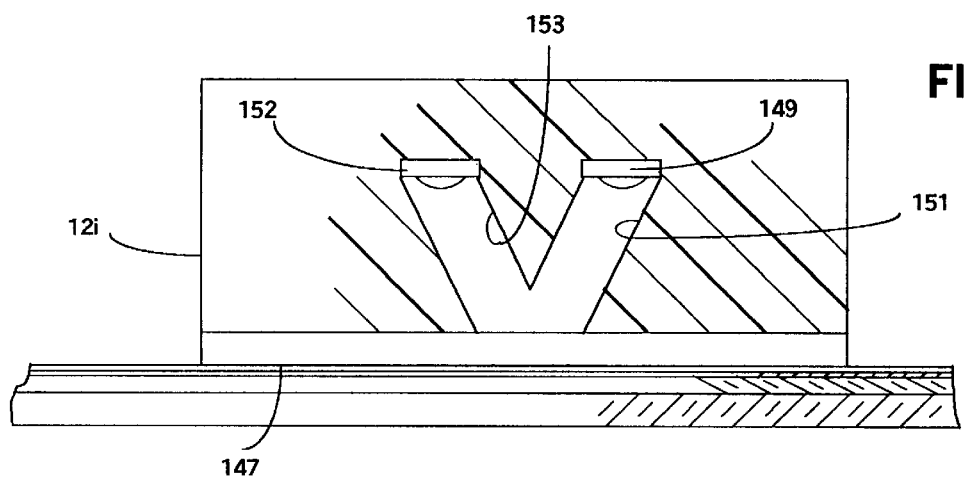
FIG. 27A is a cross section view taken along line 27A—27A of FIG. 26.

FIGS. 26, 27 and 27A depict another embodiment of the control device 11i in which photoelectric sensing means 146 detect the position of the slidable member 12i along the track 13i by viewing binary coding on a flat linear mirror 147 which extends along the track 13i, the mirror being between the rails 21i and being affixed to the flat panel display cover plate 19i in this example. The coding is defined by a plurality of side by side parallel linear zones on the mirror 147, identified as $A_0$, $A_1$, $A_2$ and $A_3$ in FIGS. 26 and 28, portions of which are covered with light absorbent material 148. In the drawings stippled areas of the zones $A_0$, $A_1$, $A_2$ and $A_3$ are light absorbent areas and clear areas of the zones reflect light.

Referring to FIGS. 26, 27 and 27A in conjunction, four light emitting diodes 149 or other light sources are contained within the slidable member 12i. The diodes 149 are arranged in a row which extends transversely across the mirror 147 and each diode faces into a separate one of four passages 151 each of which is directed towards a separate one of the zones $A_0$, $A_1$, $A_2$ and $A_3$ of the mirror 147. Four phototransistors 152 are also disposed within the member 12i and are arranged in a row which is parallel to the row of diodes 149. Another four passages 153 extend from separate ones of the phototransistors 152 towards separate ones of the zones $A_0$, $A_1$, $A_2$ and $A_3$. As may be seen in FIG. 27A ones of the passages 151 and 153 that are directed towards the same mirror zone $A_0$, $A_1$, $A_2$ or $A_3$ are angled relative to each other in order to be directed towards the same location on the surface of the mirror 147. Phototransistors 152 are turned on and off as the member 12i is traveled along the mirror 147 as light is reflected toward a phototransistor when it is viewing a reflective area of the mirror through a passage 153 and the illumination of the phototransistor ceases when it is viewing the light absorbent material 148. As may be seen in FIG. 28, reflective areas 154 alternate with light absorbent areas 156 along each of the zones $A_0$, $A_1$, $A_2$ and $A_3$ of mirror 147. The areas 154 and 156 on zone $A_1$ are twice as long as the areas 154 and 156 on zone $A_0$ and each successive zone has areas 154 and 156 that are twice as long as the areas 154 and 156 on the immediately preceding zone. Referring to FIGS. 26 and 28, this causes the four phototransistors 152 to produce a four bit binary code that has a different value at each of fifteen different positions along the path of travel of the slidable member 12i.

Referring to FIG. 29, the four light emitting diodes 149 are connected in parallel across a DC power supply 157 through a current limiting resistor 158. The collector of each phototransistor 152 is connected to the positive terminal of power supply 157 through a separate one of four additional resistors 159 and the emitters of the phototransistors are connected to the negative terminal of the power supply. The collectors of the phototransistors 152 are also each individually connected to a separate input of a shift register 161. Thus each input of the shift register 161 is in a high state when the phototransistor 152 to which it is connected is in the off condition and goes to a low state when the phototransistor is turned on by reflected light in the previously described manner. Consequently, at any given time shift register 161 is storing a four bit binary number that identifies one of the previously described fifteen positions of the slidable member at its path of travel.

In this example a microprocessor 162 repetitively reads out the contents of the shift register 161, refers to an internally configured look up table to identify a predetermined desired control signal value for the current position of the slidable member and outputs a control signal of that value to a controlled device. The control signal may be changed to a variable voltage by a digital to analog converter if the controlled device is one which responds to control signals in the form of a variable voltage. Under some conditions the shift register 161 and microprocessor 162 are not needed and the controlled device may be connected directly to the collectors of the phototransistors 152. This is possible if the controlled device is one which responds to four bit digital control signals in parallel form.

Referring jointly to FIGS. 27 and 29, resistors 158, 159 and shift register 161 are embedded in a plastic core 97i of the member 12i along with the light emitting diodes 149 and phototransistors 152. Electronic components within the member 12i are connected with the DC power supply 157 through the rails 21i in the manner previously described with reference to the embodiment of FIGS. 15 and 16. Shift register 161 is electrically connected to the microprocessor 162 through three wiper contacts 163 which protrude from the underside of member 12i and which contact and travel along linear conductors 164 which extend lengthwise within the track 13i.

Referring to FIG. 28, the use of four coded zones $A_0$, $A_1$, $A_2$ and $A_3$ on mirror 147 enables photoelectric detection of fifteen different settings of the control device. The control device may have fewer than four coded zones and light emitting diodes or more than four such zones and diodes. Greater numbers of coded zones provide greater position resolution thereby enabling detection of greater numbers of settings of the control device.

Figure 26A:
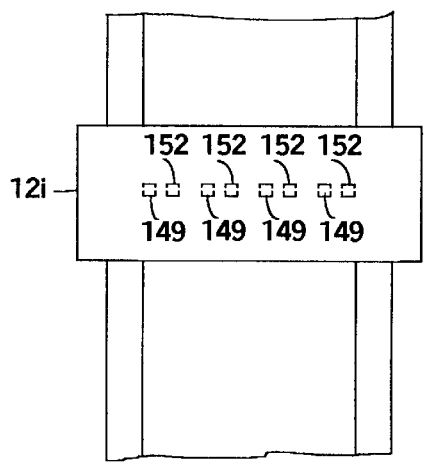
FIG. 26A is a frontal view of the sliding member region of a first modification of the embodiment of FIG. 26.
Figure 26B:
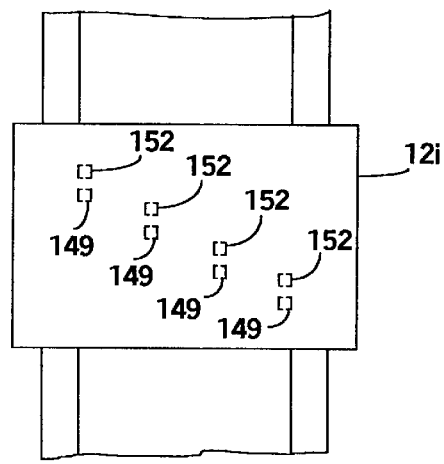
FIG. 26B is a frontal view of the sliding member region of a second modification of the embodiment of FIG. 26.

In the embodiment of FIG. 26 each light emitting diode 149 and the phototransistor 152 with which it interacts are spaced apart in the direction of travel of the member 12i. As depicted in FIG. 26A each light emitting diode 149 and the photo-transistor 152 with which it interacts can also be spaced apart in a direction which is transverse to the direction of travel of the member 12i. If the slidable member 12i is of sufficient length each light emitting diode 149 together with the phototransistor 152 with which it interacts can be at different locations along the path of travel, as shown in FIG. 26B, in order to further optically isolate the diode and phototransistor sets from each other. The particular binary coding for the different positions of the slidable member 12i that has been described with reference to FIG. 28 can be preserved in the embodiment of FIG. 26B by shifting three of the four coded zones $A_0$, $A_1$, $A_2$ and $A_3$ in a longitudinal direction, as shown by dashed lines in FIG. 28, by distances which compensate for the spacing of the centers of the slidable members 12i from each other in that direction.

Figure 26C:
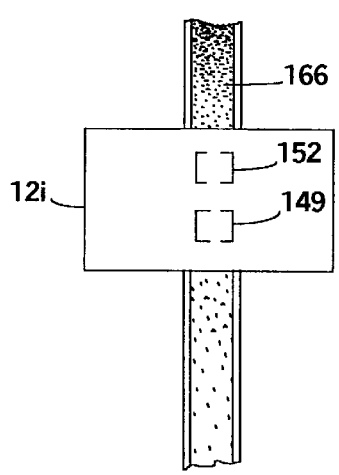
FIG. 26C is a frontal view of the sliding member region of a third modification of the embodiment of FIG. 26.
Figure 26D:
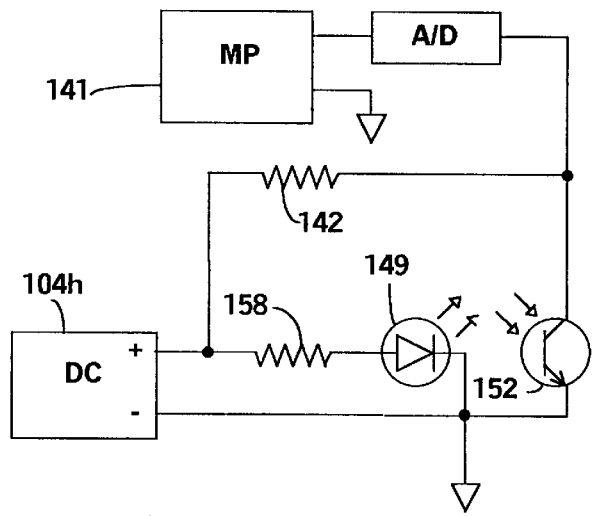
FIG. 26D is a schematic circuit diagram showing electrical components of the embodiment of FIG. 26C.

Referring to FIG. 26C, the position of the member 12i along its path of travel can also be detected by photoelectric means by eliminating three of the light emitting diodes and three of the phototransistors of the previously described embodiments and by replacing the binary coded mirror with an elongated mirror 166 at which the reflectivity of the mirror progressively decreases or increases along the path of travel of the member 12i. Referring jointly to FIGS. 26c and 26D, the output voltage at the collector of the single remaining phototransistor 152 is then dependent on the position of the member 12i along its path of travel and can be used directly as a control signal for a controlled circuit or can be amplified or be digitized and then be used for that purpose depending on the control signal requirements of the controlled circuit.

Figure 31:
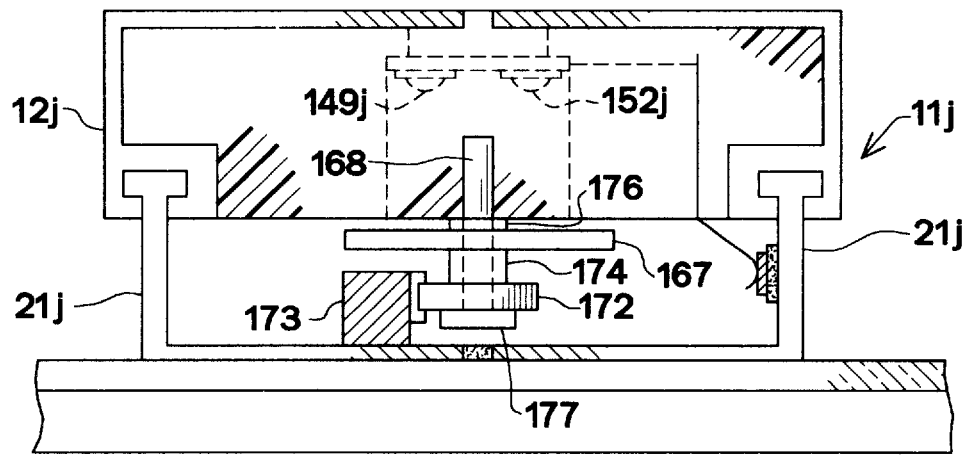
FIG. 31 is a cross section view taken along line 31—31 of FIG. 30.
Figure 30:
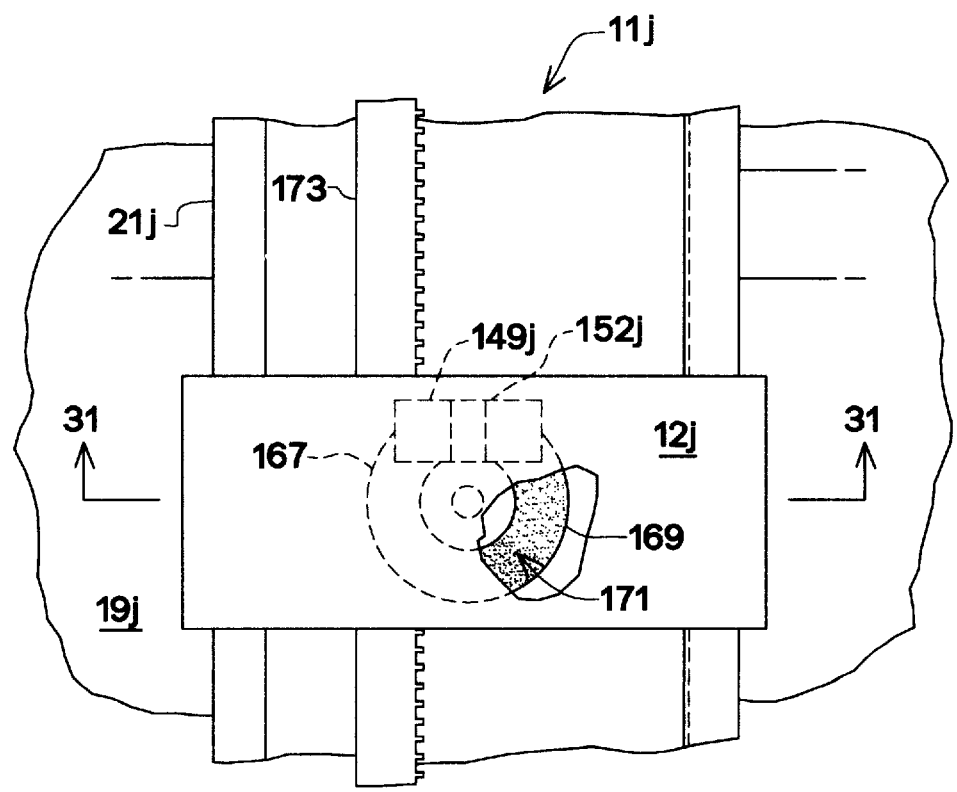
FIG. 30 is a frontal view of the sliding member region of another circuit control device which uses photoelectric effects to sense and track motion of a slidable member.

FIGS. 30 and 31 depict another circuit control device 11j of the slidable member type in which the slidable member 12j, rails 21j and the electrical circuit may all be similar to the corresponding components of the embodiment of FIGS. 26C and 26D except insofar as the rails are proportioned to protrude further from the display cover plate 19j and the light emitting diode 149j and phototransitor 152j are at a location which is offset from the center of the slidable member. A rotatable disk 167 turns on an axle 168 that protrudes from the base of the slidable member 12j midway between the rails 21j. The surface of disk 167 which faces the base of the member 12j has an annular mirror zone 169 having a diameter which causes the disk to reflect light from diode 149j back to the phototransistor 152j. The reflectivity of the mirror zone 169 is at a maximum at one location 171 on the zone and becomes progressively smaller at successive other locations along the zone.

A circular pinion gear 172 also turns on axle 168 and engages a linear rack gear 173 which extends along the path of travel of member 12j and which is secured to one of the rails 21j. This causes the gear 172 to rotate as the member is slid along rails 21j. Rotation of gear 172 is transferred to disk 167 by a sleeve 174 which extends between the gear and disk in coaxial relationship with axle 168. A washer 176 between the base of member 12j and disk 167 and a flange 177 at the end of axle 168 hold the gear 172, sleeve 174 and the disk in position.

Turning of the disk 167 in response to rotary motion of gear 172 is accompanied by a progressive change in the magnitude of the voltage at the collector of phototransistor 152j owing to the change of reflectivity at successive locations along the circular mirror zone 169. In this example of the invention, pinion gear 172 has a diameter which causes it to undergo one full revolution during travel of the slidable member 12j from one end of its path of travel to the other end of the path of travel. The area of maximum reflectivity 171 of the circular mirror zone 169 is located to be at a position where it receives and reflects light from diode 149j when the member 12j is at an end of the path of travel of the member. Reflectivity changes in a linear manner at successive locations on the mirror zone 169. Thus in this example of the invention the output signal taken from the collector of phototransistor 152j rises in a linear manner as the member 12j is traveled from one end of its path to the other and decreases in the same manner as the member is returned. As in the previously described example the voltage at the phototransistor 152j collector can be used directly as a control signal for a controlled circuit or can be amplified and then used for that purpose or the voltage can be digitized to provide a digital control signal having an operator selected value.

The control device 11j can be caused to output any desired non-linear voltage waveform by providing a non-uniform pattern of reflectivity change at successive locations along the mirror zone 169. Alternately, a microprocessor or the like, having an internal look up table of assigned signal values, can be used in the manner which has been previously described to convert the actual signal value that is present at phototransistor 152j at any given time to a differing pre-assigned control signal value for the current setting of member 12j. Use of a microprocessor can also enable use of a smaller pinion gear 172 that undergoes more than one revolution during movement of member 12j from one end of its path to the other as the microprocessor can count the revolutions and adjust the outputted control signal accordingly.

Figure 31A:
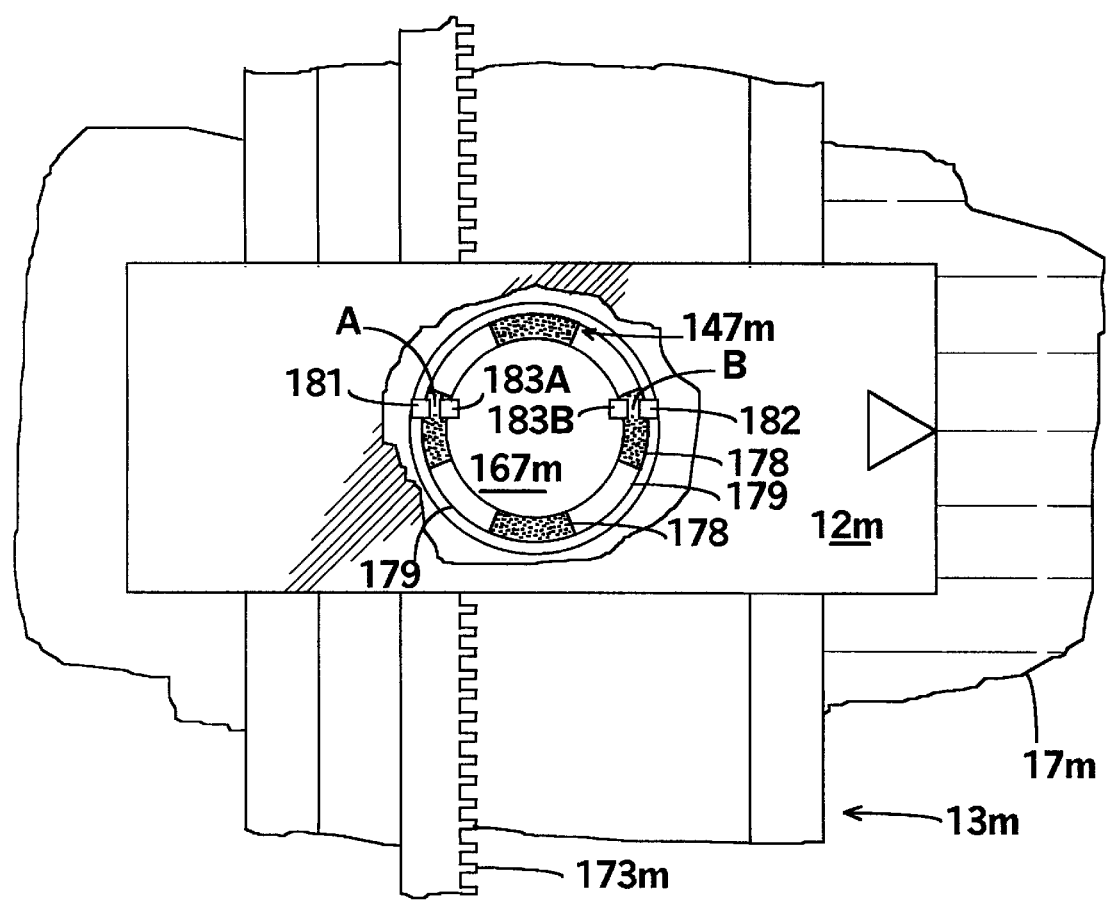
FIG. 31A is a frontal view of the sliding member region of a first modification of the control device of FIGS. 30 and 31.

FIG. 31A depicts a variation of the control device of FIGS. 30 to 31 in which photoelectric means produce a quadrature code that enables a microprocessor to sense the position of the slidable member 12m along its path of travel and to output a control signal having a value determined by the current position of the member along the path of travel. The annular mirror zone 147m on the disk 167m in this embodiment has reflective areas 178 which alternate with light absorbent areas 179. In this example there are four of each kind of area 178 and 179 and each extends along 45° of arc relative to the axis of rotation of the disk. First and second light emitting diodes 181 and 182 are carried by the member 12m and are positioned to direct light towards the mirror zone 147m at two locations which, in this example, are angularly spaced apart by 157.5° of arc relative to the axis of rotation of disk 167i and which are identified in the drawings as locations A and B. A first phototransistor 183A carried by member 12 is positioned to receive light from diode 181 that has been reflected at location A and a second phototransistor 183B receives light from diode 182 that has been reflected at location B. Thus phototransistors 183A and 183B are each repetitively turned on and off as disk 167i is turned by movement of the sliding member 12m.

The above described positioning of phototransistors 183A and 183B creates the response pattern which is depicted diagramatically in FIG. 31C and which enables a digital data processor to track movement of the member 12i. The line labeled SENSOR A in FIG. 31C indicates changes in the condition of phototransistor 183A as the sliding member is traveled through a series of successive positions and the line labeled SENSOR B indicates changes in the condition of phototransistor 183B during the same travel of the member. In this example the member 12m is traveled a distance sufficient to turn disk 167m 22.5° during movement from one position of the member to the next position. Referring jointly to FIGS. 31A and 31C, it may be seen that at a first member position both phototransistors 183A and 183B receive light. At the second position only phototransistor 183B is illuminated. At the third position neither phototransistors 183A and 183B receives light. At the fourth position only phototransistor 183A receives light. This pattern is continually repeated as the member 12m traveled further in the same direction. Reversed movement of the member 12i creates a reversed pattern of phototransistor illuminations.

Figure 31D:
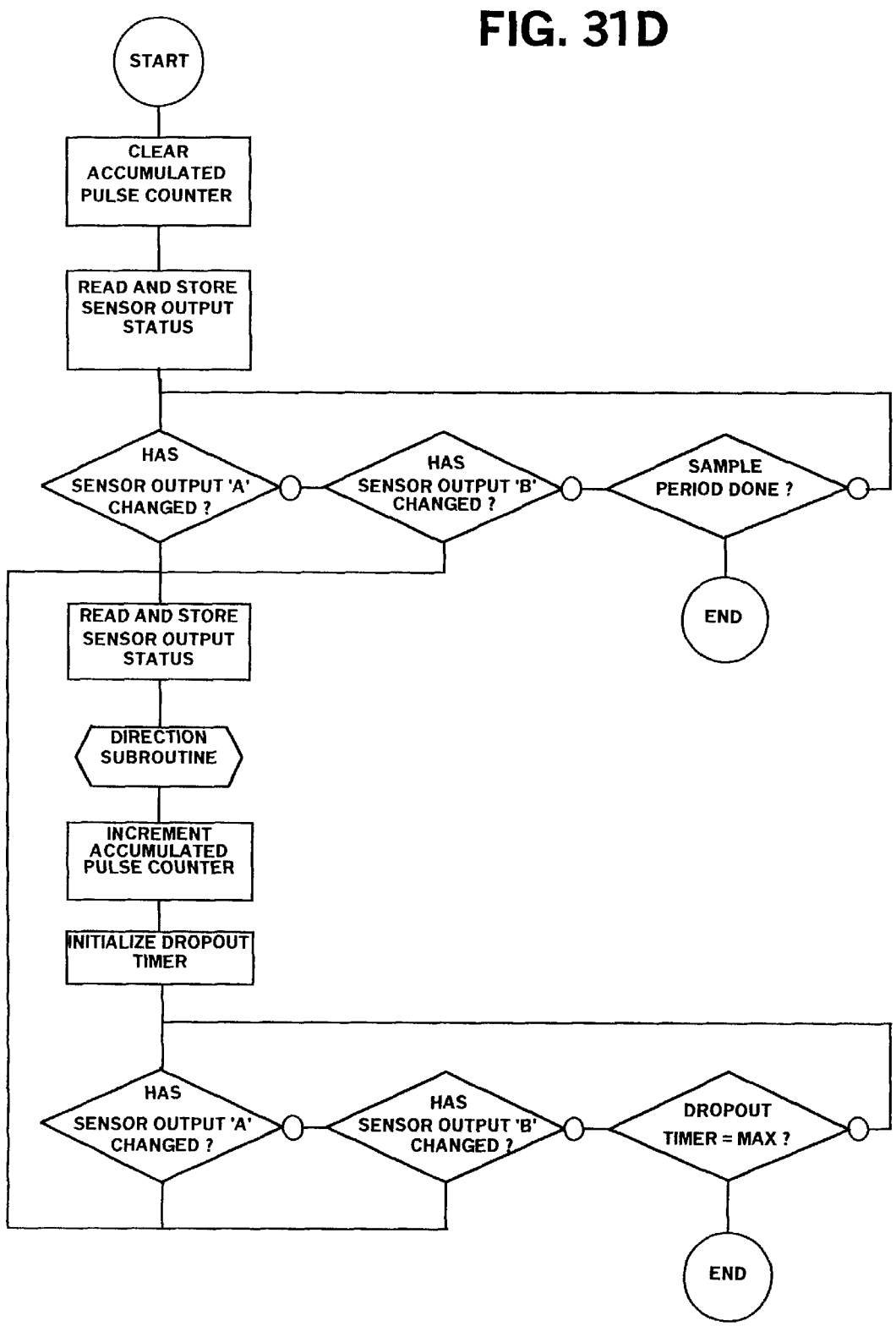
FIG. 31D is a flowchart program depicting operations performed by a digital data processor component of the circuit of FIG. 31B.
Figure 31E:
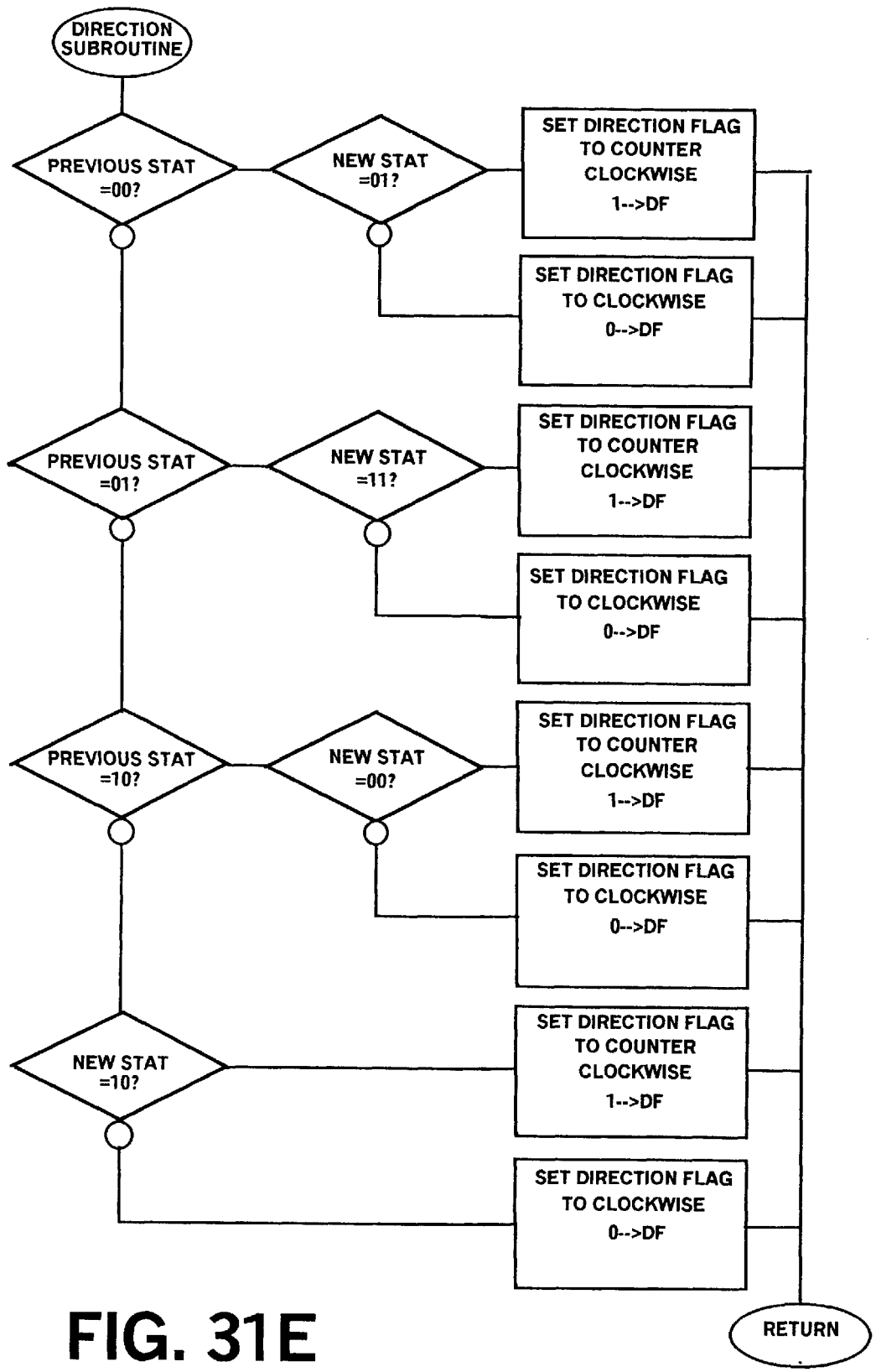
FIG. 31E is a flowchart depicting a subroutine performed by the program of FIG. 31D.

Referring to FIG. 31B, each phototransistor 183A and 183B is connected between a separate port of a microprocessor 184 and system ground in series with a separate resistor 186. This causes the voltage at each such microprocessor port to change from a high status to a low status during periods when light is being received by the phototransistor 183A or 183B that is connected to the port. As depicted in FIG. 31D, the microprocessor 184 tracks movement of the member by counting changes of the status in an additive and subtractive manner. Prior to each incrementing of the count the program executes a direction subroutine, shown in FIG. 31E, to determine if the member motion is in a forward or backward direction. Referring jointly to FIGS. 31C and 31E, the four possible combinations of the status of phototransistors 183A and 183B (sensor A and sensor B) can be represented as 00, 01, 10 and 11. If the status combination changes from 00 to 01 or from 01 to 11 or from 10 to 00 or from 11 to 10 then the member motion is backward and the program increments the accumulated count in a subtractive manner. Any other change in the status combination is indicative of forward member motion and the count is incremented in an additive manner.

Referring again to FIG. 31A, the control device 11m can distinguish between a greater number of positions of the slidable member 12m in a path of travel of given length if a larger number of reflective areas 178 and a larger number of light absorbent areas 179 are present in the annular mirror zone 147m and additional diode 181 and phototransistor 183 pairs are provided.

Figure 32:
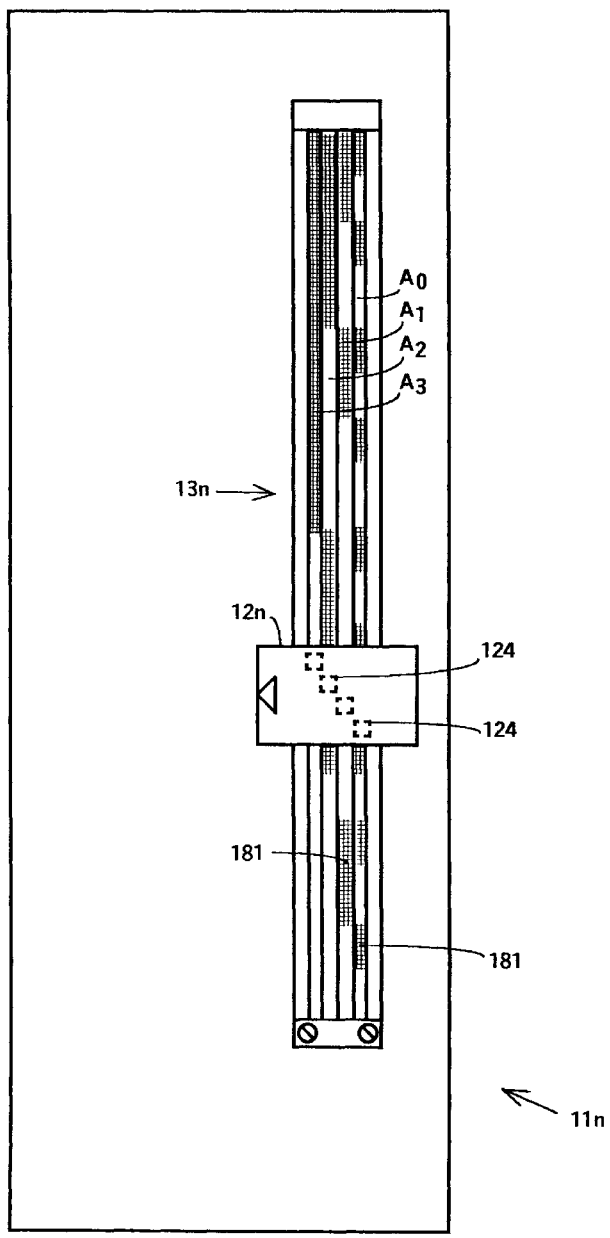
FIG. 32 is a frontal view of a circuit control device which uses the Hall effect to track movement of a slidable member.

FIG. 32 depicts a circuit control device 11n which is structurally and electrically similar to the control devices of FIGS. 26, 27 and 27A except that the light emitting diode and phototransistor pairs of that previously described embodiment are each replaced with an analog Hall effect sensor 187 and the binary coding which extends along the zones $A_0$, $A_1$, $A_2$ and $A_3$ of the track 13n is formed by areas 188 of magnetic material and areas 189 of non-magnetic material rather than by areas of light reflective material and areas of light absorbent material. The control device 11n of this example also differs from the previously described embodiment in that the Hall effect sensors 11n are offset from each other in the direction of travel of the slidable member 12n as well as in a transverse direction. This enables the track 13n to be narrower than it is in embodiments where the sensors 187 are in side by side relationship. To compensate for this offsetting of the sensors 187 in the direction of travel, the binary coding zones $A_0$, $A_1$, $A_2$ and $A_3$ are similarly offset relative to each other as has been previously described with reference to FIG. 28 and as is indicated by dashed lines in that figure. The electrical circuit of the embodiment of FIG. 32 may be similar to that previously described with reference to FIG. 29 except insofar as the light emitting diodes 149 are eliminated from the circuit and the phototransistors 152 are replaced with the Hall effect sensors 187 of FIG. 32.

Figure 33:
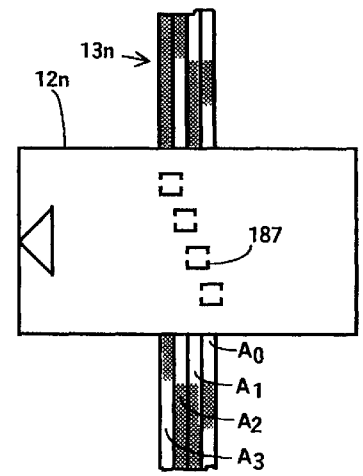
FIG. 33 is a frontal view depicting a first variation of the control device of FIG. 32.
Figure 33A:
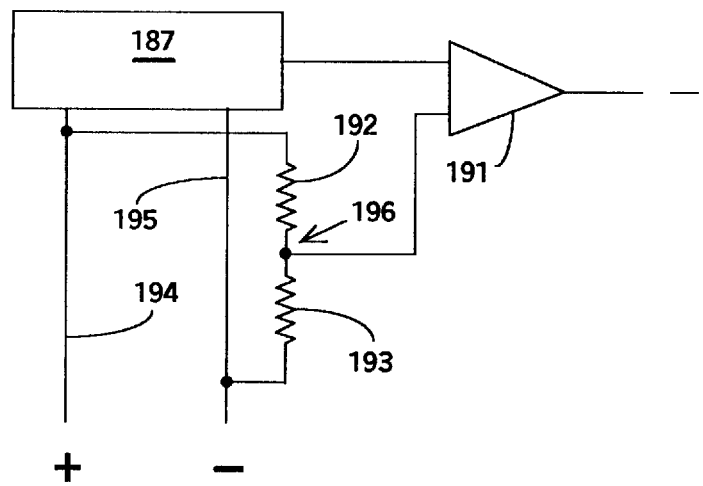
FIG. 33A is a schematic circuit diagram depicting an electrical circuit which is a component of the control device of FIG. 34.

If the track 13n is made very thin by reducing the width of the zones $A_0$, $A_1$, $A_2$ and $A_3$ as shown in FIG. 33, the lateral spacing of the centers of the Hall effect sensors 187 must also be reduced. This may cause the sensors 187 to be sensitive not only to the magnetic material at an underlying single one of the coding zones $A_0$, $A_1$, $A_2$ and $A_3$ but also to the magnetic material of an adjacent zone that is overlapped by the sensor. In the present example the sensors 187 which read coding zones $A_0$, $A_1$, and $A_2$ also detect magnetic material along a band on an adjacent one of the zones which band has a width equal to 30% of the total width of the adjacent one of the zones. The sensors 187 which read zones $A_0$, $A_1$ and $A_2$ are caused to respond only to magnetic material on the single zone by suppressing any signal having a magnitude less than 60% of the maximum magnitude signal which the sensor produces. Referring to FIG. 33A, this can be done by applying the output voltage produced by the sensor 187 to a first input of a comparator amplifier 191 of the type which also has a reference voltage input and which transmits only signals having a voltage value that equals or exceeds the reference voltage. A pair of resistors 192 and 193 are connected in series across the positive and negative DC power conductors 194 and 195 to form a voltage divider having a circuit junction 196 between the resistors which is connected to the reference voltage input of comparator 191. The values of resistors 192 and 193 are selected to provide a voltage at the reference input of comparator 191 that is equal to 60% of the maximum output voltage of the Hall effect sensor 137 in this example. Referring jointly to FIGS. 33 and 33A, the reference voltage may be fixed at a different magnitude in instances where the sensors 187 are sensitive to a lessor or greater portion of an adjacent coding zone $A_0$, $A_1$, $A_2$ or $A_3$ in addition to the zone that the sensor is intended to read. The comparators 191 and resistors 192 and 193 are contained within the slidable member 12n of the control device 11n.

Figure 34:
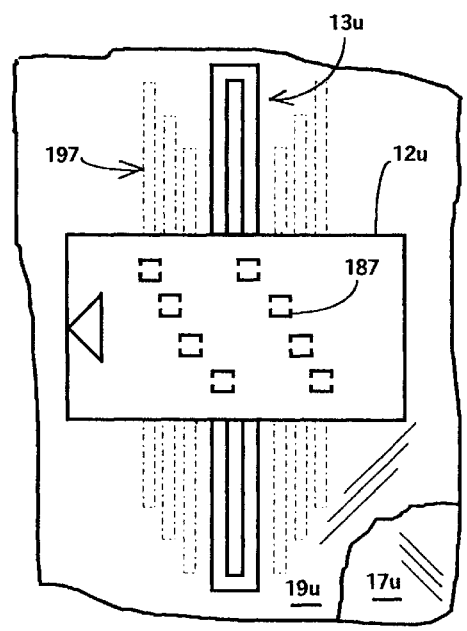
FIG. 34 is a frontal view depicting a second variation of the control device of FIG. 32.

As has been previously pointed out, the resolution of a control device which reads binary coded zones such as zones $A_0$, $A_1$, $A_2$ and $A_3$ with respect to distinguishing between a series of positions of the slidable member 12n can be increased by increasing the number of such zones. Adding additional coding zones to a control device 11n of this kind which has the previously described construction widens the track 13n. The track then obscures more of the underlying flat panel display 17n and becomes more prominent in a manner which may be undesirable for some uses of controls of this type. Operators of fader controlled sound processing equipment, for example, are accustomed to seeing only a thin slit in the panel behind a fader cap. Referring to FIG. 34, this problem can be avoided by using transparent zones 197 of binary coding which zones may be situated outside of a very thin track 13u while being under the path of the slidable member 12u. Coded zones of this kind are not noticeably visible to an operator of the control device 11u and do not obscure images displayed by the flat panel display 17u.

The transparent zones 197 may have areas of transparent magnetic material, such as magnetized indium tin oxide for example, alternating with areas of transparent non-magnetic material such as glass or clear plastic. The magnetic material may vacuum deposited or otherwise bonded to the image display cover plate 19u or an overlay cover plate or the material may be on strips of transparent material which are adhered to the cover plate or overlay cover plate. The pattern of the areas of magnetic material and areas of non-magnetic material, not visible in FIG. 34, may be similar to that of the previously described embodiments and which is depicted diagrammatically in FIG. 28.

Referring again to FIG. 34, there are eight transparent coding zones 197 in this example which are read by eight Hall effect sensors 198 arranged in two columns of sensors. The sensors of each column are spaced from each other in the direction of travel of the slidable member 12u in order to reduce the lateral extent of the two columns. As previously described, this requires that the centers of the coding zones 197 at each side of the track 13u be offset from each other in the direction of travel of member 12u by distances corresponding to the spacing of the centers of the sensors 198 in that direction if the pattern of coding depicted in FIG. 28 is to be preserved. Two of the coding zones 197, not visible in FIG. 13J, are situated inside the track 13u and need not necessarily be formed by transparent material.

Figure 35:
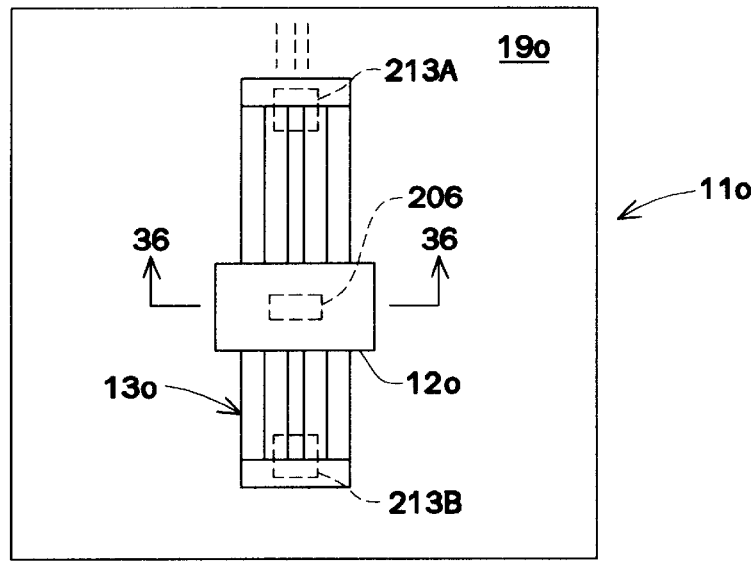
FIG. 35 is a frontal view of another sliding member type of electrical (circuit control which uses the Hall effect to sense and track movement of the member.
Figure 36:
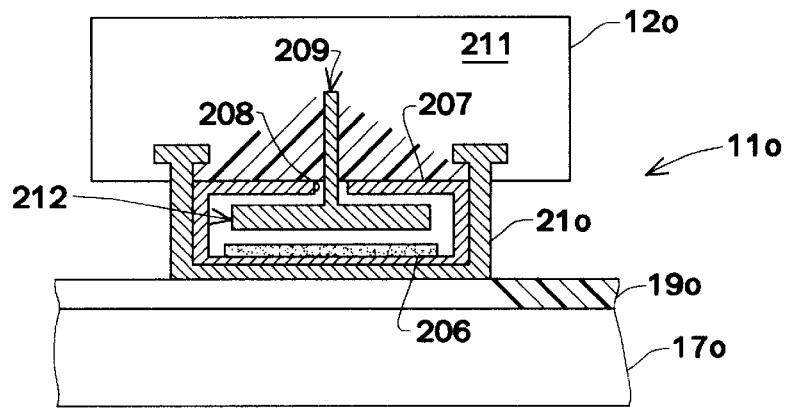
FIG. 36 is a cross section view taken along line 36—36 of FIG. 35.

FIGS. 35 and 36 depict still another circuit control device 11o of the sliding member type which uses the Hall effect to track movement of the sliding member 12o along a linear track 13o that is secured to the transparent cover plate 19o of a flat panel display 17o. The member 12o, track 13o and display 17o may be similar to the corresponding components of any of the previously described embodiments except insofar as the member need not contain any components of the member motion sensing means other than a small magnet 206 which is carried by the member. In the preferred form of the control device 11o, the region between the rails 21o of track 13o is substantially enclosed by an elongated shell 207 of magnetic shielding material such as Mu metal. Shell 207 has a longitudinal slot 208 through which a thin blade portion 209 of magnet 206 extends, an edge of the blade portion being embedded in the plastic core 211 of the member 12o. A bulkier portion 212 of the magnet 206 is within the shielding shell 207.

Figure 36A:
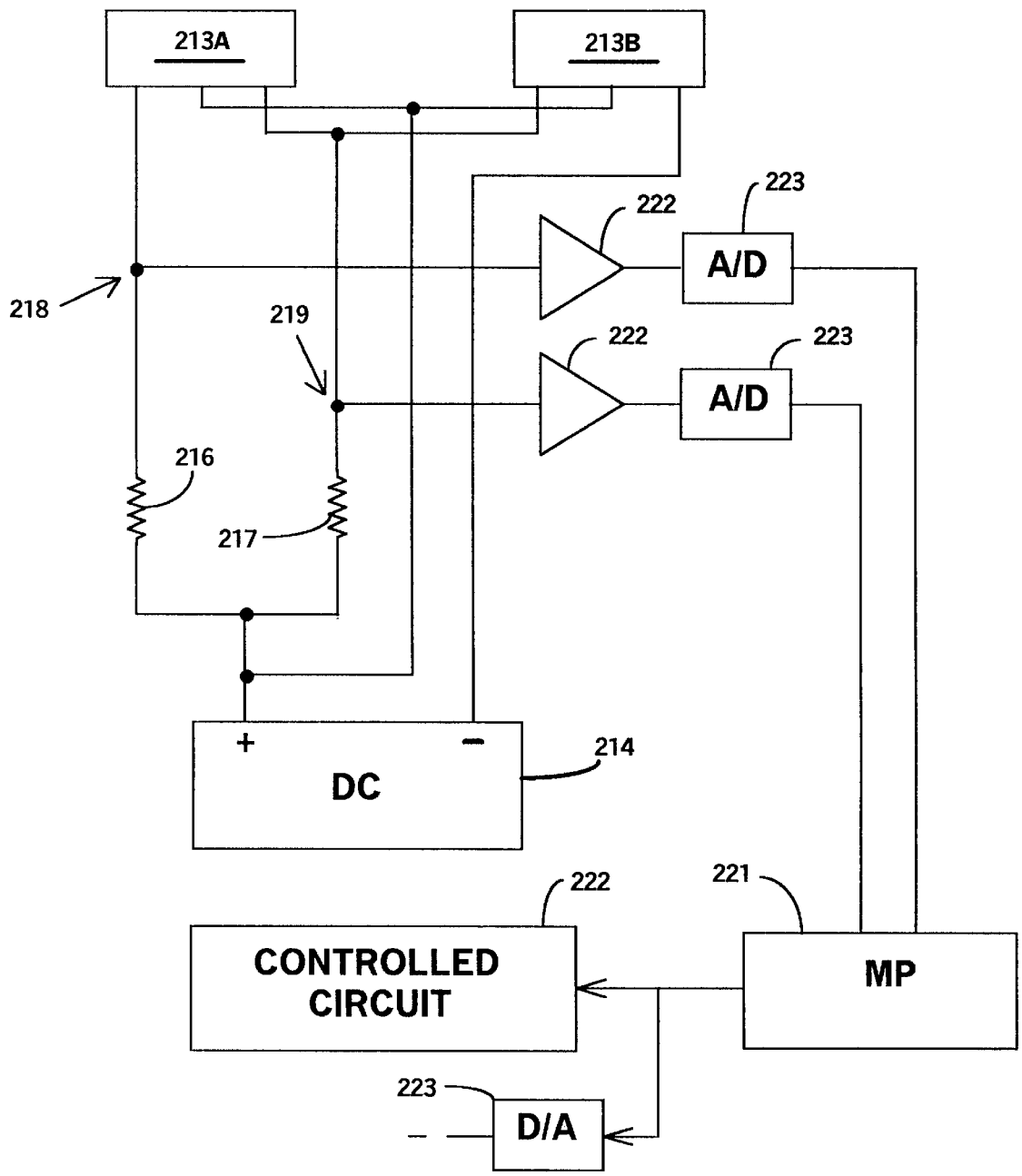
FIG. 36A is a schematic circuit diagram depicting the electrical circuit of the control device of FIGS. 35 and 36.

One of a pair of Hall effect sensors 213A and 213B of the analog type is situated within shell 207 at each end of the path of travel of the member 12o and magnet 206. The electrical resistance of each Hall effect sensor 213 decreases as the magnet 206 approaches the sensor and increases as the magnet recedes from the sensor. Referring to FIG. 36A, a first of the Hall effect sensors 213A is connected across the positive and negative terminals of a DC power source 214 in series relationship with a first resistor 216 and the other sensor 213B is connected across the same terminals in series with a second resistor 217. The first sensor 213B and first resistor 216 form a first voltage divider in which the voltage at a circuit junction 218 between the sensor and resistor changes when the resistance of the sensor changes. The other sensor 213B and resistor 217 form a second voltage divider having a similar circuit junction 219 at which the voltage changes when the resistance of the sensor changes. Thus, with reference to FIGS. 35, 36 and 36A in conjunction, the voltage at each circuit junction 218 and 219 has a different value at each successive position of the member 12o along its path of travel.

In this example each circuit junction 218 and 219 is coupled to a separate port of a microprocessor 221 or other digital data processor through a separate one of a pair of buffer amplifiers 222 and a separate one of a pair of analog to digital converters 223. The microprocessor 221 may compensate for the non-linear response of the Hall effect sensors 213A and 213B in the previously described manner by referring to an internally configured look-up table which stores the desired control signal value for each position of the member 12o along its track 13o. The microprocessor 221 can transmit the compensated control signal directly to a controlled circuit 222 if the circuit responds to digital signals or the compensated control signal may be routed through a digital to analog converter 223 if the controlled circuit responds to a variable voltage.

The response of a Hall effect sensor to the field of a magnet decreases as the magnet recedes from the sensor and there is a distance limit, determined by the sensitivity of the particular sensor, beyond which the sensor cannot reliably detect magnet position. The present embodiment of the invention uses two such sensors 213A and 213B, each being at an opposite end of the path of member travel, in order to provide for a long path of travel. Only a single Hall effect sensor is needed if the length of the track 13o is sufficiently short.

Figure 37:
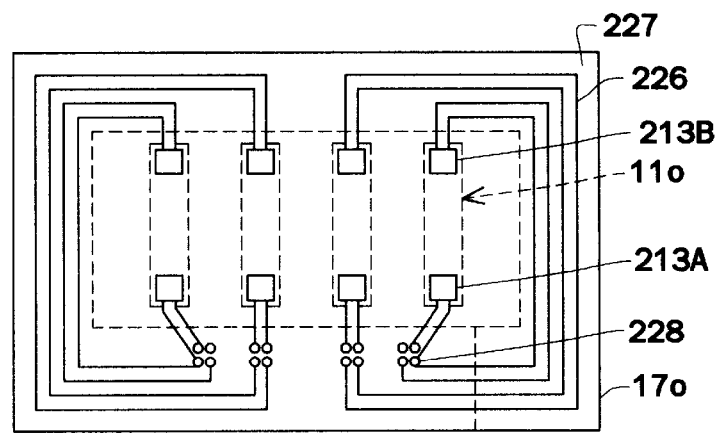
FIG. 37 is a rear view of a bank of circuit control devices of the sliding member type that is shown in FIGS. 35 and 36.

Shell 224 keeps the sensors 213A and 213B from being influenced by external magnets including magnets of other nearby control devices. The Hall effect sensors 213A and 213B can be embedded in the back surface of the flat panel display cover plate 19o or can be secured to the back surface of the flat panel display 17o itself in instances where the shell 224 is not needed. FIG. 37 depicts the back of a bank of four of the control devices 11o wherein the Hall effect sensors 213A and 213B of the devices are bonded to the back surface of a single flat panel display 17o while other components of the control devices are bonded to the front surface of the display. Conductors 226 extend around the marginal region 227 of the display 17o to connect the sensors 213A and 213B with connector pins 228. Pins 228 extend into the marginal region 227 to connect the sensors with the other components of the electrical circuit of the control device which components are situated within the marginal region in this embodiment.

Figure 38:
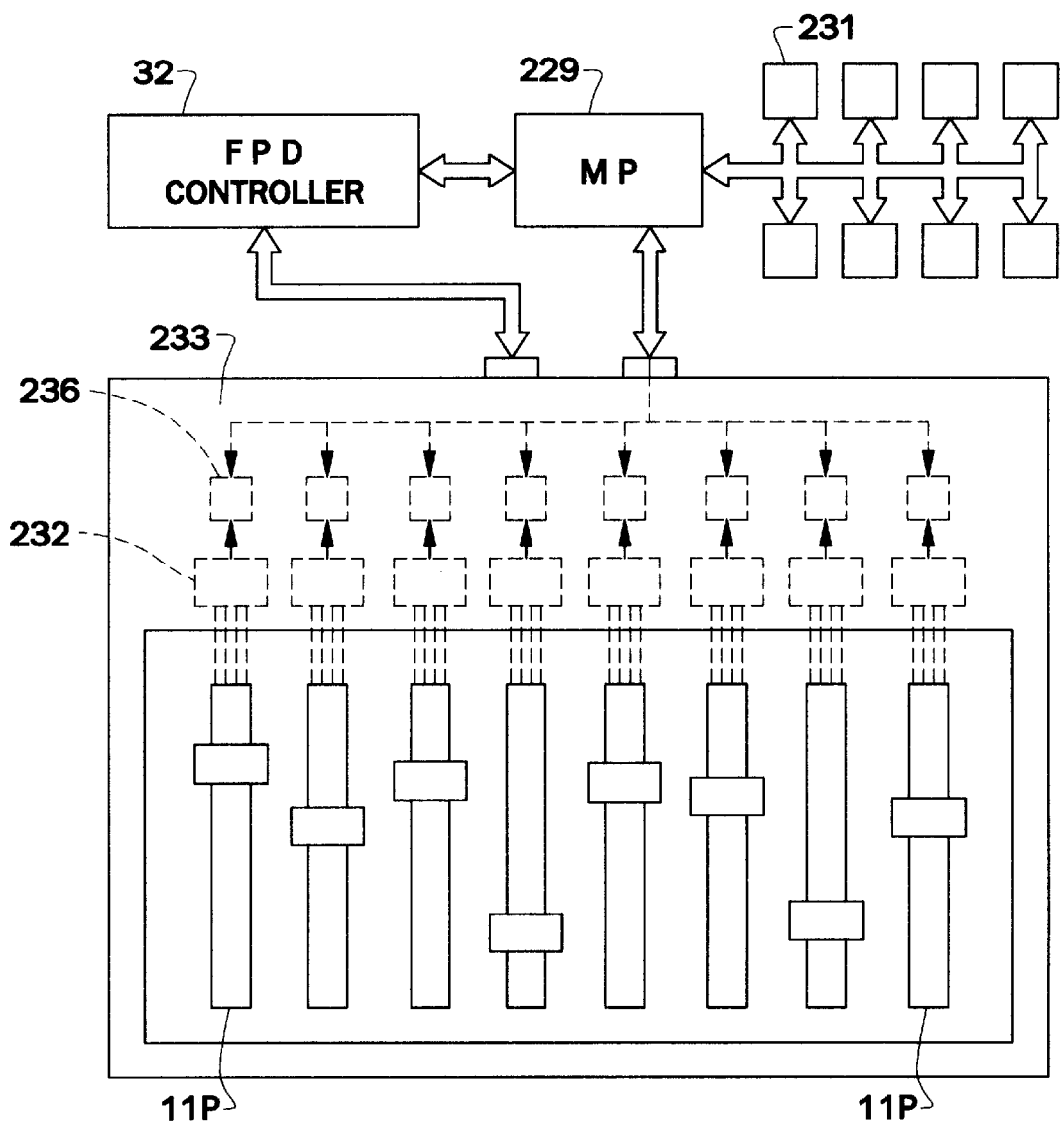
FIG. 38 is in part a frontal view of a bank of circuit control devices of the type having slidable members and in part a schematic circuit diagram showing circuit arrangements for enabling operation of such devices in a highly efficient manner.

FIG. 38 depicts another bank of control devices 11p which are connected to a single master digital data processor 229 in order to provide control signals to a plurality of controlled electrical circuits 231. The control devices 11h which are shown in FIG. 35 for purpose of example are faders having the construction previously described with reference to FIGS. 21 to 24 but can be of any of the other previously described types or a mixture of types including control devices which respond to turning of a rotatable member or to other operator actions.

The master digital data processor 229 must be very fast if it is directly connected to a sizable number of control devices 11h. In order to provide more time for signal processing without causing time delays in reading the signals from each control device 11h, each control device is connected to a separate one of s series of secondary digital data processors 232 which in this example are within the marginal region 233 of the flat panel display 234 although the secondary processors can be at an external location. Each secondary processor 232 computes the current control signal value for its associated control device 11h in the manner previously described and stores the value in the form of a binary number in an associated one of a series of buffer memories 236. The master digital data processor 229 sequentially and repetitively interrogates the buffer memories 236 in order to produce the plural control signals for the plurality of controlled electrical circuits 231.

Figure 40:
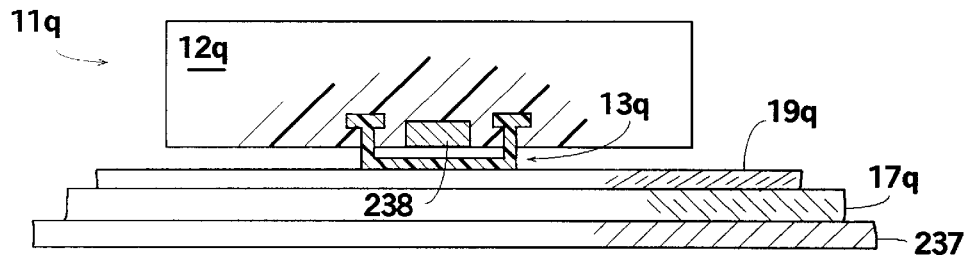
FIG. 40 is a cross section view taken along line 40—40 of FIG. 39.
Figure 39:
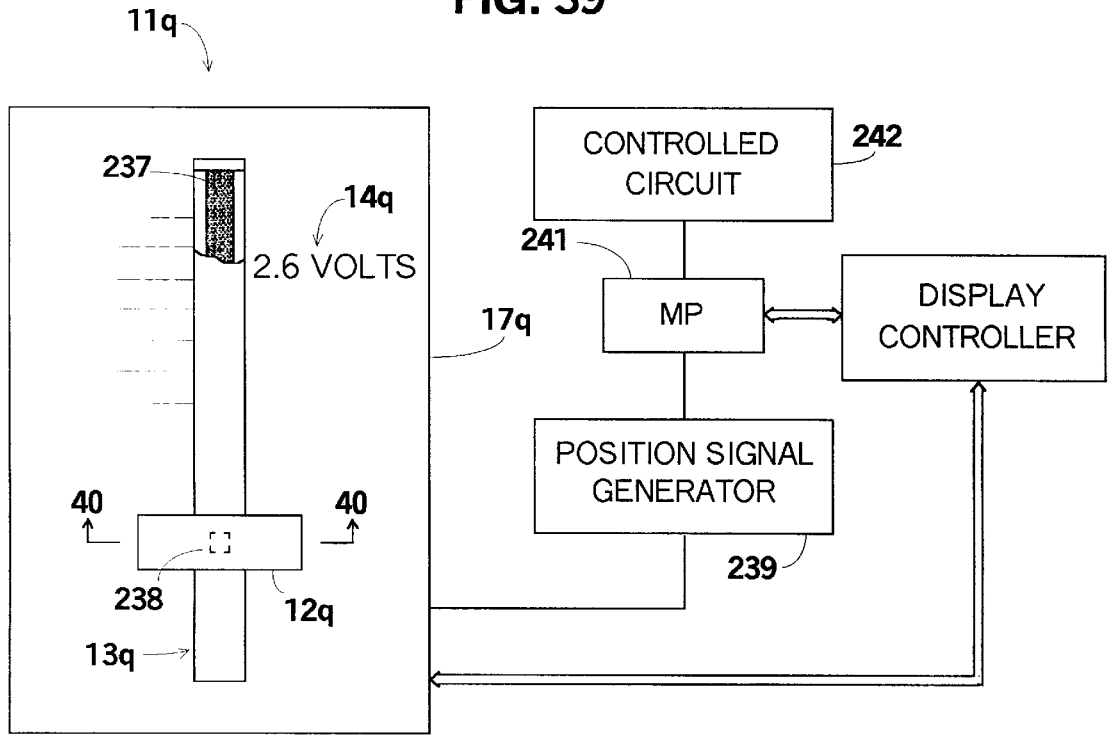
FIG. 39 is a broken out frontal view of a sliding member type of circuit control device which uses a magnetic pad to sense motion of the member.

Referring to FIGS. 39 and 40, movement of the slidable member 12q along the face of the flat panel display 17q can also be tracked by a magnetic pad 237 of the known design which is disposed against the back of the flat panel display. A small magnet 238 is embedded in the member 12q. Movement of the magnet 238 is sensed by the pad 237 and a signal indicative of the current location of the member 12q along its track 13q is produced by a magnetic pad position signal generator 239 which may be of the known circuit configuration. The position signal is received by a digital data processor 241 which outputs a control signal to the controlled circuit 242 in the previously described manner, the control signal having a value which is determined by the location of the slidable member 12q along track 13q. The digital data processor 241 also causes the flat panel display 17q to display graphics 14q that identify the current setting of the control device 11q and which may provide other information pertinent to operation of the control device.

Figure 41:
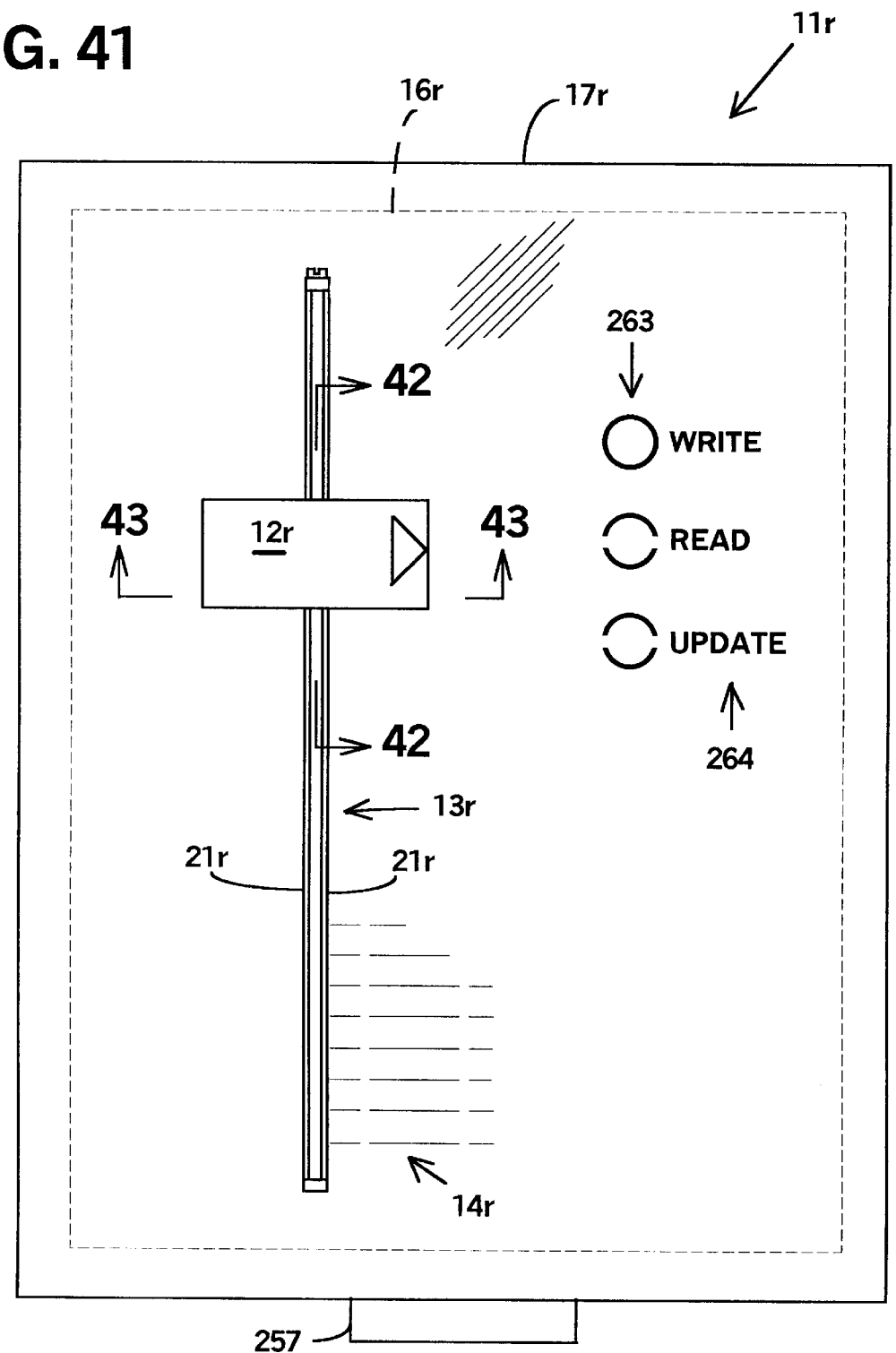
FIG. 41 is a frontal view of a motorized fader embodiment of the invention.
Figure 43:
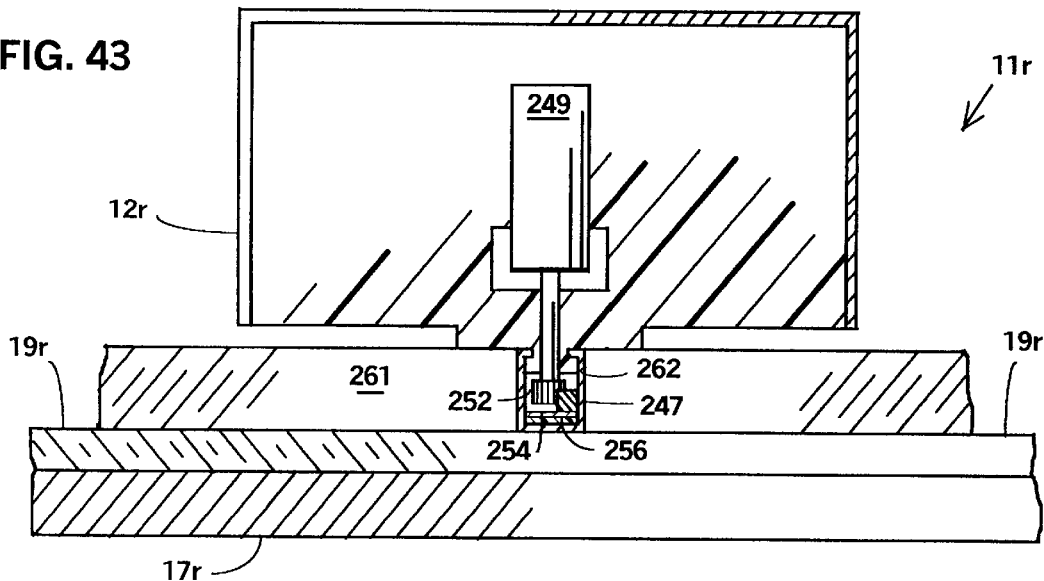
FIG. 43 is another cross section view of a portion of the fader of FIG. 41 taken along line 43—43 thereof.
Figure 42:
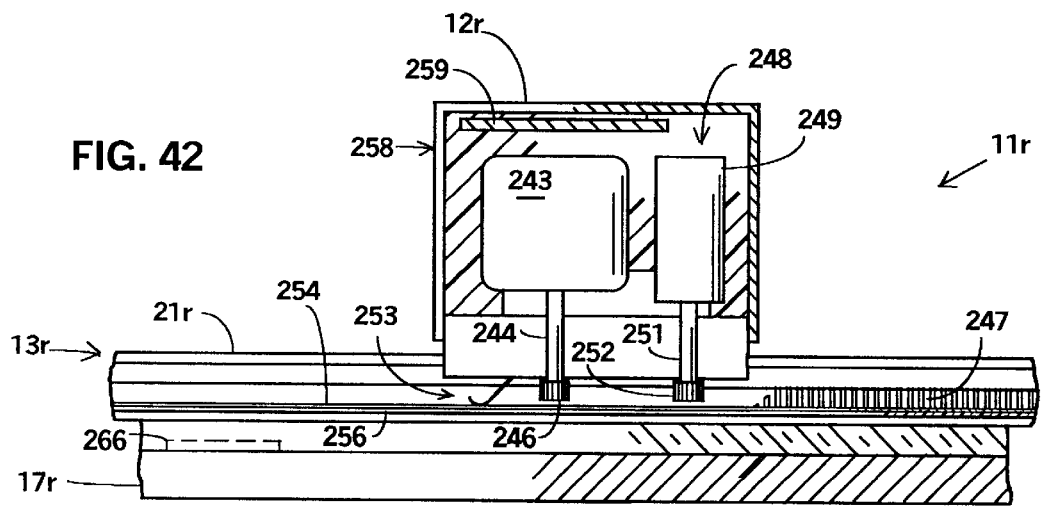
FIG. 42 is a cross section view of a portion of the fader of FIG. 41 taken along line 42—42 thereof.

Some circuit control devices are motorized to enable a digital data processor to cycle the slidable member through a sequence of movements that were initially performed manually by an operator. In prior constructions, the motor, circuits and other mechanisms which move the slidable member in this manner are all located behind a slotted control panel. FIGS. 41, 42 and 43 depict a motorized fader 11r of the type used in processing audio or video signals that does not require any slot or other opening in the supporting panel which in this instance is a flat panel display 17r of the previously described kind that displays changeable graphics 14r which convey information pertinent to the operation of the fader.

The track 13r of fader 11r is again formed by a pair of parallel rails 21r which extend along the face of the flat panel display 17r within the image display area 16r. The lower portion of the slidable member 12r or fader cap extends between the rails 21r and engages the rails in the manner previously described with respect to other embodiments of the invention. The reversible motor 243 which drives the slidable member 12r during the automation mode of operation is contained within the slidable member and has an elongated output shaft 244 which extends between rails 21r. A spur gear 246 at the end of shaft 244 engages a linear rack gear 247 which extends along the track 13r and which is secured to one of the rails. Thus actuation of motor 243 travels the slidable member 12r along the track 13r.

Sensing means 248 for tracking motion of the slidable member 12r and for producing a signal indicative of the current position of the member may be of any of the previously described forms. In this example the sensing means 248 is a rotary shaft encoder 249 of known design which is contained in the slidable member 12r and which has a rotary motion sensing shaft 251 that extends between rails 12r. Another spur gear 252 at the end of shaft 251 engages the rack gear 247. Thus the output signal of encoder 249 changes in response to movement of member 12r thereby enabling tracking of the position of the member. A row of electrical wiper contacts 253 protrude from the underside of the slidable member 12 and bear against and ride along separate ones of a series of conductive traces 254 which extend along the track 13r between the rails 12r and which are insulated from the rails by a ribbon of insulation 256 if the rails are formed of conductive metal as in this example. The contacts 253 and traces 254 enable electrical connection of the motor 243 and encoder 249 with a multi-conductor connector 257 at an edge of the flat panel display 17r. The motor controlling circuits and signal processing circuits which are coupled to motor 243 and encoder 249 through connector 257 may be of the known configurations that are used in prior motorized faders.

Automatic operation of a motorized fader under the control of a digital data processor may be overridden by an operator simply by touching the slidable member of the fader. For this purpose the slidable member 12r has an electrically conductive outer shell 258 which is electrically connected to a touch responsive circuit 259 which opens the operating power circuit of the motor in response to touching of the shell 258 by an operator. The motor may then turn freely while the operator manually moves the slidable member 12r and resumes automatic operation of the fader when the operator releases the slidable member. The touch responsive circuit for this purpose may be of one of the known circuit designs but differs from the prior practice in that it is a small circuit board 259 that is contained within the slidable member 12r itself.

Operators of prior art faders are accustomed to a construction in which the face of the fader is a continuous smooth flat surface interrupted only by a thin slot which may, for example, be of the order of one eighth inch wide. In many usages of the present invention it is preferable that the track structure be as thin and compact as possible so that the surface contour of the fader conforms with the contour of prior faders to the extent possible. The embodiment of FIGS. 41, 42 and 43 is particularly advantageous in this respect in this respect as the spacing of rails 12r from each other need be no greater than is needed to accommodate to the presence of the small spur gears 246 and 252 and the thin rack gear 247. The slot opening formed by the rails 12r need be no wider than the slots of prior art faders.

Conforming the exterior configuration of the fader 11r with that of a conventional fader is further brought about by a transparent supplemental overlay plate 261 which is disposed against the cover plate 19r of the flat panel display 17r. Overlay plate 261 has a slot 262 which conforms in shape with the track 13r and into which the track is received. The overlay plate 261 has a thickness equal to the distance that the rails 12r protrude from the display cover plate 19r. Thus the front surface of the fader 11r is a smooth continuous flat surface interrupted only by a thin slot and is similar to traditional faders in this respect. Operators may rest their wrists against the surface of the fader without experiencing discomfort from the presence of the track 13r. Use of an overlay plate of this kind is not confined to the embodiment of FIGS. 41, 42 and 43. An overlay plate of this kind can be used with any of the other embodiments of the invention that are herein described.

Motorized faders typically have a group of indicator lights which turn on and off to identify the current mode of operation of the fader. Each indicator light may produce a different color of light to facilitate recognition of the current mode of operation. Use of conventional indicator lights, such as light emitting diodes for example, can be dispensed with in embodiments of the present invention. Referring to FIGS. 41 and 42, the panel display 17r can display simulations 263 of such lights and display any associated graphics 264. The displayed simulations 263 may displayed in differing colors if the flat panel display is one of the types which produces color images. If the flat panel display 17r is of the monochrome type, color filters 266 which transmit different colors can be disposed on the back surface of the transparent cover plate 19r at the locations where the indicator light simulations 263 are displayed.

Figure 44:
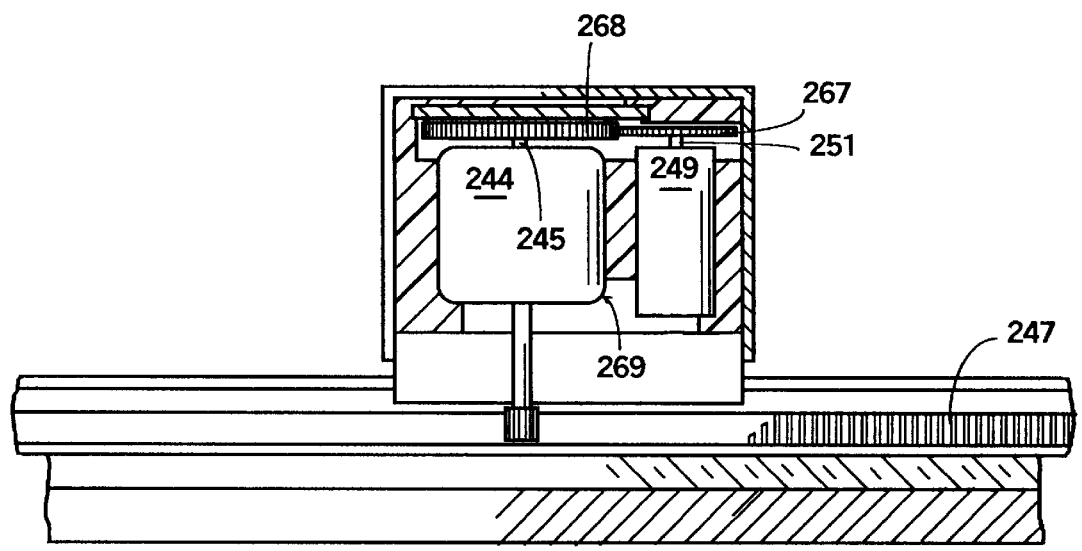
FIG. 44 is a cross section view corresponding generally to FIG. 42 while showing a first variation of the fader of FIG. 41.

FIG. 44 depicts a modification of the motorized fader of the immediately preceding figures in which the encoder 249 does not directly engage rack gear 247. The encoder shaft 251 is turned by the motor 244. For this purpose a spur gear 267 on the encoder shaft 251 engages another spur gear 268 which is on a portion of the motor output shaft 244 that protrudes from the motor housing 269.

Figure 45:
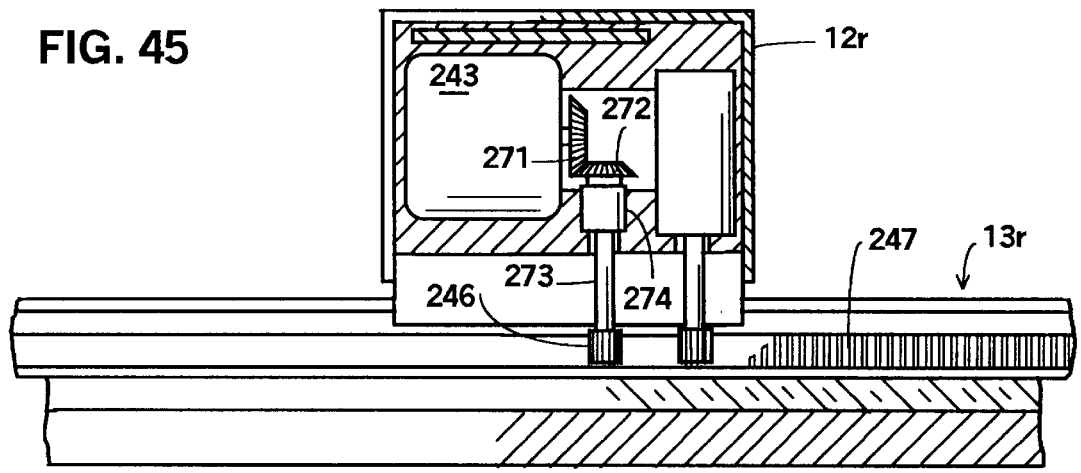
FIG. 45 is another cross section view corresponding generally to FIG. 42 while showing a second variation of the fader of FIG. 41.

FIG. 45 depicts another modification of the motorized fader of FIGS. 41, 42 and 43 in which the motor 243 is reoriented so that the rotary axis of the motor extends in parallel relationship with the track 13r. A pair of bevel gears 271, 272 couple the motor 243 to a shaft 273 that extends towards rack gear 247 and which turns in a bearing 274 that is embedded in the plastic core of the slidable member 12r. The spur gear 246, which engages rack gear 247 in order to travel the member 12r along track 13r, is secured to the end of shaft 273.

Figure 46:
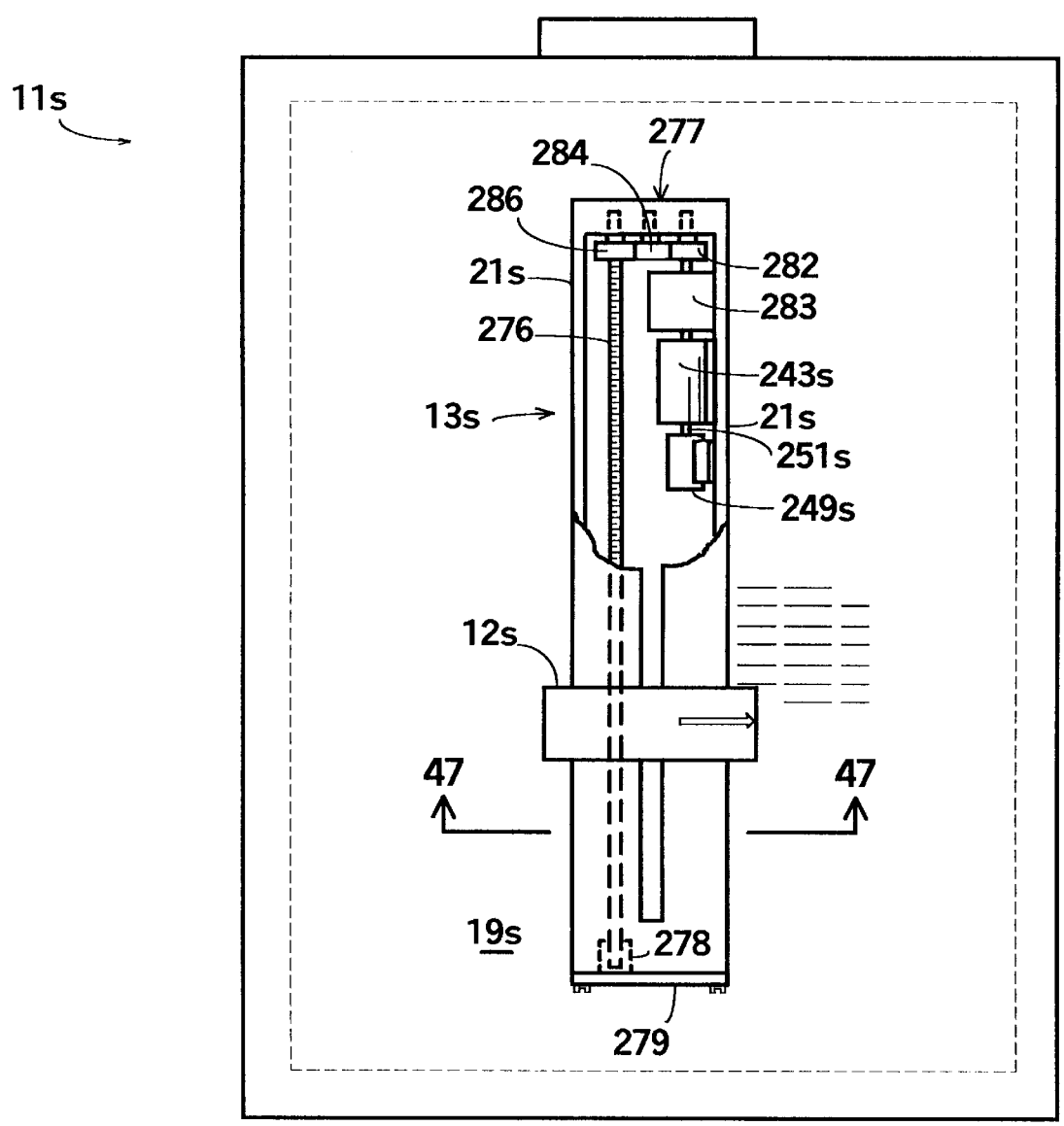
FIG. 46 is a broken out frontal view of another motor driven fader.
Figure 47:
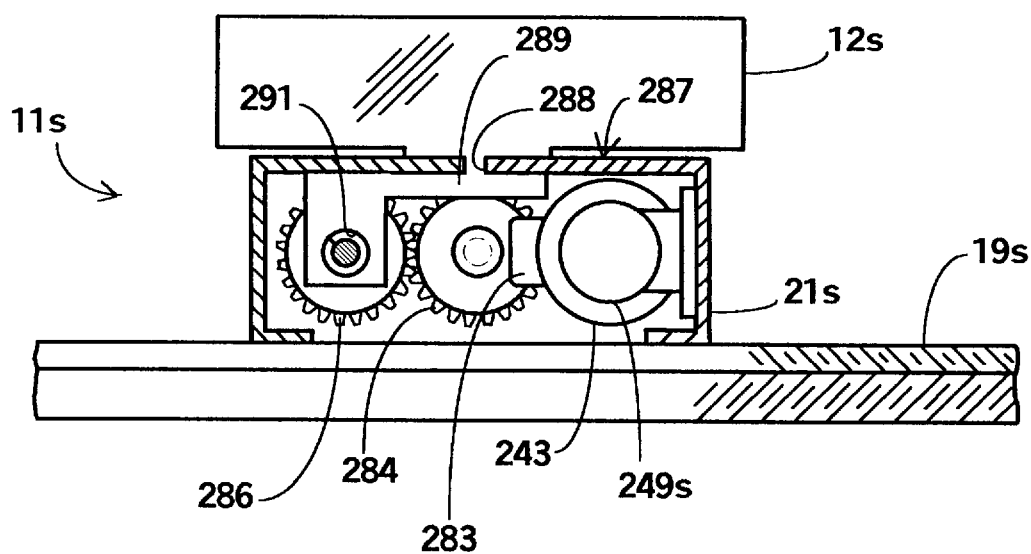
FIG. 47 is a cross section view of a portion of the of the fader of FIG. 46 taken along line 47—47 thereof.

Referring to FIGS. 46 and 47, the reversible motor 243s and encoder 249s or other position signal generating means can be disposed within the track 13s rather than in the slidable member 12s of a motorized fader 11s. In this example, a linear worm gear 276 situated between the rails 21s extends from within one end wall 277 of the track 13s to a bearing 278 which is secured to the transparent cover plate 19s of the flat panel display at a location adjacent to the opposite end wall 279 of the track. The drive motor 243s is situated between the rails 21s which form the track 13s in an orientation at which the axis of rotation of the motor output shaft 281 is parallel to worm gear 276, the motor being secured to an adjacent one of the rails in this example. Motor 243s drives a first spur gear 282 through a speed reducing gearbox 283, the first spur gear being adjacent to end wall 277 of the track 13s. The first spur gear 282 engages a coplanar idler gear 284. The idler gear 284 engages with another spur gear 286 which is secured to worm gear 276 to turn the worm gear in response to operation of motor 243s.

As shown in FIG. 47 in particular, the portions 287 of rails 21s which are outermost from the transparent cover plate 19s of the flat panel display are angled to extend towards each other and to form a thin slot 288. The slidable member 12s of the motorized fader 11s has an under portion 289 which extends into the region between rails 21s through slot 288 and which extends laterally inside the slot to hold the member on the rails. The under portion 289 of member 12s has threaded passage 291 through which worm gear 276 extends and which engages with the worm gear. Thus the slidable member 12s is traveled along the track 13s in response to rotation of the worm gear 276 by motor 243s.

Referring again to FIGS. 46 and 47 in conjunction, the shaft encoder 249s which tracks movement of the slidable member 12s is disposed between rails 12s with the rotary motion sensing shaft 251s of the encoder being in alignment with the output shaft 244s of motor 243s and being turned by the motor output shaft.

Except as herein described the construction of the motorized fader 11s may be similar to that of the previously described embodiment of FIGS. 41, 42 and 43.

The previously described motorized faders enable use of an electronic display screen to provide changeable graphics in immediate proximity to a sliding knob, fader cap or the like without necessarily requiring any internal structural modification of the screen itself. Referring to FIGS. 48 and 49, the fader drive motor 243t can be located behind the flat panel display 17t if the display screen is fabricated to have a small through passage 292. This enables minimization of the bulk of the track 13t and/or slidable member 12t in instances where it is desired to use a relatively large motor 243t.

In this example, the passage 292 extends through the flat panel display 17t at a location which is behind an end region 293 of the track 13t. A first pulley 294 is situated within the end region 293 and is secured to the end of a drive shaft 296 that extends through the passage 292. The drive motor 243t is secured to a housing 297 that is itself secured to the back of the flat panel display 17t with the drive output shaft of the motor being in alignment with and being coupled to the pulley drive shaft 296. The shaft encoder 249t, rotary potentiometer or the like that tracks motion of the slidable member 12t is also secured to the housing 297 at the back of the display 17t. The rotary shafts of the encoder 249t and motor 243t are coupled by a pair of engaged spur gears 298 which cause rotation of the encoder shaft in response to rotation of the motor shaft.

A second rotatable pulley 299 is situated within track 13t at the end 301 of the track that is opposite from end 293. A belt 302 is engaged on the two pulleys 294 and 299 and one side of the belt is fastened to the sliding member 12t. Thus the belt 302 draws the sliding member 12t along track 13t when pulley 294 is turned by motor 243t in the previously described manner. The belt 302 and pulley 294 are preferably of one of the known types which inhibit slippage relative to each other such as, for example, a toothed belt and toothed pulley or a V-belt and conforming pulley. Cloth impregnated rubber or nylon belts also inhibit slippage. The second pulley 299 can, if desired, be of the known spring tensioned form to further inhibit slippage.

Referring to FIG. 50, the presence of a passage 292 in the image display area of a flat panel display of the type having internal busbars 39t of the previously described kind requires that the display have a specialized internal construction. In particular, the passage 292 should be bounded by a fluid tight seal 303. Parallel busbars 39t that would otherwise be intercepted by the passage 292 and seal 303 may be routed around the passage 292 and seal 303 in spaced apart relationship with each other. The spacing between the portions of the busbars 39t that extend around the seal 303 and passage 292 is reduced relative to the spacing between other portions of the busbars. This confines the area at which image display is disrupted by the non-linear portions of the busbars 39t to a small region which is covered by the overlying track structure and which is therefor not apparent to an observer. FIG. 50 depicts the row busbars 39t for purposes of example. The previously described column busbars, which extend orthogonally relative to the row busbars 39t, are routed around the passage 292 and seal 303 in essentially the same manner.

Except as herein described components of the motorized faders of FIGS. 48, 49 and 50 may be similar to the corresponding components of the motorized fader of FIGS. 38 to 40.

While the invention has been disclosed with reference to certain specific embodiments for purposes of example, many variations and modifications of the control devices are possible and it is not intended to limit the invention except as defined by the following claims.

We claim:

1. A control device for an electrical circuit which control device has a slidable member that is traveled along a track to any of a plurality of different positions in order to change an electrical condition in the circuit, wherein the improvement comprises:
   said slidable member and track being disposed in front of an electronic display screen which has an image display area at which instantly changeable images are displayed, at least a portion of said slidable member being situated directly in front of said image display area.

2. The apparatus of claim 1 further including an image display controller coupled to said electronic display screen and which causes said screen to display indicia at locations along the path of travel of said slidable member.

3. The apparatus of claim 1 further including a control signal producing circuit which produces a circuit control signal that varies in response to movement of said slidable member, said control signal producing circuit having electronic components that are situated in front of said electronic display screen and which are within at least one of said slidable member and said track.

4. The apparatus of claim 3 wherein said track includes at least one rail extending along a front surface of said electronic display screen, said slidable member being engaged on said rail and being detachable therefrom, at least one component of said control signal producing circuit being carried by said slidable member and being removable from said rail therewith.

5. The apparatus of claim 3 wherein said track includes a pair of spaced apart parallel rails extending along a front surface of said electronic display screen, at least one component of said control signal producing circuit being situated between said rails.

6. The apparatus of claim 1 wherein said track includes at least one rail extending along a front surface of said electronic display screen and wherein said slidable member rides along said rail, further including an elongated electrical resistance extending along said rail in spaced apart relationship therewith, a band of electrically conductive material extending along said resistance in spaced apart relationship therewith, a first electrical wiper contact secured to said slidable member in position to contact said electrical resistance and ride therealong as said slidable member is moved along said rail, and a second electrical wiper contact secured to said slidable member in position to contact said band of electrically conductive material and to travel therealong as said slidable member is moved along said rail, said first and second wiper contacts being electrically connected to each other.

7. The apparatus of claim 6 wherein a pair of said rails extend along said front surface of said transparent cover plate in spaced apart and parallel relationship with each other and wherein said slidable member straddles both of said rails and engages each thereof, said electrical resistance and said band of electrically conductive material being between said rails and being affixed to said front surface of said transparent cover plate.

8. The apparatus of claim 4 further including at least one electrical coil having an elongated configuration and which extends along said rail behind said slidable member, said coil having a width which becomes progressively smaller along at least a portion of the length of the coil, said electrical coil being part of a resonant circuit of an electrical oscillator circuit, a body of electrically conductive material secured to said slidable member in spaced apart relationship with said slidable member, and a signal processor coupled to said electrical oscillator circuit and which outputs a circuit control signal that changes in response to changes in the resonant frequency of said oscillator circuit.

9. The apparatus of claim 8 wherein said electrical coil and said body of electrically conductive material are substantially enclosed by a shield of electrically conductive material.

10. The apparatus of claim 8 wherein a pair of the rails extend along said front surface of said transparent cover plate in spaced apart and parallel relationship with each other and wherein said slidable member straddles both of said rails and engages each thereof, said electrical coil being between said rails and being affixed to said front surface of said transparent cover plate.

11. The apparatus of claim 8 having a pair of electrical oscillator circuits and wherein a pair of elongated electrical coils extend along said rail behind said slidable member and wherein each of said electrical coils is a part of a resonant circuit of a separate one of said electrical oscillator circuits, and wherein said signal processor is electrically coupled to each of said electrical oscillator circuits and outputs a circuit control signal that changes in response to changes in the ratio of the resonant frequencies of said electrical oscillator circuits.

12. The apparatus of claim 11 wherein components of said electrical oscillator circuits are disposed within said slidable member.

13. The apparatus of claim 1 further including an elongated first capacitor plate extending alongside said rail in parallel relationship therewith and which has a width that becomes progressively smaller along at least a portion of the length of the first capacitor plate, a second capacitor plate secured to said slidable member and being positioned to face said first capacitor plate in spaced apart relationship therewith, said second capacitor plate having a length in the direction of travel of said slidable member that is shorter than the length of said first capacitor plate in that direction, a band of electrically conductive material extending along said first capacitor plate in spaced apart relationship therewith, an electrical wiper contact secured to said slidable member and being positioned to contact said band and travel therealong as the slidable member is traveled along the rail and which is electrically connected to said second capacitor plate, an electrical oscillator circuit connected to said first capacitor plate and to said band and wherein said first and second capacitor plate are a capacitive component of a resonant circuit of said electrical oscillator circuit, and a signal processor which outputs a circuit control signal that changes in response to changes of the resonant frequency of said electrical oscillator circuit.

14. The apparatus of claim 1 further including first and second elongated capacitor plates extending alongside said rail in parallel relationship therewith and in spaced apart relationship with each other, each of said first and second capacitor plates having a width which becomes progressively smaller along at least a portion of the length of the capacitor plate and wherein the decreases in the widths of the first and second capacitor plates occur in the same direction, a third capacitor plate secured to said slidable member and being positioned to face said first and second capacitor plates in spaced apart relationship therewith, said third capacitor plate having a length in the direction of travel of said slidable member that is shorter than the lengths of said first and second capacitor plates in that direction, an electrical oscillator circuit connected to said first and second capacitor plates, said capacitor plates being a capacitive component of a resonant circuit of said electrical oscillator circuit, and a signal processor which outputs a circuit control signal that changes in response to changes of the resonant frequency of said electrical oscillator circuit.

15. The apparatus of claim 14 wherein a pair of rails extend along said front surface of said transparent cover plate in spaced apart and parallel relationship with each other and wherein said slidable member straddles both of said rails and engages each thereof, said first and second capacitor plates being between said rails.

16. The apparatus of claim 1 further including a band of light reflecting material extending along said rail in spaced apart relationship therewith, first and second linear light modulators extending along said rail at a location which is between said band of light reflecting material and said slidable member, each of said light modulators having spaced apart light transmissive zones along the length thereof which alternate with relatively opaque zones and wherein the spacing of said light transmissive zones of said first light modulator progressively changes along the length of said first light modulator, said light transmissive zones of said second light modulator being uniformly spaced apart, a first light source carried by said slidable member in position to direct light towards said first light modulator and said band of light reflecting material, a first photoelectric light detector carried by said slidable member in position to receive and detect light which passes through one of said light transmissive zones of said first light modulator and which is reflected back through another thereof by said band of light reflecting material, , a second photoelectric light detector carried by said slidable member in position to receive and detect light which passes through one of said light transmissive zones of said second light modulator and which is reflected back through another thereof by said band of light reflecting material, and a signal processor electrically coupled to said first and second photoelectric light detectors and which detects the position of said slidable member along said rail by comparison of the time interval between successive signals from said first photoelectric light detector with the time interval between successive signals from said second photoelectric light detector.

17. The apparatus of claim 1 further including a linear toothed gear rack extending along said rail in spaced apart relationship therewith, a rotary gear carried by said slidable member and having an axis of rotation that is at right angles to said transparent cover plate, said rotary gear being engaged with said gear rack, and means for generating electrical circuit control signals in response to rotary motion of said rotary gear.

18. The apparatus of claim 17 wherein said means for generating electrical circuit control signals includes a disk carried by said slidable member and which rotates as said rotary gear is turned, said disk having an annular band of reflective material thereon which encircles said axis of rotation and wherein successive portions of said annular band of reflective material have differing degrees of light reflectance, a light source carried by said slidable member in position to direct light towards said annular band of reflective material along an optical path which extends therebetween, and a photoelectric light detector carried by said slidable member and which is positioned to receive light which is reflected by said annular band of reflective material at said optical path.

19. The apparatus of claim 1 further including first and second pulleys disposed at opposite ends of the path of travel of said slidable member along said rail, said pulleys being oriented for rotation about axes of rotation that are at right angles to said transparent cover plate, a continuous belt engaged on said pulleys and having one side which is fastened to said slidable member, and a pulley rotation sensor which varies an output signal in response to rotary motion of said first pulley.

20. The apparatus of claim 1 further including a magnet carried by said slidable member and wherein a Hall effect sensor is disposed at least one end of the path of travel of said slidable member, further including a signal processor which is electrically coupled to said Hall effect sensor and which produces a control signal that varies in response to variation of the electrical resistance of said Hall effect sensor.

21. The apparatus of claim 20 having a pair of said Hall effect sensors each being disposed at an opposite end of said path of travel.

22. The apparatus of claim 1 wherein said electronic display screen has a transparent cover plate and wherein said track includes a pair of spaced apart parallel rails affixed to a front surface of the transparent cover plate and which extend therealong within said image display area, said rails being formed at least in part of electrical conductor, and wherein said slidable member of said control device straddles said rails and is engaged thereon, said slidable member having a first electrically conductive region that contacts one of said rails and a second electrically conductive region that contacts the other of said rails, said first and second electrically conductive regions being insulated from each other, and wherein at least one electronic component of a control signal producing circuit is carried by said slidable member and has first and second terminals across which electrical voltage is applied, each of said terminals being electrically connected to a separate one of said first and second electrically conductive regions of said slidable member, and a voltage supply having a third and fourth terminals each of which is connected to a separate one of said rails to provide voltage to said electronic component of said control signal producing circuit through said rails.

23. The apparatus of claim 22 wherein said first and second conductive regions of said slidable member are metal coatings at the surface of said slidable member.

24. The apparatus of claim 22 wherein an electronic component of said control signal producing circuit that is carried by said slidable member has a fifth terminal which requires an electrical connection to a remote circuit element that is situated away from said slidable member, further including at least one elongated band of electrical conductor extending in parallel relationship with said rails at a location between said slidable member and said transparent cover plate and being electrically connected to said remote circuit element, and at least one electrical wiper contact extending from said slidable member in position to travel along said band in contact therewith when said slidable member is slid along said rails, said wiper contact being electrically connected to said fifth terminal.

25. The apparatus of claim 1 further including a plurality of parallel binary coding zones situated between said slidable member and said electronic display screen and which extend in the direction of travel of said slidable member, each of said zones having first segments formed of light reflective material and second segments formed of light absorbent material, said first and second segments being in an arrangement wherein a series of transverse bands along said plurality of zones each exhibit a different combination of light reflective areas and light absorbent areas, at least one light source carried by said slidable member and being positioned to direct light towards successive ones of said transverse bands as said slidable member is traveled along said track, and a plurality of photoelectric light detectors carried by said slidable member each being positioned to receive light which is reflected by a separate one of said coding zones.

26. The control device of claims 25 wherein said light reflective areas alternate with said light absorbent areas along a first and a second of said binary coding zones and wherein said light reflective areas and light absorbent areas of said second binary coding zone have a length which is twice the length of the light reflective areas and light absorbent areas of said first binary coding zone.

27. The control device of claim 1 further including a linear rack gear extending along said track in parallel relationship therewith, a rotary gear carried by said slidable member and being engaged with said rack gear, and a signal generator carried by said slidable member which produces a signal that varies in response to turning of said rotary gear.

28. The control device of claim 27 wherein said signal generator includes a disk carried by said slidable member and which rotates as said rotary gear is turned by movement of said slidable member along said track, said disk having an annular band of light reflective material thereon wherein the reflectivity of said material varies at successive locations within said annular band of material, a light source carried by said slidable member and being positioned to direct light towards a limited portion of said annular band of light reflective material, and a photoelectric detector carried by said slidable member and being positioned to detect light which is reflected at said limited portion of said annular band of light reflective material.

29. The control device of claim 27 wherein said signal generator produces a quadrature signal indicative of movement of said slidable member and wherein said signal generator includes a disk carried by said slidable member and which rotates as said rotary gear is turned by movement of said slidable member along said track, first and second light sources carried by said slidable member and being positioned to direct light towards two spaced apart locations on said disk, first and second photoelectric light detectors carried by said slidable member each being positioned to receive and respond to light from a separate one of said first and second locations, said disk having first and second areas which alternate with each other around a circular path on said disk, said first areas having a characteristic which suppresses light transmission between said first and second locations and said photoelectric detectors and said second areas having a characteristic which enables light transmission from said first and second locations to said photoelectric detectors.

30. The control device of claim 29 wherein said first and second areas of said disk are arranged to enable light transmission to both of said photoelectric detectors at a first angular position of said disk and to enable light transmission to only said first photoelectric detector at an immediately following angular position of said disk and to suppress light transmission to both of said photoelectric detectors at the next following angular position of said disk and to enable light transmission to only said second photoelectric detector at the next following angular position of said disk.

31. The control device of claim 29 wherein said first areas of said disk are light reflecting areas and said second areas of said disk are light absorbent areas.

32. The apparatus of claim 1 further including a plurality of parallel binary coding zones situated between said slidable member and said electronic display screen and which extend in the direction of travel of said slidable member, each of said zones having first segments formed of magnetic material and second segments formed of non-magnetic material, said first and second segments being in an arrangement wherein a series of transverse bands along said plurality of zones each exhibit a different combination of magnetic areas and non-magnetic areas, and a plurality of Hall effect sensors carried by said slidable member each being positioned to travel along an associated one of said coding zones as said slidable member is traveled along said track.

33. The control device of claim 32 wherein said magnetic areas alternate with said non-magnetic areas along a first and a second of said binary coding zones and wherein said magnetic areas and non-magnetic areas of said second binary coding zone have a length which is twice the length of the magnetic areas and non-magnetic areas of said first binary coding zone.

34. The control device of claim 32 wherein said Hall effect sensors are offset from each other in the direction of travel of said slidable member.

35. The control device of claim 34 wherein said Hall effect sensors produce output signals having a variable magnitude that is dependent on the strength of the magnetic field that is sensed by the sensor and wherein each of said Hall effect sensors has a width which exceeds the width of the associated binary coding zone whereby the Hall effect sensor overlaps a coding zone that is adjacent to the coding zone with which the Hall effect sensor is associated, further including a plurality of comparators each being coupled to a separate one of said Hall effect sensors and each being conditioned to suppress output signals which have a magnitude that is smaller than the magnitude of the output signal that is produced when the Hall effect sensor is detecting a magnetized area on the associated one of said coding zones.

36. The control device of claim 32 wherein at least one of said binary coding zones is situated outside of said track, the binary coding zone including said magnetic areas thereof being formed of transparent material.

37. The control device of claim 1 wherein a plurality of said circuit control devices are disposed in front of said electronic display screen for controlling a plurality of electrical circuits, a display controller coupled to said electronic display screen for producing a plurality of changeable images thereon, a plurality of first digital data processors each being coupled to a separate one of said circuit control devices to produce digital signals in response to operator manipulation of said separate one of said circuit control devices, a plurality of buffer memories each being coupled to a separate one of said first digital data processors to temporarily store the digital signals which are produced thereby, and master digital data processing means for sequentially interrogating each of said buffer memories and for transmitting control signals derived therefrom to each of said controlled circuits.

38. The control device of claim 1 wherein said electronic display screen is the screen of a flat panel display, further including a magnet carried by said slidable member, and a magnetic pad which generates a variable signal in response to movement of a magnet, wherein said magnetic pad is behind flat panel display and extends in substantially parallel relationship with said screen.

39. The control device of claim 1 further including an electrical motor carried by said slidable member, a linear rack gear extending along said track, a first rotary gear carried by said slidable member in front of said electronic display screen and being engaged with said linear rack gear, said motor being in driving relationship with said first rotary gear to travel said slidable member along said track.

40. The control device of claim 39 further including a position signal producing component carried by said slidable member and having a rotary motion sensing input shaft, said rotary motion sensing input shaft having a second rotary gear thereon which is engaged with said linear rack gear.

41. The control device of claim 39 further including a position signal producing component carried by said slidable member and having a rotary motion sensing input shaft, said rotary motion sensing input shaft being driven by said motor through additional gears which are carried by said slidable member.

42. The control device of claim 39 wherein said motor has an axis of rotation that extends in parallel relationship with said electronic display screen, further including additional gearing carried by said slidable member and which couples said motor to said first rotary gear.

43. The control device of claim 1 further including a rotatable worm gear disposed in said track and extending along the path of travel of said slidable member, a motor disposed in said track and being in driving relationship to said worm gear, said slidable member having a threaded passage through which said worm gear extends and wherein threads engage said worm gear whereby said slidable member is traveled along said track by operation of said motor.

44. The control device of claim 1 wherein said electronic display screen is the screen of a flat panel display and wherein a passage extends through said flat panel display at a location within said image display area thereof, further including first and second pulleys disposed in said track at opposite ends of the path of travel of said slidable member, a belt engaged on said pulleys and which extends along the path of travel of said slidable member, a motor disposed behind said flat panel display, and a drive shaft which extends through said passage in said flat panel display and which couples said motor to one of said pulleys.

45. The control device of claim 44 further including a position signal generator disposed behind said flat panel display, said position signal generator having a rotary motion sensing input shaft which is coupled to and driven by said motor.

46. The control device of claim 1 wherein said track extends along and protrudes from a transparent cover plate of said electronic display screen, further including a transparent supplemental overlay plate disposed against said transparent cover plate and having a slot into which said track is received.

47. The control device of claim 46 wherein said transparent supplemental overlay plate has a thickness at least equal to the distance that said track protrudes from said transparent cover plate.

48. The control device of claim 46 wherein said transparent supplemental overlay plate has a thickness that is equal to the distance that said track protrudes from said transparent cover plate.

49. The control device of claim 46 wherein said track has a pair of spaced apart linear rails disposed in parallel relationship, said rails having parallel coplanar edges that extend in parallel relationship with said transparent cover plate, said transparent supplemental overlay plate having a flat outer surface that is coplanar with said edges of said rails.

50. A control device for an electrical circuit which control device comprises:

an electronic display screen having a face with an image area thereat at which instantly changeable images are displayable, a track extending along said face of said display screen within said image area thereof, a slidable member engaging said track and being manually slidable therealong to any of a plurality of successive positions, a slidable member position sensor producing a control signal for said electrical circuit which changes in response to movement of said slidable member between said positions, and a display controller electrically coupled to said position sensor and to said display screen, said display controller being conditioned to cause display of changeable images at said screen which images convey information pertinent to operation of said control device.

\* \* \* \* \*